(12) United States Patent
Umezaki et al.

(10) Patent No.: US 10,019,924 B2
(45) Date of Patent: *Jul. 10, 2018

(54) SEMICONDUCTOR DISPLAY DEVICE

(71) Applicant: Semiconductor Energy Laboratory Co., Ltd., Atsugi-shi, Kanagawa-ken (JP)

(72) Inventors: Atsushi Umezaki, Isehara (JP); Mai Akiba, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/646,475

(22) Filed: Jul. 11, 2017

(65) Prior Publication Data

US 2017/0309212 A1 Oct. 26, 2017

Related U.S. Application Data

(63) Continuation of application No. 12/880,252, filed on Sep. 13, 2010, now Pat. No. 9,715,845.

(30) Foreign Application Priority Data

Sep. 16, 2009 (JP) .................. 2009-214096

(51) Int. Cl.
*G06F 3/038* (2013.01)
*G09G 3/20* (2006.01)
(Continued)

(52) U.S. Cl.
CPC .............. *G09G 3/20* (2013.01); *G11C 19/28* (2013.01); *H01L 27/1225* (2013.01);
(Continued)

(58) Field of Classification Search
USPC ........................................................ 345/204
See application file for complete search history.

(56) References Cited

U.S. PATENT DOCUMENTS

| 4,618,784 A | 10/1986 | Chappell et al. |
| 5,091,334 A | 2/1992 | Yamazaki et al. |

(Continued)

FOREIGN PATENT DOCUMENTS

| EP | 0191544 A | 8/1986 |
| EP | 1737044 A | 12/2006 |

(Continued)

OTHER PUBLICATIONS

Prins.M et al., "A Ferroelectric Transparent Thin-Film Transistor", Appl. Phys. Lett. (Applied Physics Letters), Jun. 17, 1996, vol. 68, No, 25, pp. 3650-3652.

(Continued)

*Primary Examiner* — Joseph Haley
*Assistant Examiner* — Chineyere Wills-Burns
(74) *Attorney, Agent, or Firm* — Robinson Intellectual Property Law Office; Eric J. Robinson

(57) ABSTRACT

It is an object to provide a semiconductor display device with high reliability. Further, it is an object to provide a semiconductor display device which can reduce power consumption. A decoder is provided for a scan line driver circuit and operates such that, in accordance with a signal input to the scan line driver circuit, a pulse is sequentially input only to scan lines included in pixels of rows performing display and a pulse is not input to scan lines included in pixels of rows at which display is not performed. Then, all pixels or part of pixels in the line selected by the pulse is supplied with a video signal from a signal line driver circuit, whereby display of an image is performed in pixels arranged in the specific area of the pixel portion.

8 Claims, 30 Drawing Sheets

(51) Int. Cl.
   *H01L 27/12* (2006.01)
   *G11C 19/28* (2006.01)
   *G09G 3/3225* (2016.01)

(52) U.S. Cl.
   CPC ....... *G09G 3/3225* (2013.01); *G09G 2300/08* (2013.01); *G09G 2300/0842* (2013.01); *G09G 2310/027* (2013.01); *G09G 2310/0267* (2013.01); *G09G 2310/0286* (2013.01); *G09G 2310/0297* (2013.01); *G09G 2310/04* (2013.01); *G09G 2330/021* (2013.01)

(56) References Cited

U.S. PATENT DOCUMENTS

| | | | |
|---|---|---|---|
| 5,262,350 A | 11/1993 | Yamazaki et al. | |
| 5,262,654 A | 11/1993 | Yamazaki | |
| 5,289,030 A | 2/1994 | Yamazaki et al. | |
| 5,453,858 A | 9/1995 | Yamazaki | |
| 5,591,987 A | 1/1997 | Yamazaki et al. | |
| 5,731,856 A | 3/1998 | Kim et al. | |
| 5,744,864 A | 4/1998 | Cillessen et al. | |
| 5,764,225 A | 6/1998 | Koshobu | |
| 5,849,601 A | 12/1998 | Yamazaki | |
| 5,859,443 A | 1/1999 | Yamazaki et al. | |
| 5,889,291 A | 3/1999 | Koyama et al. | |
| 5,949,397 A | 9/1999 | Koyama et al. | |
| 5,982,696 A | 11/1999 | Rao | |
| 6,081,136 A | 6/2000 | Khanna et al. | |
| 6,288,487 B1 | 9/2001 | Arai | |
| 6,294,274 B1 | 9/2001 | Kawazoe et al. | |
| 6,295,047 B1 | 9/2001 | Koyama et al. | |
| 6,355,941 B1 | 3/2002 | Yamazaki et al. | |
| 6,417,830 B1 | 7/2002 | Byeon, II | |
| 6,476,791 B2 | 11/2002 | Koyama et al. | |
| 6,480,181 B2 | 11/2002 | Ishii | |
| 6,563,174 B2 | 5/2003 | Kawasaki et al. | |
| 6,580,423 B1 | 6/2003 | Murade | |
| 6,670,771 B2 | 12/2003 | Shin et al. | |
| 6,727,522 B1 | 4/2004 | Kawasaki et al. | |
| 6,747,627 B1 | 6/2004 | Koyama et al. | |
| 6,766,018 B1 | 7/2004 | Morita | |
| 6,774,419 B2 | 8/2004 | Kimura | |
| 6,953,951 B2 | 10/2005 | Yamazaki et al. | |
| 7,049,190 B2 | 5/2006 | Takeda et al. | |
| 7,053,874 B2 | 5/2006 | Koyama | |
| 7,061,014 B2 | 6/2006 | Hosono et al. | |
| 7,064,346 B2 | 6/2006 | Kawasaki et al. | |
| 7,091,118 B1 * | 8/2006 | Pan ................... | H01L 21/28052 257/E21.199 |
| 7,105,868 B2 | 9/2006 | Nause et al. | |
| 7,109,961 B2 | 9/2006 | Osame | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,435,633 B2 | 10/2008 | Todorokihara et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,477,216 B2 | 1/2009 | Koyama et al. | |
| 7,501,293 B2 | 3/2009 | Ito et al. | |
| 7,511,709 B2 | 3/2009 | Koyama et al. | |
| 7,616,173 B2 | 11/2009 | Tanada | |
| 7,674,650 B2 | 3/2010 | Akimoto et al. | |
| 7,732,819 B2 | 6/2010 | Akimoto et al. | |
| 7,781,964 B2 | 8/2010 | Hara et al. | |
| 7,859,510 B2 | 12/2010 | Umezaki | |
| 7,910,490 B2 | 3/2011 | Akimoto et al. | |
| 7,932,521 B2 | 4/2011 | Akimoto et al. | |
| 8,143,115 B2 | 3/2012 | Omura et al. | |
| 8,148,721 B2 | 4/2012 | Hayashi et al. | |
| 8,274,077 B2 | 9/2012 | Akimoto et al. | |
| 8,330,492 B2 | 12/2012 | Umezaki | |
| 8,354,979 B2 | 1/2013 | Chung | |
| 8,456,396 B2 | 6/2013 | Umezaki | |
| 8,462,100 B2 | 6/2013 | Umezaki | |
| 8,466,453 B2 | 6/2013 | Akimoto et al. | |
| 8,629,069 B2 | 1/2014 | Akimoto et al. | |
| 8,643,586 B2 | 2/2014 | Umezaki | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,803,781 B2 | 8/2014 | Kimura et al. | |
| 9,070,593 B2 | 6/2015 | Umezaki | |
| 9,099,562 B2 | 8/2015 | Akimoto et al. | |
| 9,153,703 B2 | 10/2015 | Kaji et al. | |
| 9,184,183 B2 | 11/2015 | Umezaki | |
| 9,335,599 B2 | 5/2016 | Umezaki | |
| 9,684,215 B2 | 6/2017 | Umezaki | |
| 2001/0046027 A1 | 11/2001 | Tai et al. | |
| 2002/0033783 A1 | 3/2002 | Koyama | |
| 2002/0056838 A1 | 5/2002 | Ogawa | |
| 2002/0070382 A1 | 6/2002 | Yamazaki et al. | |
| 2002/0132454 A1 | 9/2002 | Ohtsu | |
| 2003/0189401 A1 | 10/2003 | Kido et al. | |
| 2003/0210219 A1 | 11/2003 | Osame | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0245531 A1 | 12/2004 | Fujii et al. | |
| 2005/0012887 A1 | 1/2005 | Koyama et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0001945 A1 * | 1/2007 | Yoshida ............... | G09G 3/3233 345/87 |
| 2007/0020836 A1 | 1/2007 | Moon et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057836 A1 | 3/2007 | Choi | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0159742 A1 | 7/2007 | Iwabuchi et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0188422 A1 | 8/2007 | Anazai et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0036697 A1 * | 2/2008 | Chung ................ | G09G 3/3266 345/55 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |

(56) References Cited

U.S. PATENT DOCUMENTS

| | | |
|---|---|---|
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1* | 12/2008 | Ryu .............. H01L 21/02554 257/43 |
| 2008/0299702 A1 | 12/2008 | Son et al. |
| 2008/0308805 A1 | 12/2008 | Akimoto et al. |
| 2009/0009527 A1 | 1/2009 | Kuga et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072467 A1* | 3/2010 | Yamazaki ............ H01L 27/1225 257/43 |
| 2010/0092800 A1 | 4/2010 | Itagaki et al. |
| 2010/0109002 A1 | 5/2010 | Itagaki et al. |
| 2010/0220094 A1 | 9/2010 | Watanabe |
| 2011/0104851 A1 | 5/2011 | Akimoto et al. |
| 2011/0121290 A1 | 5/2011 | Akimoto et al. |
| 2012/0168750 A1 | 7/2012 | Hayashi et al. |
| 2014/0334596 A1 | 11/2014 | Kimura et al. |
| 2015/0055050 A1 | 2/2015 | Umezaki |
| 2015/0084048 A1 | 3/2015 | Hayashi et al. |
| 2015/0340513 A1 | 11/2015 | Akimoto et al. |

FOREIGN PATENT DOCUMENTS

| | | |
|---|---|---|
| EP | 1770788 A | 4/2007 |
| EP | 1895545 A | 3/2008 |
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 59-221894 A | 12/1984 |
| JP | 60-198861 A | 10/1985 |
| JP | 61-175994 A | 8/1986 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-288050 A | 10/2003 |
| JP | 2004-103957 A | 4/2004 |
| JP | 2004-273614 A | 9/2004 |
| JP | 2004-273732 A | 9/2004 |
| JP | 2007-027768 A | 2/2007 |
| JP | 2007-073559 A | 3/2007 |
| JP | 2007-115807 A | 5/2007 |
| JP | 2007-299833 A | 11/2007 |
| JP | 2007-310352 A | 11/2007 |
| JP | 2008-009393 A | 1/2008 |
| JP | 2008-083692 A | 4/2008 |
| JP | 2008-218495 A | 9/2008 |
| JP | 2008-282913 A | 11/2008 |
| JP | 2009-004757 A | 1/2009 |
| JP | 2009-021612 A | 1/2009 |
| JP | 2009-135380 A | 6/2009 |
| WO | WO-2004/114391 | 12/2004 |
| WO | WO-2008/069056 | 6/2008 |
| WO | WO-2008/069255 | 6/2008 |
| WO | WO-2008/105250 | 9/2008 |

OTHER PUBLICATIONS

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nakamura.M et al., "Syntheses and crystal structures of new homologous compounds, indium iron zinc oxides ($InFeO_3(ZnO)_m$) (m natural number) and related compounds", Kotai Butsuri (Solid State Physics), 1993, vol. 28, No. 5, pp. 317-327.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom,S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "SPINEL,$YbFe_2O_4$, and $Yb_2Fe_3O_7$ Types of Structures for Compounds in the $In_2O_3$ and $Sc_2O_3$-$A_2O_3$-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Chern.H et al., "An Analytical Model for the Above-Threshold Characteristics of Polycilicon Thin-Film Transistors", IEEE Transactions on Electron Devices, Jul. 1, 1995, vol. 42, No. 7, pp. 1240-1246.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al, "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys, Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.

(56) References Cited

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

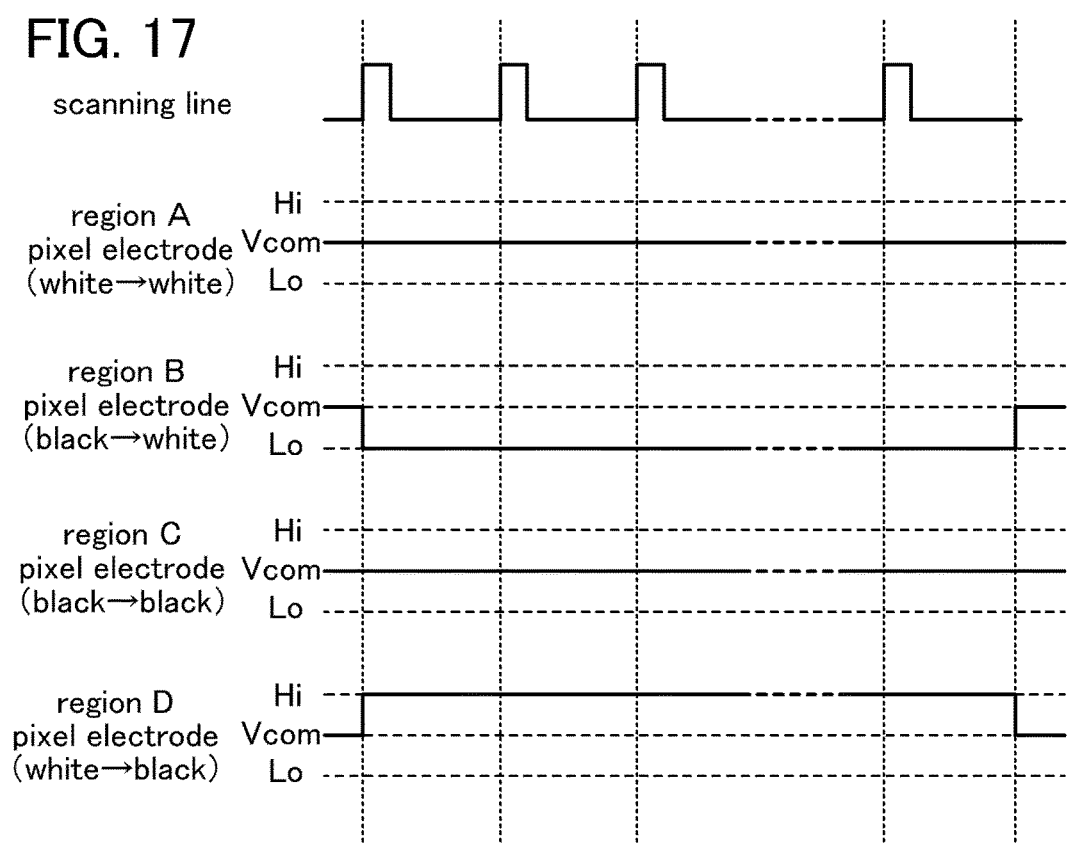

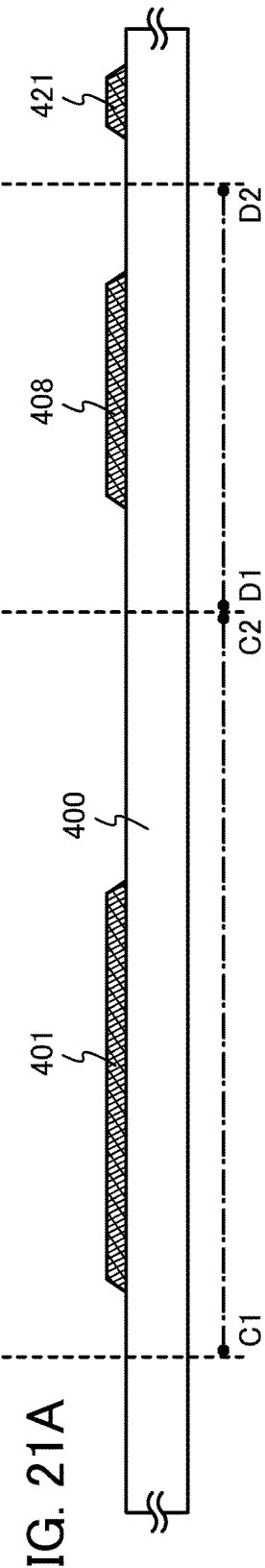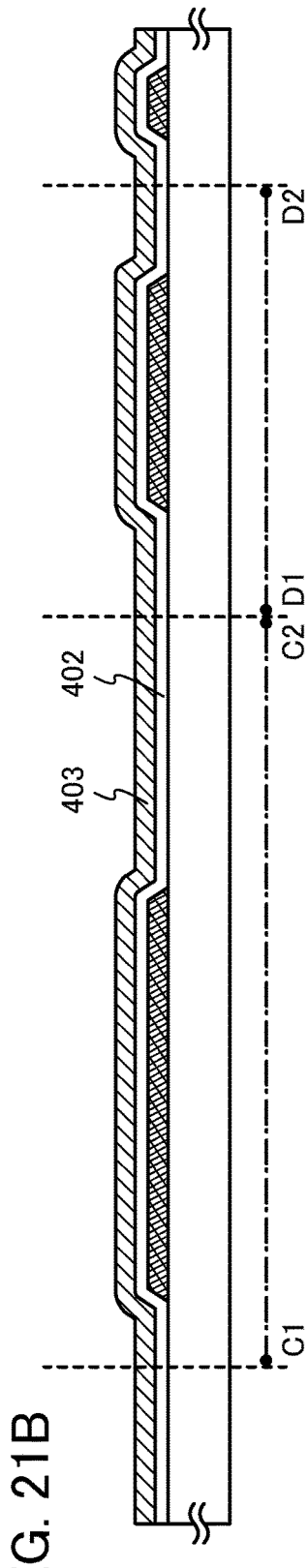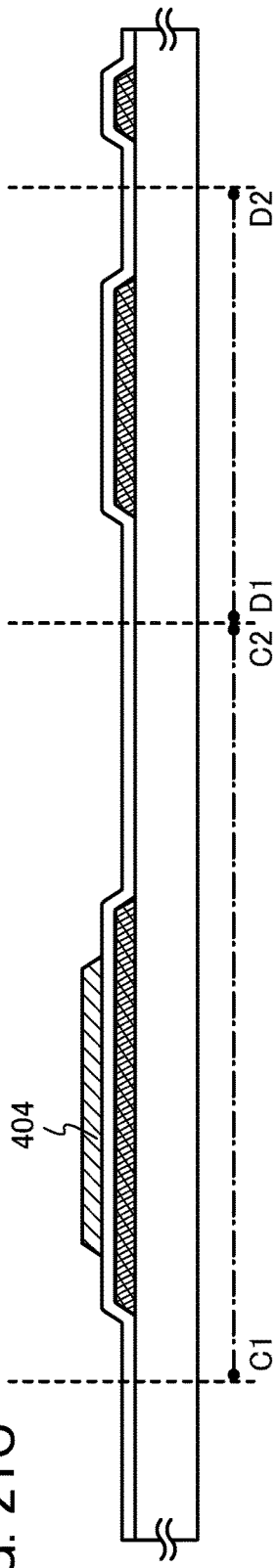

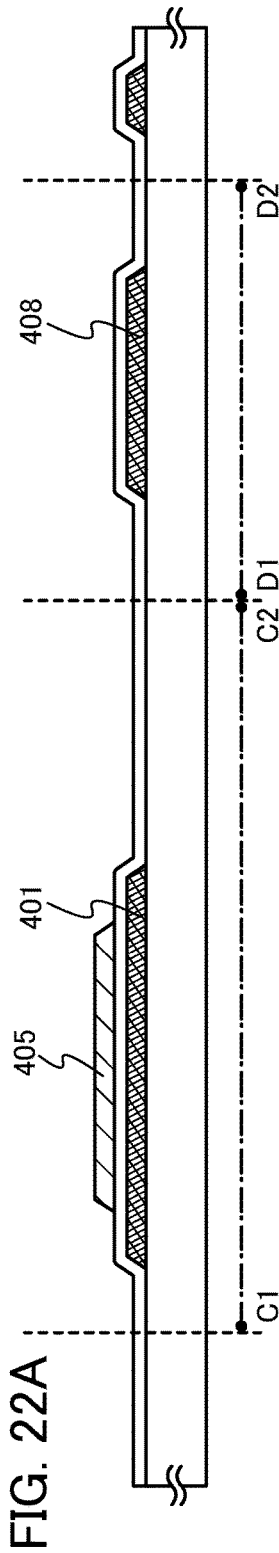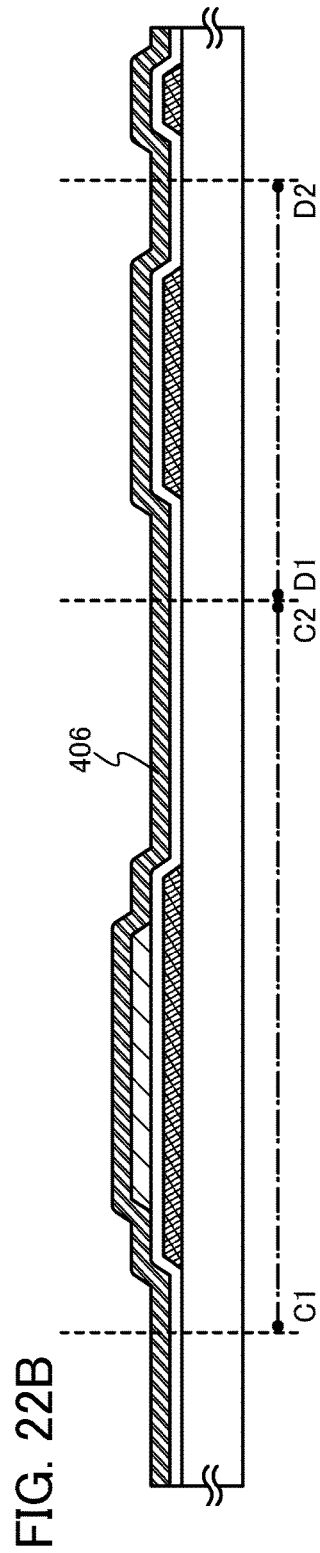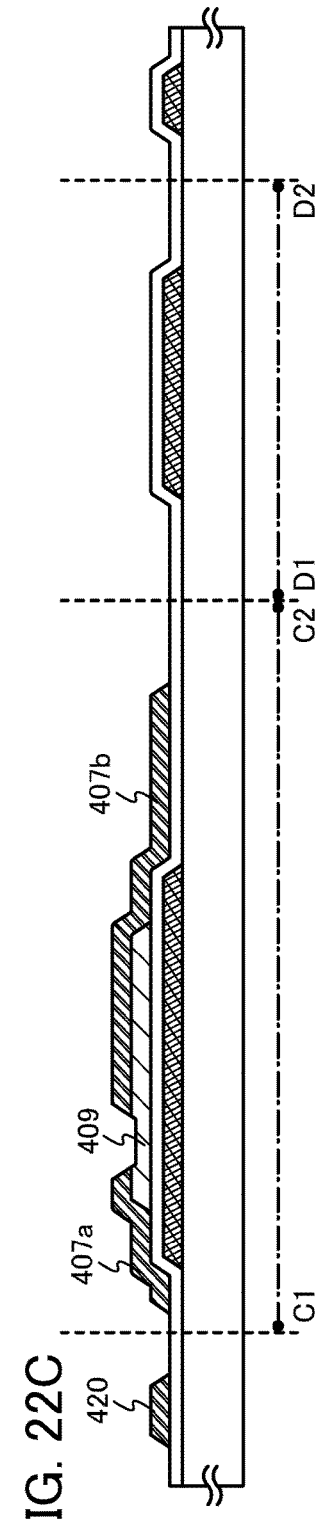

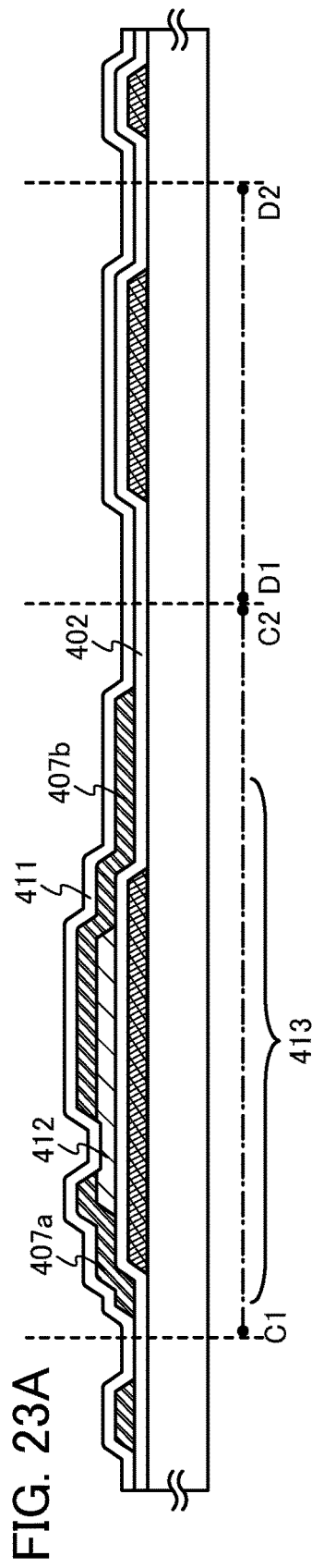
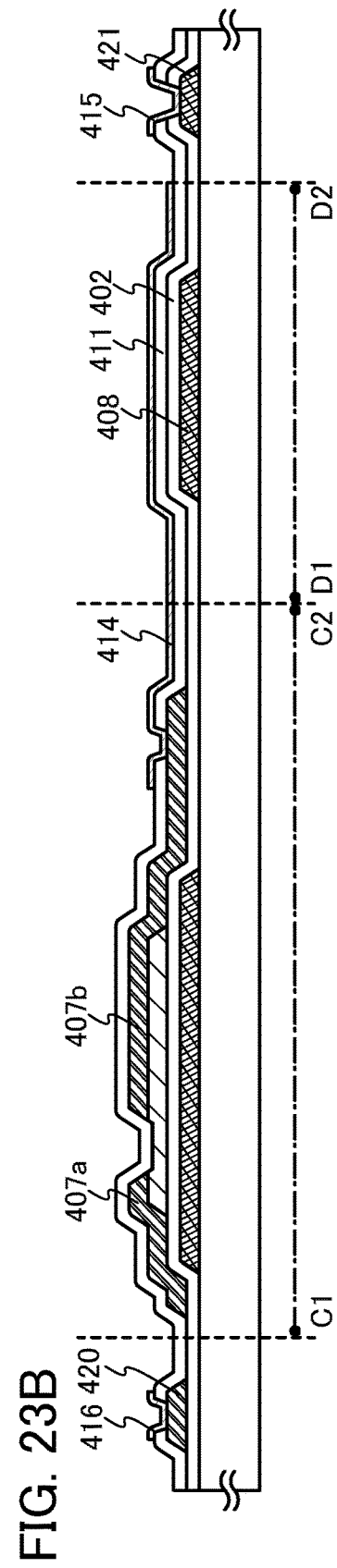
FIG. 23A
FIG. 23B

SEMICONDUCTOR DISPLAY DEVICE

BACKGROUND OF THE INVENTION

1. Field of the Invention

The present invention relates to an active-matrix semiconductor display device having a thin film transistor and a driving method thereof.

2. Description of the Related Art

A thin film transistor having a semiconductor film formed over an insulation surface is an essential semiconductor element for a driver circuit or a pixel portion included in an active-matrix semiconductor display device. Since manufacturing the thin film transistor is limited in terms of allowable temperature limit of a substrate, a thin film transistor including, as an active layer, amorphous silicon which can be formed at a relatively low temperature, polysilicon which can be obtained by crystallization using a laser beam or a catalytic element, or the like is mainly used as a transistor for the semiconductor display device.

In recent years, a metal oxide having semiconductor characteristics which is referred to as an oxide semiconductor has attracted attention as a novel semiconductor material which has both high mobility, which is a characteristic of polysilicon, and uniform element characteristics, which is a characteristic of amorphous silicon. The metal oxide is used for various applications. For example, indium oxide which is a well-known metal oxide is used as a material of a transparent electrode included in a liquid crystal display device or the like. The examples of such metal oxides having semiconductor characteristics are a tungsten oxide, a tin oxide, an indium oxide, a zinc oxide, and the like. A thin film transistor, a channel formation region of which is formed using such a metal oxide having semiconductor characteristics, is already known (for example, see Patent Documents 1 to 4 and Non-Patent Document 1).

As the metal oxides, not only single-component oxides but also multi-component oxides are known. For example, homologous compound, $InGaO_3(ZnO)_m$ (m is natural number) is known as a multi-component oxide having In, Ga, and Zn (see Non-Patent Documents 2 to 4). Further, it is confirmed that such an oxide semiconductor made of an In—Ga—Zn-based oxide is applicable to a channel layer of a thin film transistor (see Patent Document 5 and Non-Patent Documents 5 and 6).

REFERENCE

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957
[Non-Patent Document 1] M. W. Prins, K. O. Grosse-Holz, G Muller, J. F. M. Cillessen, J. B. Giesbers, R. P. Weening, and R. M. Wolf, "A ferroelectric transparent thin-film transistor," *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m:natural number) and related compounds", *KOTAI BUTSURI(SOLID STATE PHYSICS)*, 1993, Vol. 28, No. 5, pp. 317-327
[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, pp. 1269-1272
[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432, pp. 488-492

SUMMARY OF THE INVENTION

Meanwhile, the number of pixels of an active-matrix semiconductor display device has been increased because an image with higher definition and higher resolution is displayed. Therefore, a scan line driver circuit and a signal line driver circuit need driving at high speed, and there has been a problem in that power consumption is high due to high driving frequency. In addition, such a semiconductor display device is required to have high reliability so as to withstand continuous use for a long time. For example, when an image displayed on the semiconductor display device is fixed, burn-in which is a phenomenon in which a semiconductor element or a display element in a particular pixel deteriorates occurs. The burn-in can be seen in all semiconductor display devices. Specially, the burn-in tends to occur remarkably in a semiconductor display device such as a liquid crystal display device, a light-emitting device using an organic light-emitting element, or a SED (surface-conduction electron-emission display).

In order to realize high reliability and low power consumption driving which are required for these semiconductor display devices, it is necessary to realize improvement of not only characteristics of a semiconductor element or a display element but also a driving method. Partial driving can be given as a method for preventing deterioration of a semiconductor element or a display element and high power consumption by continuous use for a long time of a semiconductor display device. Partial driving is a driving method of performing display of an image in a limited area of a pixel portion and stopping display of an image in the other area in the case where an image displayed on a screen is not changed for a certain period.

However, a driver circuit keeps driving even when partial driving is applied, so that it can be hardly said that the power consumption is reduced by comparison with normal driving.

In view of the foregoing problems, it is an object to provide a semiconductor display device with high reliability. Alternatively, it is an object to provide a semiconductor display device in which power consumption can be reduced.

Alternatively, it is an object to provide a driving method of a semiconductor display device, reliability of which can be enhanced. Alternatively, it is an object to provide a driving method of a semiconductor display device in which power consumption can be reduced.

In order to solve the above problems, a scan line driver circuit which sequentially selects only pixels of rows performing display is provided for a semiconductor display device. Specifically, a decoder is provided for the scan line driver circuit and operates such that, in accordance with a signal input to the scan line driver circuit, a pulse is sequentially input only to scan lines included in pixels of rows performing display and a pulse is not input to scan lines included in pixels of rows at which display is not performed. Then, all pixels or part of pixels in the lines selected by a pulse are supplied with a video signal from a signal line driver circuit, whereby display of an image is performed in pixels arranged in the specific area of the pixel portion.

Note that display of an image on the entire pixel portion and display of an image on part of an area of the pixel portion can be controlled by a signal input to the decoder. When an image is displayed on part of an area of the pixel portion, among a plurality of pixels included in the pixel portion, a pulse may be sequentially input only to scan lines included in pixels of specific rows with a signal input to the decoder. Further, when an image is displayed on the entire pixel portion, a pulse may be sequentially input to scan lines included in pixels of all of the rows with a signal input to the decoder.

A pixel includes at least one thin film transistor by which switching is controlled in accordance with a pulse of a signal input to a scan line, and a display element, operation of which is controlled in accordance with a video signal supplied to a signal line driver circuit when the thin film transistor is turned on. In addition, an oxide semiconductor is used for a channel formation region of the thin film transistor. Further, in part of or the whole of the scan line driver circuit and the signal line driver circuit, a semiconductor element using an oxide semiconductor such as a thin film transistor in which an oxide semiconductor is used for a channel formation region may be provided.

Note that as the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, or a one-component metal oxide such as a Sn—O-based oxide semiconductor, and a Zn—O-based oxide semiconductor can be used. Note that in this specification, for example, an In—Sn—Ga—Zn—O-based oxide semiconductor means a metal oxide including indium (In), tin (Sn), gallium (Ga), and zinc (Zn). There is no particular limitation on the stoichiometric proportion. The above oxide semiconductor may include silicon.

Alternatively, oxide semiconductors can be represented by the chemical formula, $InMO_3(ZnO)_m$ (m>0). Here, M represents one or more metal elements selected from Ga, Al, Mn, and Co.

Note that after an oxide semiconductor film is formed, moisture, a hydroxy group, hydrogen, or the like adsorbed onto a surface or inside of an oxide semiconductor film is removed by performing heat treatment under a reduced-pressure atmosphere or an inert gas atmosphere. The temperature range in heat treatment is 400° C. or higher and 700° C. or lower, preferably, 450° C. or higher and 650° C. or lower. An impurity such as moisture, a hydroxy group, hydrogen, or the like in the oxide semiconductor film, in a gate insulating film, or in an interface between an oxide semiconductor film and the other insulating films and the vicinity thereof is removed by the heat treatment. Accordingly, deterioration of characteristics of a transistor due to the impurity can be prevented.

Furthermore, the thin film transistor may be a bottom-gate type, a top-gate type, or a bottom-contacted type. A bottom-gate transistor includes a gate electrode over an insulating surface; a gate insulating film over the gate electrode; an oxide semiconductor film which overlaps with the gate electrode over the gate insulation layer; a source electrode and a drain electrode over the oxide semiconductor film; an oxide insulating film over the oxide semiconductor film, the source electrode, and the drain electrode; and a conductive film which overlaps the oxide semiconductor film over the oxide insulating layer. A top-gate transistor includes an oxide semiconductor film over an insulating surface; a gate insulating film which is an oxide insulating film over the oxide semiconductor film; and a gate electrode which overlaps with the oxide semiconductor film over the gate insulating film and functions as a conductive film. A bottom-contacted transistor includes a gate electrode over an insulating surface; a gate insulating film over the gate electrode; a source electrode and a drain electrode over the gate insulating film; an oxide semiconductor film which is over the source electrode and the drain electrode and which overlaps with the gate electrode over the gate insulating film; an oxide insulating film over the oxide semiconductor film; and a conductive film which overlaps with the oxide semiconductor film over the oxide insulating film.

Since the scan line driver circuit operates so as to input a pulse only to pixels of specified rows, power is less consumed in scan lines of rows except the specified rows and power consumption of a semiconductor display device using an oxide semiconductor can be reduced. Further, the scan line driver circuit operates so as to input a pulse only to pixels of specified rows, whereby continuous use of a semiconductor display device for a long time and deterioration of a display element or a semiconductor element using an oxide semiconductor can be prevented.

BRIEF DESCRIPTION OF THE DRAWINGS

In the accompanying drawings:

FIG. 17 is a timing chart of a voltage applied to a pixel electrode and a voltage of a selecting signal applied to each of scan lines;

FIGS. 21A to 21C are views illustrating a manufacturing method of a semiconductor device;

FIGS. 22A to 22C are views illustrating the manufacturing method of the semiconductor device;

FIGS. 23A and 23B are views illustrating the manufacturing method of the semiconductor device;

DETAILED DESCRIPTION OF THE INVENTION

Hereinafter, embodiments of the present invention will be described in detail with reference to the drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Note that the semiconductor display device of the present invention includes the following in its category: liquid crystal display devices, light-emitting devices in each of which a light-emitting element typified by an organic light-emitting device (OLED) is provided in each pixel, electronic paper, DMDs (digital micromirror devices), PDPs (plasma display panels), FEDs (field emission displays) such as SEDs (surface-conduction electron-emitter displays), or other display devices in each of which a circuit element using a semiconductor film is included in a driver circuit.

Embodiment 1

Figure 1A:
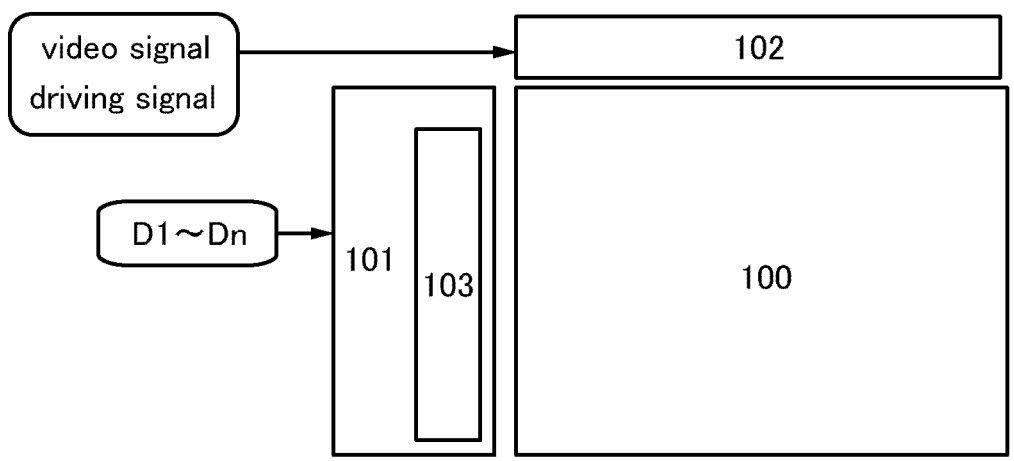
FIG. 1A is a block diagram and FIG. 1B is a structure of a pixel portion of a semiconductor device.

FIG. 1A is a block diagram of a semiconductor display device according to an embodiment of the present invention, as an example.

Figure 1B:
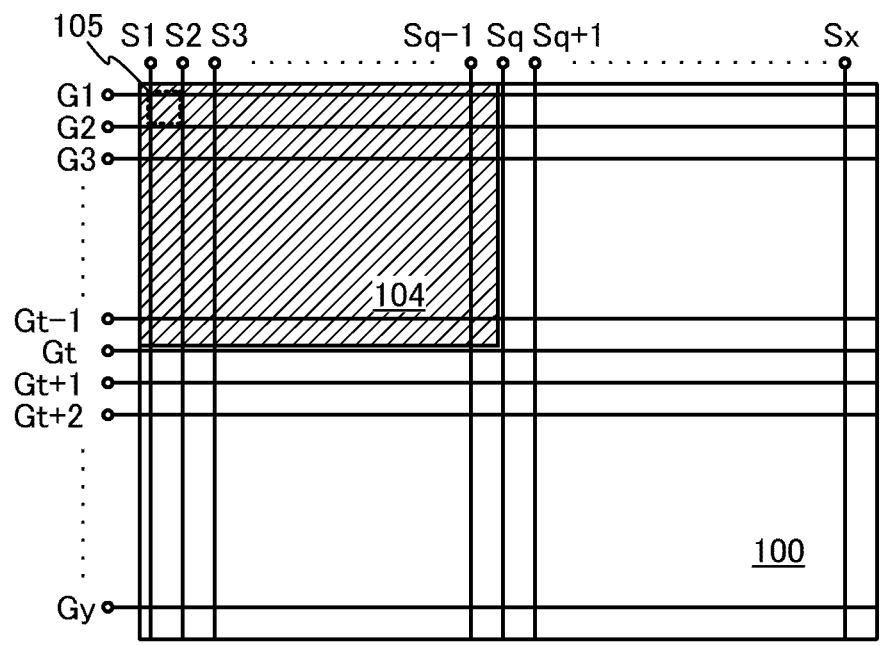

The semiconductor display device illustrated in FIG. 1A includes a pixel portion 100 having a plurality of pixels each of which includes a display element and a thin film transistor, a scan line driver circuit 101 for selecting pixels per line, and a signal line driver circuit 102 for controlling input of a video signal to the pixels of a selected row. As illustrated in FIG. 1B, in the pixel portion 100, a plurality of scan lines G1 to Gy extended from the scan line driver circuit 101 and a plurality of signal lines S1 to Sx extended from the signal line driver circuit 102 are provided so as to intersect each other. In each of pixels 105, at least one of the plurality of scan lines and at least one of the plurality of signal lines are provided. Operation of a display element and a thin film transistor of each of pixels 105 is controlled by a signal input to a scan line and a signal input to a signal line.

The scan line driver circuit 101 includes a decoder 103. The operation of the decoder 103 is controlled by n bits of control signals D1 to Dn input to the scan line driver circuit 101. Specifically, by combination of each bit value of the control signals D1 to Dn, selection signals having pulses can be sequentially input from the decoder 103 to the scan lines G1 to Gy. Further, by combination of each bit value of the control signals D1 to Dn, the scan line driver circuit 101 can operate such that pulses are sequentially input to the scan lines included in pixels of rows performing display and a pulse is not input to the scan lines included in pixels of rows at which display is not performed.

For example, in the pixel portion 100 illustrated in FIG. 1B, an image is displayed only at an area 104. In that case, by combination of each bit value of the control signals D1 to Dn, the scan line driver circuit 101 can operate such that pulses are sequentially input only to the scan lines G1 to Gt-1 included in pixels in the area 104, and a pulse is not input to the scan lines Gt to Gy included in pixels of the other rows at which display is not performed.

Then, a video signal and a driving signal which controls driving of the signal line driver circuit 102 are input to the signal line driver circuit 102. A video signal is supplied from the signal line driver circuit 102 to pixels in all the rows selected by a pulse or pixels in part of a selected row, so that an image can be displayed only on pixels arranged in the specific area 104 of the pixel portion 100. Specifically, in FIG. 1B, a video signal having image data is input only to the signal lines S1 to Sq-1 (q is a natural number which is 2 or more and x or less) and a video signal not contributing to display of an image is input to the signal lines Sq to Sx from the signal line driver circuit 102, whereby an image is displayed on pixels arranged in the specific area 104.

Note that a video signal not contributing to display of an image is a video signal preventing an display element included in a pixel from being supplied with current or voltage. When a video signal not contributing to display of an image is input to a pixel, supply of voltage or current to a display element in the pixel is prevented, or the grayscale displayed by a display element for a plurality of successive frame periods is held. Therefore, display of an image is not performed in the pixel.

Further, in the case where a video signal having image data is input from the signal line driver circuit 102 only to pixels in part of a selected row, specifically, the video signal is supplied only to the signal line S1 to Sq-1 included in pixels in the specific area 104. When a frame frequency is constant, in the case where a video signal having image data is input to part of the pixels in a selected row, the driving frequency of the signal line driver circuit 102 can be lower and power consumption can be reduced by comparison with the case where a video signal having image data is input to all of the pixels in a selected row.

Figure 4A:
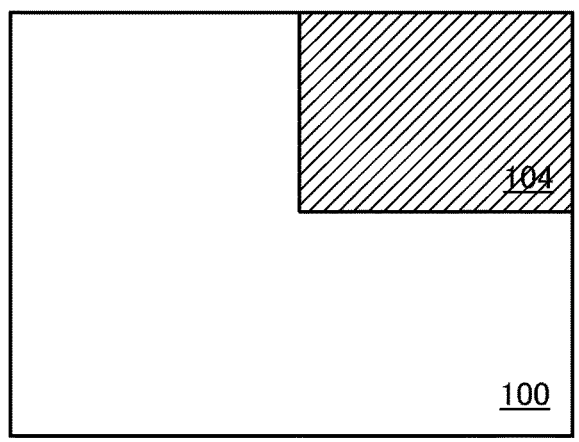
FIGS. 4A to 4C each illustrate a position of an area performing display of an image.
Figure 4B:
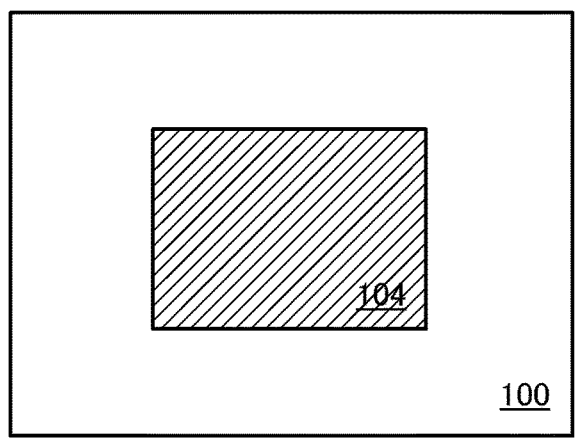
Figure 4C:
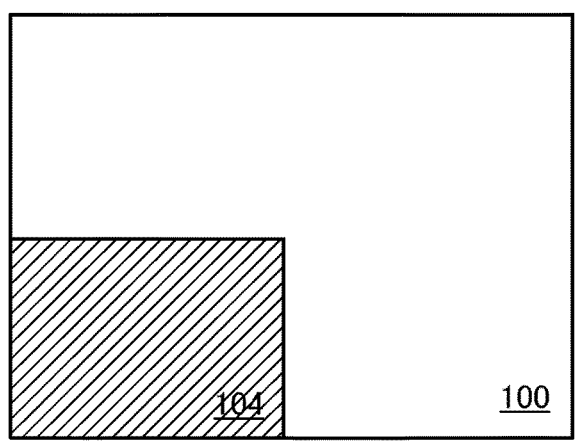

Note that FIG. 1B illustrates the case where the area 104 which is part of an area performing display of an image is a group of pixels including the signal line S1 to Sq-1 and the scan lines G1 to Gt-1 and is placed in the upper left of the pixel portion 100. However, the present invention is not limited to this structure. For example, the area 104 which is part of an area performing display of an image may be placed in the upper right of the pixel portion 100 as illustrated in FIG. 4A, may be placed in the center of the pixel portion 100 as illustrated in FIG. 4B, and may be placed in the lower left of the pixel portion 100 as illustrated in FIG. 4C. The position and the range of the area 104 which is part of area performing display of an image can be appropriately determined by the place of a row selected by the scan line driver circuit 101 and the place of a signal line to which a video signal having image data is input from the signal line driver circuit 102.

Figure 5:
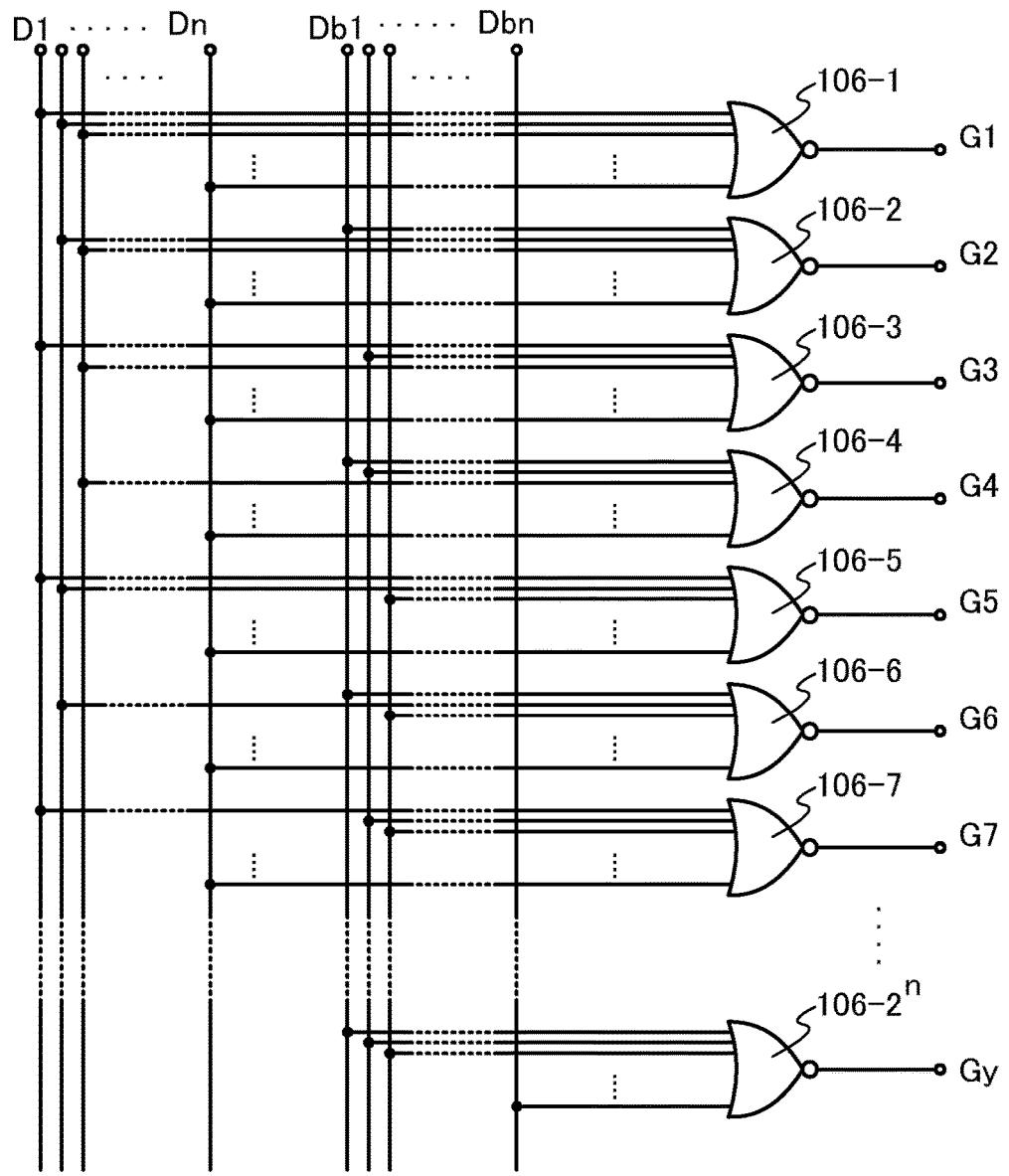
FIG. 5 illustrates a structure of a decoder.

Next, one example of specific structure of the decoder 103 is illustrated in a circuit diagram of FIG. 5. A decoder illustrated in FIG. 5 includes a plurality of NOR circuits 106-1 to 106-$2^n$. To each NOR circuit, n bits of a control signal is input. Note that the number of NOR circuits illustrated in FIG. 5 is just one example and need not be $2^n$. The number of NOR circuits is not bounded to the number of bits of a control signal.

The n bits of the control signal is selected from control signals D1 to Dn and control signals Db1 to Dbn which can be obtained by inversion of polarity of the control signals D1 to Dn. Control signals input to each of NOR circuits 106-1 to 106-$2^n$ are different. For example, the control signals D1 to Dn are input to the NOR circuit 106-1. The control signals D2 to Dn and Db1 are input to the NOR circuit 106-2. The control signals D1, D3 to Dn, and Db2 are input to the NOR circuit 106-3. In this manner, since control signals input to each of NOR circuits 106-1 to 106-$2^n$ are different, only a signal output from any one of the NOR circuits 106-1 to 106-$2^n$ can be made to have a voltage with a height different from a signal output from the other. Specifically, only a signal output from any one of the NOR circuits 106-1 to 106-$2^n$ can be a high level (Hi) voltage and the other signals can be a low-level (Lo) voltage. Then, by changing values of the control signals D1 to Dn and Db1 to Dbn every predetermined period, a signal, high level voltage pulse of which is sequentially shifted can be output from the NOR circuits 106-1 to 106-$2n$.

Signals output from the NOR circuits 106-1 to 106-$2^n$ are input to the scan lines G1 to Gy as selection signals. Among the scan lines G1 to Gy, the scan line to which a voltage corresponding to a pulse of a selection signal is input corresponds to a so-called selected scan line.

Note that the control signals Db1 to Dbn may be generated inside the scan line driver circuit 101 by inversion of the polarities of the control signals D1 to Dn using an inverter or the like. The control signals Db1 to Dbn may be input to the scan line driver circuit 101 together with the control signals D1 to Dn from the outside of the scan line driver circuit 101, for example, from a controller or the like.

In the case where an image is displayed on the entire pixel portion 100, the values of the control signals D1 to Dn and Db1 to Dbn are determined such that a pulse of a selection signal is sequentially input to the scan lines G1 to Gy. In the case where an image is displayed only on the area 104, the values of the control signals D1 to Dn and Db1 to Dbn are determined such that a pulse of a selection signal is sequentially input to the scan lines G1 to Gt-1 and a pulse of a selection signal is not input to the scan lines Gt to Gy.

Note that in a decoder illustrated in FIG. 5, a selection signal having a pulse is output from at least any one of NOR circuits by input of the n bits of the control signal. In the case where a selection signal not having a pulse needs to be input to all of the scan lines, the number of scan lines is designed to be less than the number of NOR circuits. Alternatively, with respect to the n bits of the control circuit, the number of NOR circuits is set to be $2^n$-a and to be the same as the number of the scan lines y or more. Alternatively, the structure in which in addition to the n bits of the control signal, the high level (Hi) voltage can be applied to all of the NOR circuits at one time may be used, and outputs from all of the NOR circuits may be compulsorily made to be the low-level voltage.

Figure 2:
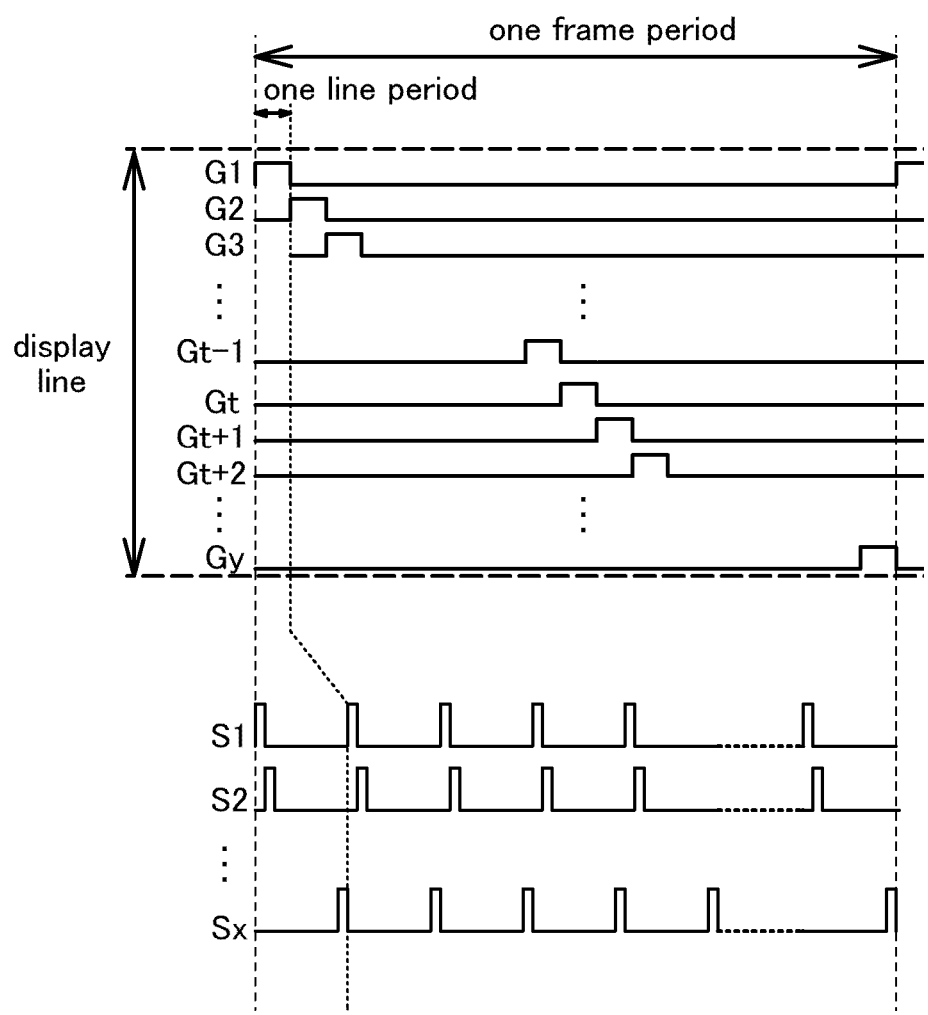
FIG. 2 is a timing chart of a pixel portion.

FIG. 2 illustrates a timing chart of selection signals input to the scan lines G1 to Gy and a video signal input to the signal lines S1 to Sx in the case where an image is displayed on the entire pixel portion 100. As illustrated in FIG. 2, in the case where an image is displayed on the entire pixel portion 100, selection signals, voltage pulses of which are each sequentially shifted are input to the scan lines G1 to Gy in one frame period. Accordingly, all of the rows become display rows performing display. Then, the video signal with image data is input to the signal lines S1 to Sx in one line period in which a pulse appears in a selection signal input to each scan line.

Figure 3:
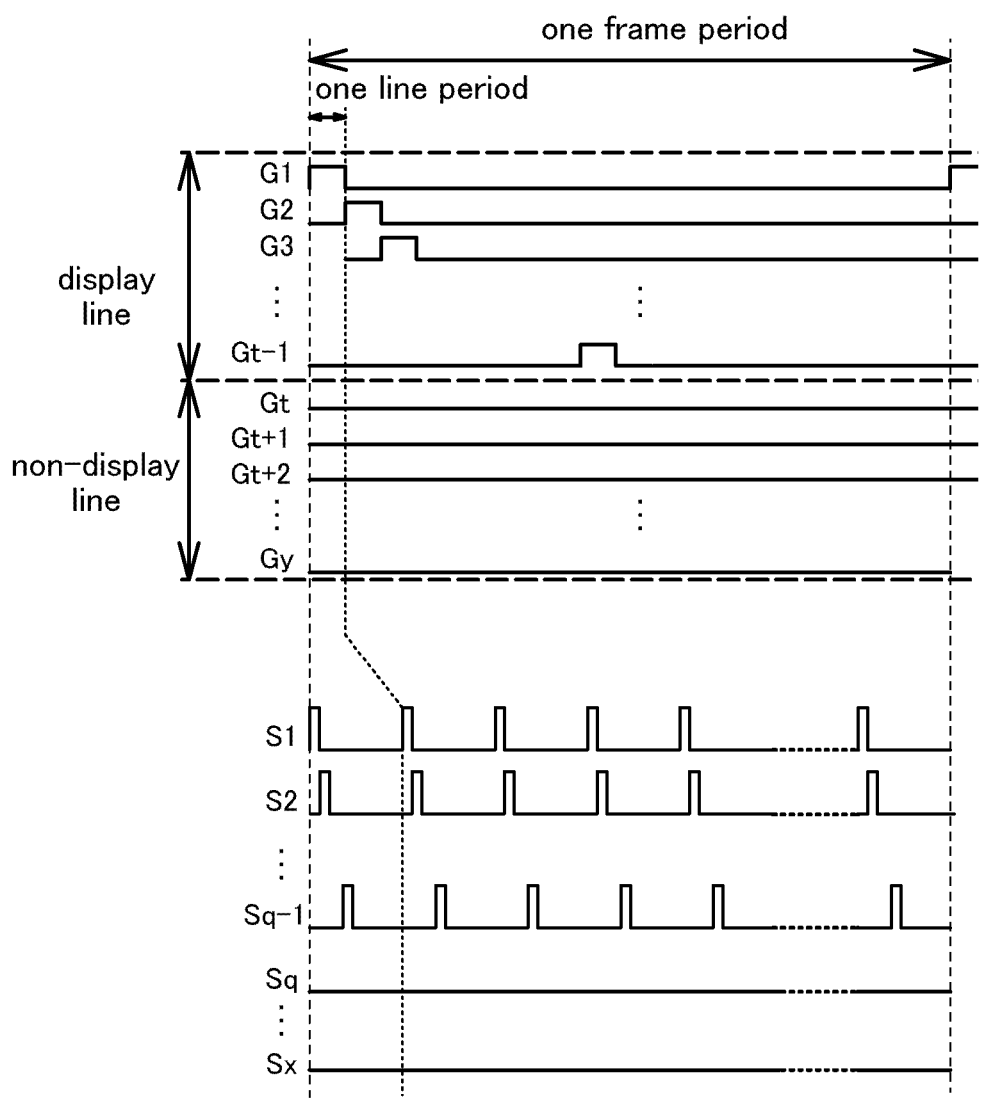
FIG. 3 is a timing chart of a pixel portion.

Further, FIG. 3 illustrates a timing chart of selection signals input to the scan lines G1 to Gy and video signals input to the signal lines S1 to Sx in the case where an image is displayed only on the area 104 which is part of the pixel portion 100. As illustrated in FIG. 3, in the case where an image is displayed only on the area 104, selection signals, voltage pulse of which is sequentially shifted, are input to the scan lines G1 to Gt-1 and the selection signal has no pulse, that is, a flat voltage is input to the scan lines Gt to Gy in one frame period. Accordingly, rows including the scan lines G1 to Gt-1 becomes display rows performing display, and rows including the scan lines Gt to Gy becomes non-display rows not performing display. Further, in one line period during which a pulse appears in a selection signal, a video signal is input only to pixels of display rows including the scan lines G1 to Gt-1 by inputting the video signal to the signal lines S1 to Sx. Furthermore, a video signal which is input to the signal lines S1 to Sq-1 included in pixels of the area 104 has image data. A video signal input to the signal lines Sq to Sx does not contribute to display of an image. Accordingly, by a driving method illustrated in FIG. 3, display of an image can be performed only on pixels of the area 104.

Note that after scanning is finished up to the scan line Gt-1, a video signal input to the signal lines S1 to Sq-1 can be a constant voltage not contributing to display of an image or the signal lines S1 to Sq-1 can be in a floating state without input of a video signal. With the above structure, since the signal lines S1 to Sq-1 are not charged or discharged after scanning is finished up to the scan line Gt-1, power consumption of the signal line driver circuit can be reduced.

Note that the signal line driver circuit 102 may operate such that a video signal is input only to the signal lines S1 to Sq-1. In that case, the drive frequency of the signal line driver circuit 102 can be lower and power consumption can be reduced by comparison with the case where an image is displayed on the entire pixel portion 100.

Note that in FIG. 2 and FIG. 3, a video signal input to the signal lines S1 to Sx is expressed by a pulse. Needless to say, the case where a pulse does not appear is possible depending on image data included in a video signal.

Further, FIG. 2 and FIG. 3 illustrates a timing chart in the case of dot sequential driving by which a video signal is sequentially input from the signal line driver circuit 102 to the signal lines. However, the present invention is not limited to this structure, and line sequential driving by which a video signal is concurrently input from the signal line driver circuit 102 to all the signal lines can also be used.

Furthermore, in the case where an image is displayed on a partial area 104, as compared to the case where an image is displayed on the entire pixel portion 100, frame frequency is intentionally made to be lower and the number of scanning in which scan lines are sequentially selected by the scan line driver circuit 101 in a certain period is reduced, whereby power consumption of the scan line driver circuit may be reduced.

Moreover, in the case of time grayscale driving, the number of scanning may be reduced by lowering frame frequency, or the number of scanning may be reduced by reducing the number of grayscale levels and power consumption of the scan line driver circuit may be reduced. Note that time grayscale driving is a driving method in which a grayscale is displayed by controlling time during which a pixel displays white in one frame period.

In a semiconductor display device according to one embodiment of the present invention, since the scan line driver circuit operates such that input of a pulse only to pixels of specified rows is performed, power consumption in scan lines except specified rows can be prevented. Therefore, power consumption of a semiconductor display device can be reduced. Further, the scan line driver circuit operates such that input of a pulse only to pixels of specified rows is performed, whereby continuous use of pixels in the pixel portion 100 except in the area 104 for a long time is prevented. Therefore, deterioration of a semiconductor element or a display element such as a thin film transistor can be prevented.

Note that a semiconductor display device illustrated in FIG. 1A may be system-on-panel design, in which the pixel portion 100 and the scan line driver circuit 101 or the signal line driver circuit 102 are formed over one substrate. With the system-on-panel design, the number of pins for connection between the pixel portion 100 and a driver circuit such as the scan line driver circuit 101 or the signal line driver circuit 102 can be reduced, so that decrease of the yield caused by a defect in connection between the driver circuit and the pixel portion, low mechanical strength in a connection portion using a pin, or the like can be prevented. Furthermore, by realization of the system-on-panel, the size of a display device is reduced, and cost is reduced because of decrease in the number of assembly steps and inspection steps. In the case of using the system-on-panel design, power source voltage and each kind of signal such as a control signal, a video signal, and a driving signal are supplied from a controller to the pixel portion 100, the scan line driver circuit 101, or the signal line driver circuit 102 through a connection portion such as FPC (Flexible Printed Circuit).

Further, a semiconductor display device of the present invention is not limited to a system-on-panel. A circuit with low driving frequency such as analog switching circuits used for an output portion of the signal line driver circuit 102 and the scan line driver circuit 101 may be formed over one substrate with the pixel portion 100. In addition, a circuit with relatively high driving frequency, which is a circuit except the circuit with low driving frequency, may be formed over another substrate. In this case, a circuit with high driving frequency can be formed using a semiconductor element including a single crystal semiconductor, and the pixel portion 100 and a circuit with low driving frequency can be formed using a semiconductor element including an oxide semiconductor. In this manner, by partly employing system-on-panel design, the decrease of yield caused by the above-described connection defect, low mechanical strength on connection portion using a pin, or the like can be prevented, or reduction in cost by reduction in the number of assembly steps and inspection steps can be realized, which is advantages which can be obtained by a system-on-panel design to some extent. Further, performance of a circuit with high driving frequency can be enhanced by comparison with the case where all of the pixel portion 100, the scan line driver circuit 101, and the signal line driver circuit 102 are formed over one substrate as a system-on-panel, and a pixel portion with a wide area, which is difficult to be realized in the case of using a single crystal semiconductor, can be formed.

Embodiment 2

In this embodiment, a structure of a thin film transistor which is used for a pixel or a driver circuit of a semiconductor display device and which includes an oxide semiconductor film as a channel formation region will be described by giving a bottom-gate transistor with a channel-etched structure as an example.

Figure 6A:
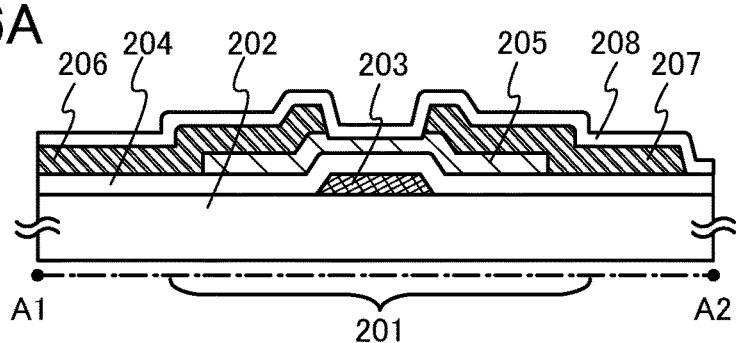
FIGS. 6A and 6C are cross-sectional views of transistors and FIG. 6B is a top view of the transistor in FIG. 6A.
Figure 6B:
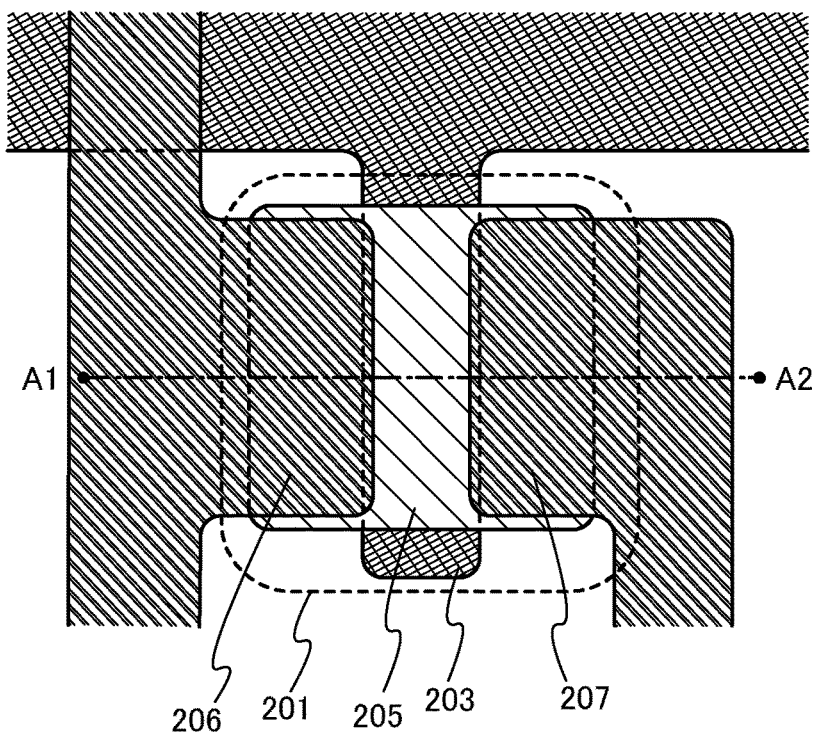

FIG. 6A illustrates a cross-sectional view of a thin film transistor 201 and FIG. 6B illustrates a top view of the thin film transistor 201 in FIG. 6A. Note that a cross-sectional view taken along dashed line A1-A2 in FIG. 6B corresponds to FIG. 6A.

The thin film transistor 201 includes a gate electrode 203 formed over a substrate 202, a gate insulating film 204 formed over the gate electrode 203, an island-shaped oxide semiconductor film 205 formed over the gate insulating film 204 so as to overlap with the gate electrode 203, a source electrode 206 and a drain electrode 207 formed over the island-shaped oxide semiconductor film 205, and an oxide insulating film 208 formed over the oxide semiconductor film 205, the source electrode 206, and the drain electrode 207.

An insulating film which is a base film may be formed between the gate electrode 203 and the substrate 202. The base film has a function of preventing diffusion of an impurity element from the substrate 202, and specifically, can be formed to have a single layer or stacked layer using one or more films selected from a silicon nitride film, a silicon oxide film, a silicon nitride oxide film, and a silicon oxynitride film. The gate electrode 203 can be formed with a single layer or a stacked layer using one or more of conductive films using a metal material such as molybdenum, titanium, chromium, tantalum, tungsten, neodymium, or scandium, or an alloy material which includes any of these metal materials as a main component, or nitride of these metals. Note that aluminum or copper can also be used as such metal materials if aluminum or copper can withstand a temperature of heat treatment performed in a later process.

For example, as a two layer structure of the gate electrode 203, it is preferable to stack a titanium nitride film and a molybdenum film. As a three-layer structure, it is preferable to stack a tungsten film or a tungsten nitride film, an alloy film of aluminum and silicon or an alloy film of aluminum and titanium, and a titanium nitride film or a titanium film.

Note that in this specification, oxynitride refers to a substance which includes more oxygen than nitrogen, and nitride oxide refers to a substance which includes more nitrogen than oxygen.

The thickness of the gate electrode 203 is 10 nm to 400 nm, preferably 100 nm to 200 nm. In this embodiment, after a conductive film with a thickness of 150 nm for the gate electrode is formed by a sputtering method using a tungsten target, the conductive film is processed (patterned) by etching to have a desired shape, so that the gate electrode 203 is formed.

The gate insulating film 204 can be formed using a single layer or a stacked layer selected from a silicon oxide film, a silicon nitride film, a silicon oxynitride film, and a silicon nitride oxide film by a plasma CVD method, a sputtering method, or the like. For example, a silicon oxynitride film may be formed using a deposition gas such as silane (for example, monosilane), oxygen, and nitrogen by a plasma CVD method. In this embodiment, an insulating film with a thickness of 200 nm formed by a plasma CVD method is used as the gate insulating film 204. The insulating film is formed under the following conditions: the silane gas flow rate is 4 sccm; the flow rate of dinitrogen monoxide ($N_2O$) is 800 sccm; and the substrate temperature is 400° C.

The island-shaped oxide semiconductor film 205 is formed such that, after an oxide semiconductor film is formed by a sputtering method or the like using an oxide semiconductor as a target, the oxide semiconductor film is processed into a desired shape by etching or the like. Moreover, the oxide semiconductor film can be formed by a sputtering method under a rare gas (e.g., argon) atmosphere, an oxygen atmosphere, or a mixed atmosphere of a rare gas and oxygen.

Note that before the oxide semiconductor film is formed by a sputtering method, dust attached to a surface of the gate insulating film 204 is preferably removed by reverse sputtering in which an argon gas is introduced and plasma is generated. The reverse sputtering refers to a method in which, without application of voltage to a target side, an RF power source is used for application of voltage to a substrate side under an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

An oxide material having semiconductor characteristics as described above may be used for the oxide semiconductor film for forming a channel formation region.

In this embodiment, as the oxide semiconductor film, an In—Ga—Zn—O-based non-single-crystal film obtained by a sputtering method using an oxide semiconductor target containing In (indium), Ga (gallium), and Zn (zinc) ($In_2O_3$:$Ga_2O_3$:ZnO=1:1:1) is used. In this embodiment, a DC sputtering method is employed, a flow rate of argon is 30 sccm, a flow rate of oxygen is 15 sccm, and a substrate temperature is a room temperature.

The gate insulating film 204 and the oxide semiconductor film may be formed successively without exposure to air. Successive film formation without exposure to air makes it possible to obtain each interface between stacked layers, which is not contaminated by atmospheric components or impurity elements floating in air, such as moisture, hydrocarbon, or the like. Therefore, variation in characteristics of the thin film transistors can be reduced.

Further, heat treatment is preferably performed on the island-shaped oxide semiconductor film 205 under a reduced-pressure atmosphere, an atmosphere of an inert gas such as nitrogen and a rare gas, an oxygen atmosphere, or an ultra-dry air atmosphere (a moisture amount is 20 ppm (−55° C. by conversion into a dew point) or less, preferably 1 ppm or less, more preferably 10 ppb or less when measurement is performed by a dew point meter in a CRDS (cavity ring down laser spectroscopy) method), in a temperature range of 400° C. or higher and 700° C. or lower, preferably 450° C. or higher and 650° C. or lower so as to eliminate moisture, hydrogen, or a hydroxy group included in the oxide semiconductor film 205. After that, slow cooling is preferably performed to be in a temperature range of room temperature or higher and 100° C. or lower. Moisture, hydrogen, or a hydroxy group included in the oxide semiconductor film 205 is eliminated by performing heat treatment on the oxide semiconductor film 205 under the above atmosphere.

As heat treatment, a heating method using an electric furnace, an instantaneous heating method such as a GRTA (gas rapid thermal annealing) method using a heated gas or an LRTA (lamp rapid thermal anneal) method using lamp light can be employed. For example, in the case of performing heat treatment using an electric furnace, the temperature rise characteristics is preferably set at higher than or equal to 0.1° C./min and lower than or equal to 20° C./min and the temperature drop characteristics is preferably set at 0.1° C./min or higher and 15° C./min or lower.

Note that it is preferable that in the heat treatment, moisture, hydrogen, or the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more; that is, an impurity concentration is set to 1 ppm or lower, preferably, 0.1 ppm or lower.

After the heat treatment, the island-shaped oxide semiconductor film 205 may be crystallized partly or entirely.

Note that after the heat treatment is performed on the oxide semiconductor film 205 under an oxygen atmosphere, heat treatment is performed again on the oxide semiconductor film 205 under an oxygen atmosphere. Through the above heat treatment, impurities such as moisture included in the oxide semiconductor film 205 can be removed. In addition, the heat treatment is performed under an oxygen atmosphere in order that the oxide semiconductor film 205 may include excessive oxygen, whereby resistance thereof can be increased. The heat treatment under an oxygen atmosphere is performed at a temperature at which a metal having a low melting point such as Zn included in the oxide semiconductor is not easily evaporated, for example, 100° C. or higher and 350° C. or lower, preferably 150° C. or higher and 250° C. or lower. It is preferable that an oxygen gas used for the heat treatment under an oxygen atmosphere does not include moisture, hydrogen, or the like. Alternatively, the purity of the oxygen gas which is introduced into the heat treatment apparatus is preferably 6N (99.9999%) or more preferably 7N (99.99999%) or more; that is, an impurity concentration is set to 1 ppm or lower, preferably, 0.1 ppm or lower.

Further, the source electrode 206 and the drain electrode 207 are formed such that, after a conductive film for a source electrode and a drain electrode is formed over the island-shaped oxide semiconductor film 205, the conductive film is patterned by etching or the like. By the patterning, an exposed portion of the island-shaped oxide semiconductor film 205 is partly etched when the source electrode 206 and the drain electrode 207 are formed.

As the conductive films for a source electrode and a drain electrode, for example, a material such as an element selected from aluminum, chromium, tantalum, titanium, manganese, magnesium, molybdenum, tungsten, zirconium, beryllium, and yttrium; an alloy including one or more of these elements as a component; or the like can be used. Note that in the case where heat treatment is performed after the formation of the conductive film, the conductive film preferably has heat resistance enough to withstand the heat treatment. In the case where heat treatment is performed after the formation of the conductive film, the conductive film is formed using the conductive material having heat resistance in combination with aluminum because aluminum alone has problems of low heat resistance, being easily corroded, and the like. As the conductive material having heat resistance which is combined with aluminum, the following material is preferably used: an element selected from titanium, tantalum, tungsten, molybdenum, chromium, neodymium, and scandium; an alloy including one or more of these elements as a component; a nitride including any of these elements as a component; or the like.

The thickness of the source electrode 206 and the thickness of the drain electrode 207 are 10 nm to 400 nm, preferably 100 nm to 200 nm. In this embodiment, after a conductive film for a source electrode and a drain electrode are formed by a sputtering method using a molybdenum target, the conductive film is processed (patterned) by etching to have a desired shape, so that the source electrode 206 and the drain electrode 207 are formed.

The oxide insulating film 208 is formed to be in contact with the island-shaped oxide semiconductor film 205, the source electrode 206, and the drain electrode 207 by a sputtering method. The oxide insulating film 208 formed to be in contact with the low-resistant island-shaped oxide semiconductor film 205 is formed using an inorganic insulating film which includes impurities such as moisture, hydrogen, oxygen and a hydroxy group as little as possible and blocks entry of these impurities from the outside, specifically, a silicon oxide film, a silicon nitride oxide film, or the like.

In this embodiment, as the oxide insulating film 208, a silicon oxide film with a thickness of 300 nm is formed. The substrate temperature in film formation may be from room temperature or higher and 300° C. or lower and is 100° C. in this embodiment. Deposition of the silicon oxide film with a sputtering method can be performed under a rare gas (e.g., argon) atmosphere, an oxygen atmosphere, or an atmosphere including a rare gas (e.g., argon) and oxygen. Further, a silicon oxide target or a silicon target may be used as a target. For example, with the use of a silicon target, a silicon oxide can be formed by a sputtering method under an oxygen atmosphere.

When the oxide insulating film 208 is formed in contact with the low-resistant oxide semiconductor film 205 by a sputtering method, a PCVD method, or the like, at least a region of the low-resistant oxide semiconductor film 205 which is in contact with the oxide insulating film 208 becomes highly resistive because the carrier density of the region preferably becomes less than $1\times10^{18}/cm^3$, so that the region becomes a high-resistance oxide semiconductor region. By forming the oxide insulating film 208, the oxide semiconductor film 205 has a high-resistance oxide semiconductor region in vicinity of an interface of the oxide insulating film 208.

Note that, so that moisture, hydrogen, or a hydroxy group included in the oxide semiconductor film 205 may be eliminated, after the source electrode 206 and the drain electrode 207 are formed and before or after the oxide insulating film 208 is formed, heat treatment is performed again on the island-shaped oxide semiconductor film 205 under a reduced-pressure atmosphere, an atmosphere of an inert gas such as nitrogen and a rare gas, an oxygen atmosphere, or an ultra-dry air atmosphere (a moisture amount is 20 ppm (−55° C. by conversion into a dew point) or less, preferably 1 ppm or less, more preferably 10 ppb or less when measurement is performed by a dew point meter in a CRDS (cavity ring down laser spectroscopy) method). In consideration of the heat resistance of the source electrode 206 and the drain electrode 207, the heat treatment after the source electrode 206 and the drain electrode 207 are formed is preferably performed at lower temperature than that performed before the source electrode 206 and the drain electrode 207 are formed. Specifically, the heat treatment is favorably performed at a temperature in the range of 350° C. or higher and 650° C. or lower, preferably 400° C. or higher and 600° C. or lower.

Figure 6C:
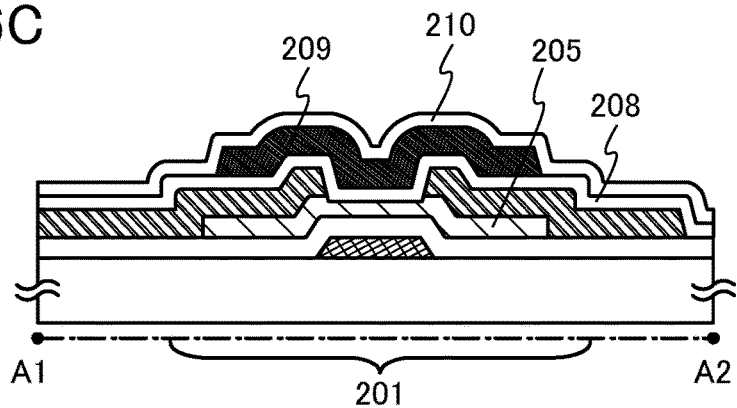

Note that as illustrated in FIG. 6C, the thin film transistor 201 may further have a conductive film 209 over the oxide insulating film 208. The similar material or stacked layer structure to the source electrode 206 and the drain electrode 207 can be used for the conductive film 209. The thickness of the conductive film 209 is 10 nm to 400 nm, preferably 100 nm to 200 nm. Then, a resist mask is formed by a photolithography method and the conductive film 209 is processed (patterned) to have a desired shape. The conductive film 209 is formed so as to overlap with a channel formation region of the oxide semiconductor film 205. The conductive film 209 may be in a floating state, that is, electrically insulated, or may be in a state in which a potential is supplied. In the latter case, to the conductive film 209, a potential having the same height as that of the gate electrode 203 may be applied or a fixed potential such as a ground potential may be supplied. By controlling the height of a potential supplied to the conductive film 209, the threshold voltage of the thin film transistor 201 can be controlled.

Further, in the case of forming the conductive film 209, an insulating film 210 is favorably formed so as to cover the conductive film 209. For the insulating film 210, an inorganic insulating film such as a silicon oxide film and a silicon nitride oxide film, which includes an impurity such as moisture, hydrogen, oxygen, and a hydroxy group as little as possible and blocks entry of such an impurity is favorably used.

A thin film transistor using an oxide semiconductor has high mobility compared to a thin film transistor using amorphous silicon and uniform element characteristics similar to those of a thin film transistor using amorphous silicon. Accordingly, an oxide semiconductor can be used for not only a pixel portion but also a semiconductor element which forms a driver circuit with higher driving frequency than the pixel portion. A system-on-panel can be realized without process such as laser crystallization.

Moreover, even when a high-resistance metal material is used as a gate electrode, a source electrode, a drain electrode, or a conductive film over an oxide semiconductor insulating film in order to withstand a temperature of heat treatment, power consumption of the whole semiconductor display device can be reduced and reliability can be improved because pulses are sequentially input to scan lines included in pixels of rows performing a display and an image is displayed only on a specific area of the pixel portion.

This embodiment can be implemented in combination with the above embodiment.

Embodiment 3

In this embodiment, a structure of a bottom-contacted thin film transistor which has a different structure from the thin film transistor 201 illustrated in Embodiment 2 will be described. Note that the same portions as Embodiment 2 or portions having functions similar to those of Embodiment 2 can be formed in a manner similar to that of Embodiment 2, and also the same steps as Embodiment 2 or the steps similar to those of Embodiment 2 can be performed in a manner similar to those of Embodiment 2; therefore, repetitive description thereof is omitted.

Figure 7A:
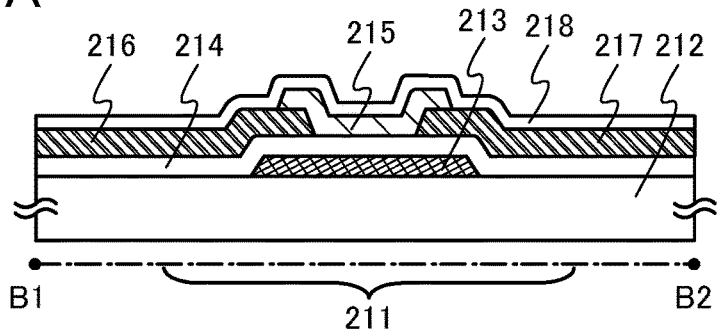
FIGS. 7A and 7C are cross-sectional views of transistors and FIG. 7B is a top view of the transistor in FIG. 7A.
Figure 7B:
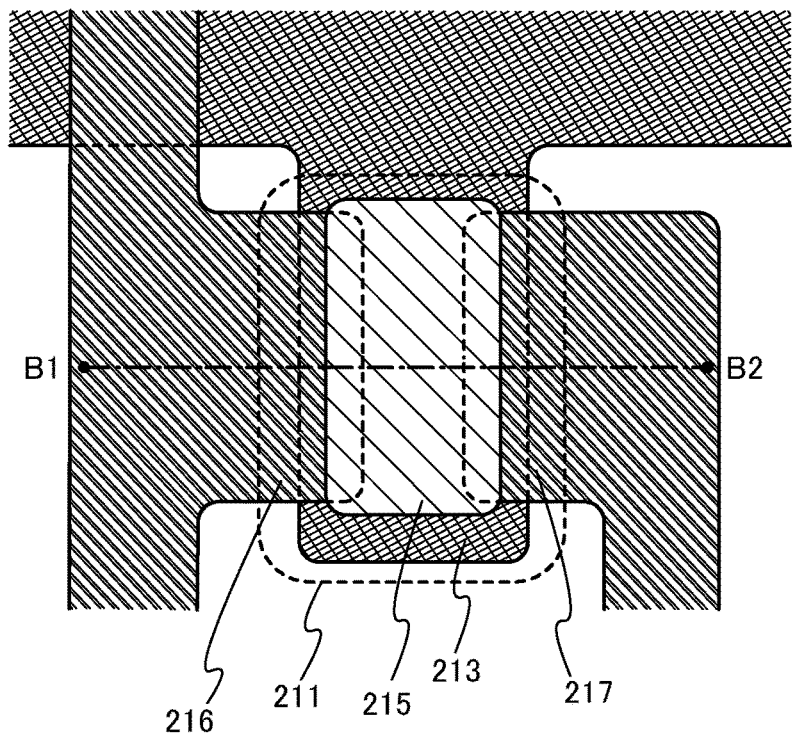

FIG. 7A illustrates a cross-sectional view of a thin film transistor 211, and FIG. 7B illustrates a top view of the thin film transistor in FIG. 7A. Note that a cross-sectional view taken along dashed line B1-B2 in FIG. 7B corresponds to FIG. 7A.

The thin film transistor 211 includes a gate electrode 213 formed over a substrate 212, a gate insulating film 214 formed over the gate electrode 213, a source electrode 216 and a drain electrode 217 formed over the gate insulating film 214, an island-shaped oxide semiconductor film 215 formed over the source electrode 216 and the drain electrode 217 so as to overlap with the gate electrode 213 and be in contact with the gate insulating film 214, and an oxide insulating film 218 formed over the oxide semiconductor film 215.

An insulating film functioning as a base film may be provided between the gate electrode 213 and the substrate 212. The base film can be formed using a material and a stacked layer structure similar to those of Embodiment 2. In addition, the material and stacked layer structure similar to those of Embodiment 2 can be used for the gate electrode 213.

The thickness of the gate electrode 213 is 10 nm to 400 nm, preferably 100 nm to 200 nm. In this embodiment, the gate electrode 213 is formed such that after a conductive film for a gate electrode with a thickness of 150 nm is formed by a sputtering method using a tungsten target, the conductive film is processed (patterned) to have a desired shape by etching.

The gate insulating film 214 can be formed using the material and stacked layer structure similar to those of Embodiment 2, and a manufacturing method shown in Embodiment 2. In this embodiment, an insulating layer with a thickness of 200 nm formed by a plasma CVD method is used as the gate insulating film 214. The insulating film 214 is formed under the following conditions: the silane gas flow rate is 4 sccm; the flow rate of dinitrogen monoxide ($N_2O$) is 800 sccm; and the substrate temperature is 400° C.

Further, the source electrode 216 and the drain electrode 217 are formed such that after a conductive film for a source electrode and a drain electrode is formed over the gate insulating film 214, the conductive film is processed (patterned) by etching. The conductive film for a source electrode and a drain electrode can be formed using a material and stacked layer structure similar to those of Embodiment 2.

Note that in the case of a bottom contacted thin film transistor, the thicknesses of the source electrode 216 and the drain electrode 217 are preferably thinner than those of the bottom gate transistor illustrated in Embodiment 2 in order to prevent breakage of the oxide semiconductor film 215 formed later. Specifically, the thicknesses of the source electrode 216 and the drain electrode 217 are 10 nm to 200 nm, preferably 50 nm to 75 nm. In this embodiment, the source electrode 216 and the drain electrode 217 are formed such that after a conductive film for a source electrode and a drain electrode is formed by a sputtering method using a molybdenum target, the conductive film is processed (patterned) to have a desired shape by etching.

The island-shaped oxide semiconductor film 215 is formed using a material and stacked layer structure similar to those of Embodiment 2. The island-shaped oxide semiconductor film 215 can be formed over the source electrode 216 and the drain electrode 217 by using a manufacturing method shown in Embodiment 2 to be in contact with the gate insulating film 214 at the position overlapping with the gate electrode 213.

In this embodiment, as the oxide semiconductor film, an In—Ga—Zn—O-based non-single-crystal film obtained by a sputtering method using an oxide semiconductor target containing In (indium), Ga (gallium), and Zn (zinc) ($In_2O_3$: $Ga_2O_3$:ZnO=1:1:1) is used. In this embodiment, a DC sputtering method is employed, a flow rate of argon is 30 sccm, a flow rate of oxygen is 15 sccm, and a substrate temperature is a room temperature.

Furthermore, in order that moisture, hydrogen, a hydroxy group included in the oxide semiconductor film 215 is eliminated, heat treatment is performed under an atmosphere of an inert gas (e.g., nitrogen, helium, neon, or argon). Conditions of the heat treatment can be referred to the description in Embodiment 2. Moisture, hydrogen, or a hydroxy group included in the oxide semiconductor film 215 is eliminated by performing heat treatment on the oxide semiconductor film 215 under the above atmosphere.

Further, the oxide insulating film 218 is formed by a sputtering method so as to be in contact with the island-shaped oxide semiconductor film 215. The oxide insulating film 218 can be formed using the material and stacked layer structure similar to those of Embodiment 2, and a manufacturing method shown in Embodiment 2.

Note that after the oxide insulating film 218 is formed, heat treatment may be performed again on the island-shaped oxide semiconductor film 215 under a reduced-pressure atmosphere, an atmosphere of an inert gas such as nitrogen and a rare gas, an oxygen atmosphere, or an ultra-dry air atmosphere (a moisture amount is 20 ppm (−55° C. by conversion into a dew point) or less, preferably 1 ppm or less, more preferably 10 ppb or less when measurement is performed by a dew point meter in a CRDS (cavity ring down laser spectroscopy) method), such that moisture, hydrogen, or a hydroxy group included in the oxide semiconductor film 215 may be eliminated. Conditions of the heat treatment can be referred to as the description in Embodiment 2.

Figure 7C:
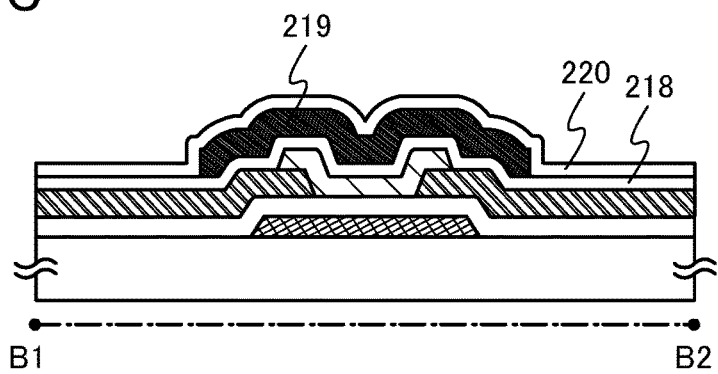

Note that as illustrated in FIG. 7C, the thin film transistor 211 may further have a conductive film 219 over the oxide insulating film 218. The similar material or stacked layer structure to the source electrode 216 and the drain electrode 217 can be used for the conductive film 219. The thickness of the conductive film 219 is 10 nm to 400 nm, preferably 100 nm to 200 nm. Then, a resist mask is formed by a photolithography method and the conductive film 219 is processed (patterned) to have a desired shape. The conductive film 219 is formed so as to overlap with a channel formation region of the oxide semiconductor film 215. The conductive film 219 may be in a floating state, that is, electrically insulated, or may be in a state in which a potential is supplied. In the latter case, to the conductive film 219, a potential having the same height as that of the gate electrode 213 may be applied or a fixed potential such as a ground potential may be supplied. By controlling the height of a potential supplied to the conductive film 219, the threshold voltage of the thin film transistor 211 can be controlled.

Further, in the case of forming the conductive film 219, an insulating film 220 is formed so as to cover the conductive film 219. For the insulating film 220, an inorganic insulating film such as a silicon oxide film and a silicon nitride oxide film, which includes an impurity such as moisture, hydrogen, oxygen, and a hydroxy group as little as possible and blocks entry of such an impurity is used.

A thin film transistor using an oxide semiconductor has high mobility compared to a thin film transistor using amorphous silicon and uniform element characteristics similar to that of a thin film transistor using amorphous silicon. Accordingly, an oxide semiconductor can be used for not only a pixel portion but also a semiconductor element which forms a driver circuit with higher driving frequency than the pixel portion. A system-on-panel can be realized without process such as laser crystallization.

Moreover, even when a high-resistance metal material is used as a gate electrode, a source electrode, a drain electrode, or a conductive film over an oxide semiconductor insulating film in order to withstand a temperature of heat treatment, power consumption of the whole semiconductor display device can be reduced and reliability can be improved such that pulses are sequentially input to scan lines included in pixels of rows performing a display and an image is displayed only on a specific area of the pixel portion as described in Embodiment 1.

This embodiment can be implemented in combination with any of the above embodiments.

Embodiment 4

In this embodiment, a structure of a bottom-gate thin film transistor with a channel protective structure which has a different structure from the thin film transistor 201 shown in Embodiment 2 and a thin film transistor 221 illustrated in Embodiment 3 will be described. Note that the same portions as Embodiment 2 or portions having functions similar to those of Embodiment 2 can be formed in a manner similar to that of Embodiment 2, and also the same steps as Embodiment 2 or the steps similar to those of Embodiment 2 can be performed in a manner similar to those of Embodiment 2; therefore, repetitive description thereof is omitted.

Figure 8A:
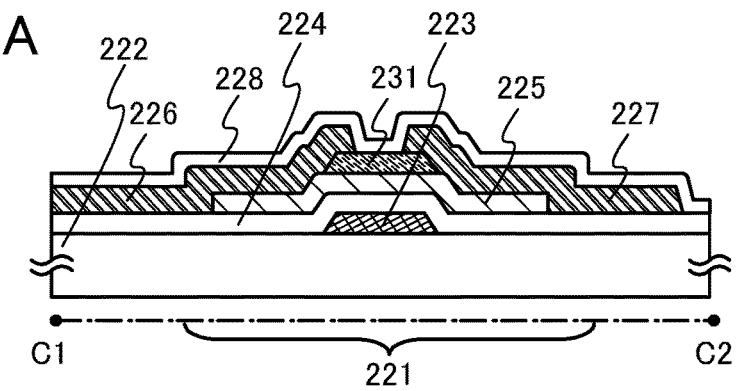
FIGS. 8A and 8C are cross-sectional views of transistors and FIG. 8B is a top view of the transistor in FIG. 8A.
Figure 8B:
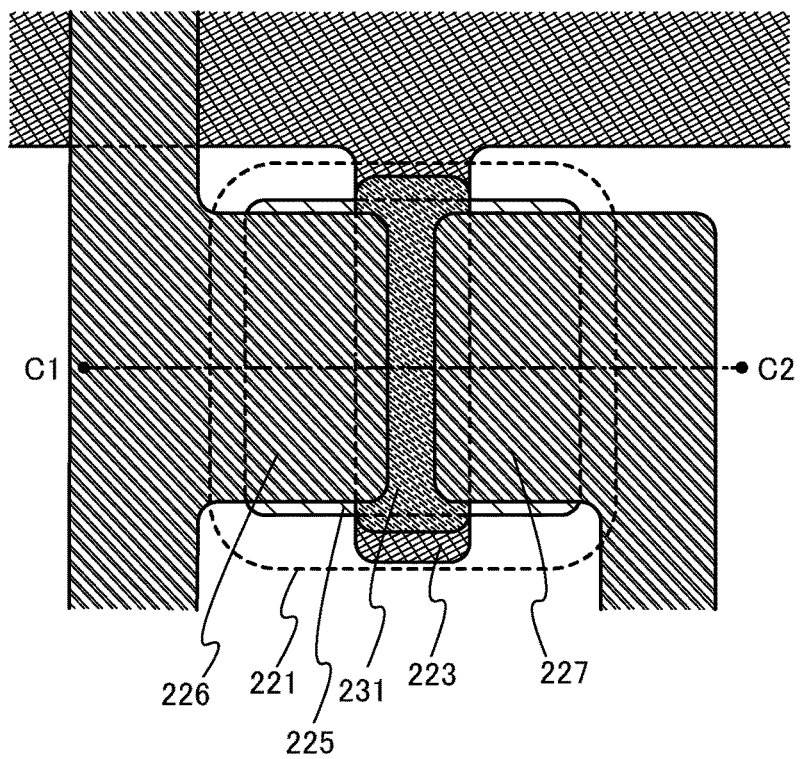

FIG. 8A illustrates a cross-sectional view of the thin film transistor 221 and FIG. 8B illustrates a top view of the thin film transistor 221 in FIG. 8A. Note that a cross-sectional view taken along dashed line C1-C2 in FIG. 8B corresponds to FIG. 8A.

The thin film transistor 221 includes a gate electrode 223 formed over a substrate 222, a gate insulating film 224 formed over the gate electrode 223, an island-shaped oxide semiconductor film 225 formed over the gate insulating film 224 at a position overlapping with the gate electrode 223, a channel protective film 231 formed over a portion to be a channel formation region which is a part of the island-shaped oxide semiconductor film 225, a source electrode 226 and a drain electrode 227 formed over the island-shaped oxide semiconductor film 225, and an oxide insulating film 228 formed over a channel protective film 231, the source electrode 226, and the drain electrode 227.

An insulating film functioning as a base film may be provided between the gate electrode 223 and the substrate 222. The base film can be formed using a material and a stacked layer structure similar to those of Embodiment 2. In addition, the material and stacked layer structure similar to those of Embodiment 2 can be used for the gate electrode 223.

The thickness of the gate electrode 223 is 10 nm to 400 nm, preferably 100 nm to 200 nm. In this embodiment, after a conductive film with a thickness of 150 nm for a gate electrode is formed by a sputtering method using a tungsten target, the conductive film is processed (patterned) by etching to have a desired shape, so that the gate electrode 223 is formed.

The gate insulating film 224 can be formed using the material and stacked layer structure similar to those of Embodiment 2, and a manufacturing method shown in Embodiment 2. In this embodiment, an insulating layer with a thickness of 200 nm formed by a plasma CVD method is used as the gate insulating film 224. The insulating film is formed under the following conditions: the silane gas flow rate is 4 sccm; the flow rate of dinitrogen monoxide ($N_2O$) is 800 sccm; and the substrate temperature is 400° C.

The island-shaped oxide semiconductor film 225 is formed using a material and stacked layer structure similar to Embodiment 2. The island-shaped oxide semiconductor film 225 can be formed over the gate insulating film 224 by using a manufacturing method described in Embodiment 2 at a position overlapping with the gate electrode 223.

In this embodiment, as the oxide semiconductor film, an In—Ga—Zn—O-based non-single-crystal film obtained by a sputtering method using an oxide semiconductor target containing In (indium), Ga (gallium), and Zn (zinc) ($In_2O_3$: $Ga_2O_3$:ZnO=1:1:1 is used. In this embodiment, a DC sputtering method is employed, a flow rate of argon is 30 sccm, a flow rate of oxygen is 15 sccm, and a substrate temperature is a room temperature.

Further, heat treatment is performed on the island-shaped oxide semiconductor film 225 under a reduced-pressure atmosphere, an atmosphere of an inert gas such as nitrogen and a rare gas, an oxygen atmosphere, or an ultra-dry air atmosphere (a moisture amount is 20 ppm (−55° C. by conversion into a dew point) or less, preferably 1 ppm or less, more preferably 10 ppb or less when measurement is performed by a dew point meter in a CRDS (cavity ring down laser spectroscopy) method) so as to eliminate moisture, hydrogen, or a hydroxy group included in the island-shaped oxide semiconductor film 225. Conditions of the heat treatment can be referred to the description in Embodiment 2. Moisture, hydrogen, or a hydroxy group included in the oxide semiconductor film 225 is eliminated by performing the heat treatment on the oxide semiconductor film 225.

The channel protective film 231 is formed over the island-shaped oxide semiconductor film 225 so as to overlap with the portion thereof which serves as a channel formation region later. The channel protective film 231 can prevent the portion of the island-shaped oxide semiconductor film 225, which serves as a channel formation region later, from being damaged in a later step (e.g., reduction in thickness due to plasma or an etchant in etching). Therefore, reliability of the thin film transistor can be improved.

The channel protective film 231 can be formed using an inorganic material including oxygen (such as silicon oxide, silicon oxynitride, or silicon nitride oxide). The channel protective film 231 can be formed by a vapor deposition method such as a plasma CVD method or a thermal CVD method, or a sputtering method. After the deposition of the channel protective film 231, the shape thereof is processed by etching. Here, the channel protective film 231 is formed such that a silicon oxide film is formed by a sputtering method and processed by etching using a mask formed by photolithography.

When the channel protective film 231 which is an oxide insulating film is formed in contact with the island-shaped oxide semiconductor film 225 by a sputtering method, a PCVD method, or the like, at least a region of the oxide semiconductor film 225 which is in contact with the channel protective film 231 becomes highly resistive by oxygen supplies from the channel protective film 231 because the carrier density of the region preferably becomes less than $1\times10^{18}/cm^3$, more preferably $1\times10^{14}/cm^3$ or less, so that the region becomes a high-resistance oxide semiconductor region. By forming the channel protective film 231, the oxide semiconductor film 225 can have a high-resistance oxide semiconductor region in vicinity of an interface with the channel protective film 231.

Further, the source electrode 226 and the drain electrode 227 are formed such that, after a conductive film for a source electrode and a drain electrode is formed over the island-shaped oxide semiconductor film 225 and the channel protective film 231, the conductive film is patterned by etching or the like. The conductive film for a source electrode and a drain electrode can be formed using a material and stacked layer structure similar to Embodiment 2.

In this embodiment, after a conductive film for a source electrode and a drain electrode are formed by a sputtering method using a molybdenum target, the conductive film is processed (patterned) by etching to have a desired shape, so that the source electrode 226 and the drain electrode 227 are formed over the island-shaped oxide semiconductor film 225.

The oxide insulating film 228 is formed to be in contact with the island-shaped oxide semiconductor film 225, the source electrode 226, and the drain electrode 227 by a sputtering method. The oxide insulating film 228 can be formed using the material and stacked layer structure similar to Embodiment 2, and a manufacturing method illustrated in Embodiment 2. Note that when the channel protective film 231 is formed, the oxide insulating film 228 is not necessarily formed.

Note that, such that moisture, hydrogen, or a hydroxy group included in the oxide semiconductor film 225 may be eliminated, after the source electrode 226 and the drain electrode 227 are formed and before or after the oxide insulating film 228 is formed, heat treatment may be performed again on the island-shaped oxide semiconductor film 225 under a reduced-pressure atmosphere, an atmosphere of the inert gas such as nitrogen and a rare gas, an oxygen atmosphere, or an ultra-dry air atmosphere (a moisture amount is 20 ppm (−55° C. by conversion into a dew point) or less, preferably 1 ppm or less, more preferably 10 ppb or less when measurement is performed by a dew point meter in a CRDS (cavity ring down laser spectroscopy) method). Conditions of the heat treatment can be referred to the description in Embodiment 2.

Figure 8C:
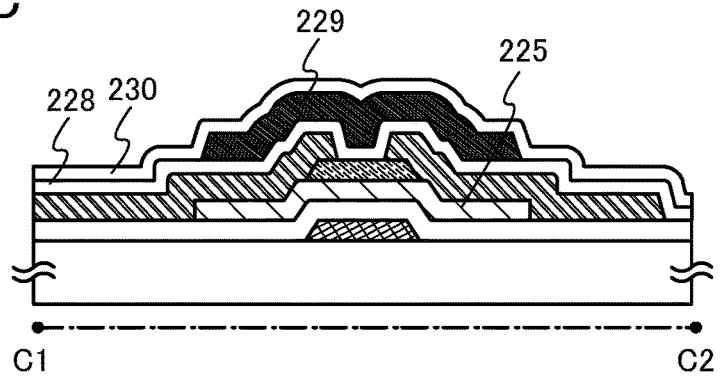

Note that as illustrated in FIG. 8C, the thin film transistor 221 may further have a conductive film 229 over the oxide insulating film 228. The similar material or stacked layer structure to the source electrode 226 and the drain electrode 227 can be used for the conductive film 229. The thickness of the conductive film 229 is 10 nm to 400 nm, preferably 100 nm to 200 nm. Then, a resist mask is formed by a photolithography method and the conductive film 229 is processed (patterned) to have a desired shape. The conductive film 229 is formed so as to overlap with a channel formation region of the oxide semiconductor film 225. The conductive film 229 may be in a floating state, that is, electrically insulated, or may be in a state in which a potential is supplied. In the latter case, to the conductive film 229, a potential having the same height as that of the gate electrode 223 may be applied or a fixed potential such as a ground potential may be supplied. By controlling the height of a potential supplied to the conductive film 229, the threshold voltage of the thin film transistor 221 can be controlled.

Further, in the case of forming the conductive film 229, an insulating film 230 is formed so as to cover the conductive film 229. For the insulating film 230, an inorganic insulating film such as a silicon oxide film and a silicon nitride oxide film, which includes an impurity such as moisture, hydrogen, and a hydroxy group as little as possible and blocks entry of such an impurity is used.

A thin film transistor using an oxide semiconductor has high mobility compared to a thin film transistor using amorphous silicon and uniform element characteristics similar to a thin film transistor using amorphous silicon. Accordingly, an oxide semiconductor can be used for not only a pixel portion but also a semiconductor element which forms a driver circuit with higher driving frequency than the pixel portion. A system-on-panel can be realized without process such as laser crystallization.

Moreover, even when a high-resistance metal material is used as a gate electrode, a source electrode, a drain electrode, or a conductive film over an oxide semiconductor insulating film in order to withstand a temperature of heat treatment, power consumption of the whole semiconductor display device can be reduced and reliability can be improved because pulses are sequentially input to scan lines included in pixels of rows performing a display and an image is displayed only on a specific area of the pixel portion.

This embodiment can be implemented in combination with any of the above embodiments.

Embodiment 5

In this embodiment, one example of a specific structure of a NOR circuit used for a decoder will be described.

Figure 9:
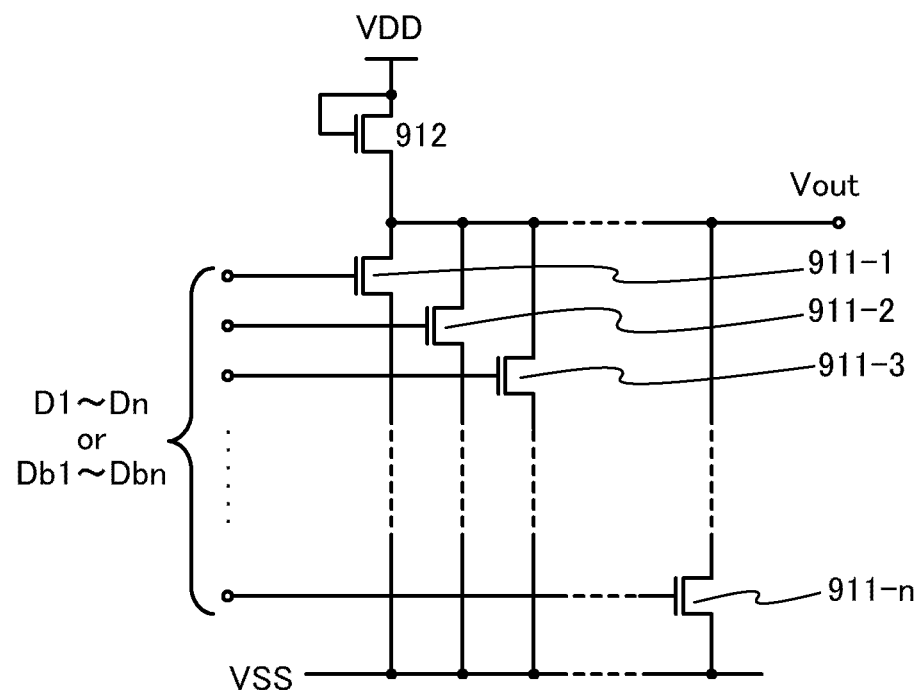
FIG. 9 is a circuit diagram illustrating a structure of a NOR circuit.

FIG. 9 illustrates one example of a circuit diagram of a NOR circuit. A NOR circuit in FIG. 9 is formed of n-channel thin film transistors.

Further, the NOR circuit illustrated in FIG. 9 includes a transistor 912 and n transistors 911-1 to 911-n, source electrodes and drain electrodes of which are connected to each other. Note that in this specification, the word "connection" means a connection by which an electrical signal is transmitted between two electrodes; that is, another conductive material such as a wiring may exist between electrodes.

Low level power supply voltage VSS is applied to the source electrodes of the n transistors 911-1 to 911-n. In addition, the drain electrodes of the n transistors 911-1 to 911-n are connected to a source electrode of the transistor 912 and the voltage of the source electrode is applied to a scan line as a voltage Vout. High level power supply voltage VDD is applied to a drain electrode and a gate electrode of the transistor 912.

To the NOR circuit, n bits of a control signal selected from the control signals D1 to Dn and Db1 to Dbn is input. When at least one of the control signals input to the NOR circuit is high level voltage (Hi), one of the transistors 911-1 to 911-n is turned on. Then, the low level power supply voltage VSS is applied to the scan line as the voltage Vout.

Then, when all of the control signals input to the NOR circuit become low level voltage (Lo), all of the transistors 911-1 to 911-n are turned off. Further, since the transistor 912 is on, the high level power supply voltage VDD is applied to the scan line as the voltage Vout.

Figure 10:
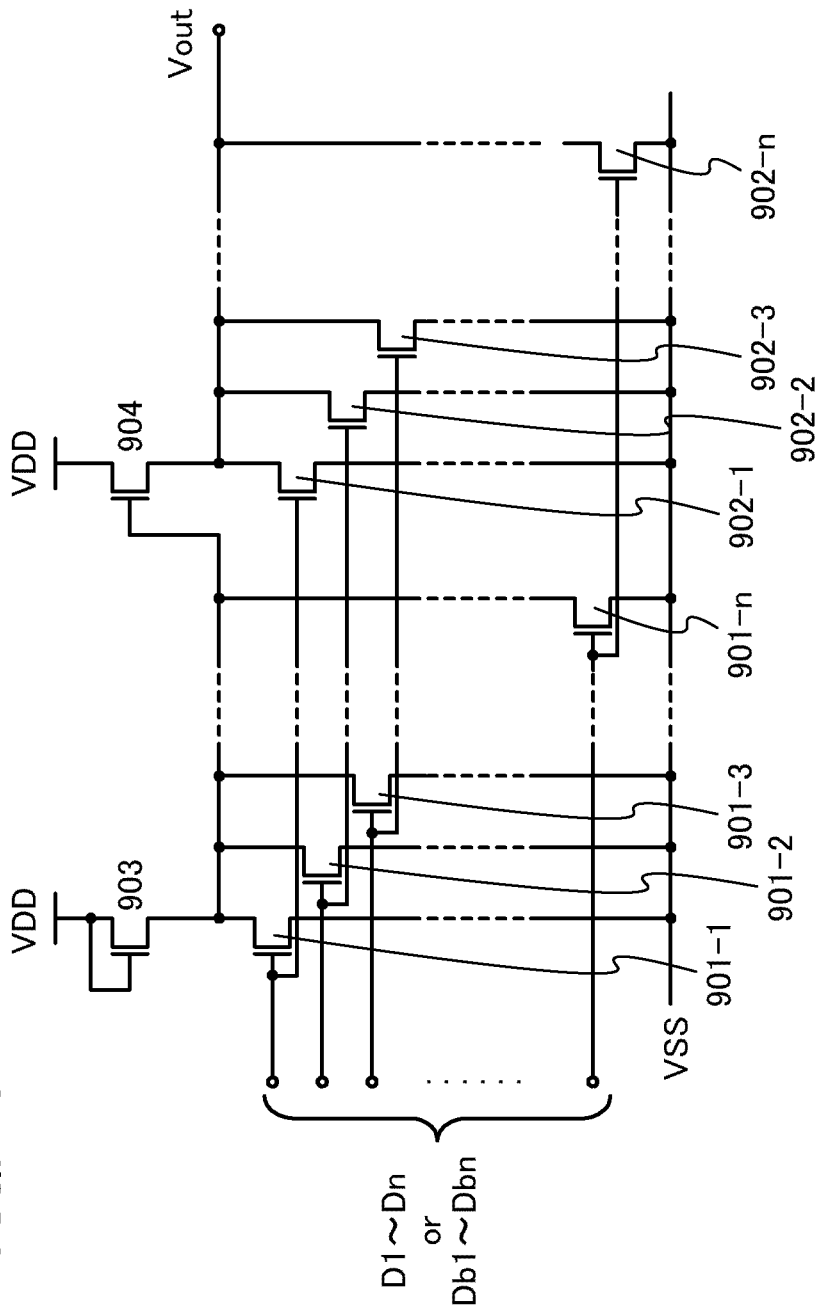
FIG. 10 is a circuit diagram illustrating a structure of a NOR circuit.

Next, FIG. 10 illustrates another example of a circuit diagram of a NOR circuit. The NOR circuit illustrated in FIG. 10 is formed of n-channel thin film transistors.

Further, the NOR circuit in FIG. 10 includes a transistor 903, a transistor 904, n transistors 901-1 to 901-n, source electrodes and drain electrodes of which are connected to each other, and n transistors 902-1 to 902-n, source electrodes and drain electrodes of which are connected to each other.

Gate electrodes of the transistors 901-1, 901-2, . . . , and 901-n are connected to gate electrodes of the transistors 902-1, 902-2, . . . , and 902-n, respectively. In other words, when i is defined as an arbitrary number selected from 1 to n, the gate electrode of the transistor 901-i and the gate electrode of the transistor 902-i are connected to each other. Further, the low level power supply voltage VSS is applied to source electrodes of the n transistors 901-1 to 901-n and source electrodes of the n transistors 902-1 to 902-n. Furthermore, drain electrodes of the n transistors 901-1 to 901-n are connected to a source electrode of the transistor 903 and a gate electrode of the transistor 904. The high level power supply voltage VDD is applied to a drain electrode and a gate electrode of the transistor 903 and a drain electrode of the transistor 904. A source electrode of the transistor 904 and drain electrodes of the n transistors 902-1 to 902-n are connected and the voltages of these electrodes is applied to a scan line as the voltage Vout.

To the NOR circuit, n bits of a control signal selected from the control signals D1 to Dn and Db1 to Dbn is input. When at least one of the control signals input to the NOR circuit is high level voltage (Hi), one of the transistors 901-1 to 901-n and one of the transistors 902-1 to 902-n are turned on. Accordingly, the low level power supply voltage VSS is applied to the scan line as the voltage Vout through the transistors turned on. Further, the low level power supply voltage VSS is applied to the source electrode of the transistor 903 and the gate electrode of the transistor 904 through the transistors turned on.

Then, when all of the control signals input to the NOR circuit become low level voltage (Lo), all of the transistors 901-1 to 901-n and all of the transistors 902-1 to 902-n are turned off. Further, since the transistor 903 is on, current starts flowing from the power supply voltage VDD to the transistor 903 and the voltages of the source electrode of the transistor 903 and the gate electrode of the transistor 904 start being increased.

Then, when the voltage between the gate electrode and the source electrode of the transistor 904, that is, the gate voltage of the transistor 904, exceeds "the power supply voltage VSS+the threshold voltage Vth of the transistor 904", the transistor 904 is turned on. When the transistor 904 is turned on, current starts flowing from the power supply voltage VDD through the transistor 904 and the voltage Vout which is the voltage of the source electrode of the transistor 904 starts being increased such that the voltage Vout follows the voltage of the source electrode of the transistor 903 and the voltage of the gate electrode of the transistor 904.

Then, when the voltage of the source electrode of the transistor 903 becomes close to "the power supply voltage VDD—the threshold voltage Vth of the transistor 903" as time passes, the transistor 903 is automatically turned off. Further, since all of the transistors 902-1 to 902-n are off, the gate electrode of the transistor 904 becomes floating state. Therefore, voltage difference between the gate electrode and the source electrode of the transistor 904 is held by a gate capacitance of the transistor 904.

While, since the transistor 904 keeps being on even after the transistor 903 is turned off, the voltage Vout which is the voltage of the source electrode of the transistor 904 keeps being increased. Therefore, as the voltage Vout is increased, the voltage of the gate electrode of the transistor 904 keeps being increased while voltage difference between the gate electrode and the source electrode of the transistor 904 is held. Then, when the voltage of the source electrode of the transistor 904 and the voltage Vout comes close to the power supply voltage VDD, the voltage Vout stops increasing and held at the voltage VDD.

In this manner, by making the gate electrode of the transistor 904 be in a floating state as in the NOR circuit in FIG. 10, bootstrap operation can make the voltage Vout equal to the voltage VDD regardless of the threshold voltage of the transistors 903 and 904.

Note that since the NOR circuit illustrated in FIG. 10 performs the bootstrap operation, the gate electrode of the transistor 904 needs to be in a floating state as described above. Then, when the gate electrode of the transistor 904 is made to be in the floating state, the larger the amount of charges which leaks from the gate electrode becomes, the lower the potential of the gate electrode becomes because the increase of the potential at the gate electrode by the bootstrap operation is suppressed. In particular, in the NOR circuit illustrated in FIG. 10, the transistors 901-1 to 901-n are connected to the gate electrode of the transistor 904, where the number of transistors connected to the gate electrode of the transistor 904 is large. Therefore, the potential of the gate electrode of the transistor 904 tends to be lowered by leakage of charges from the transistors.

Thus, transistors, channel formation regions of which include an oxide semiconductor, are used for the transistor included in the NOR circuit illustrated in FIG. 10. Since off current of a transistor, a channel formation region of which includes an oxide semiconductor, is low, the amount of charges which leak from the gate electrode of the transistor 904 can be suppressed small. As the result, when bootstrap operation is performed, the potential of the gate electrode of the transistor 904 can be high. That is, the gate voltage of the transistor 904 can be made high, whereby rising time of the voltage Vout can be shorter. In addition, amplitude of the voltage of the control signals D1 to Dn and the control signals Db1 to Db2 can be made small, whereby power consumption of the NOR circuit can be reduced.

This embodiment can be implemented in combination with any of the above embodiments.

Embodiment 6

Figure 11A:
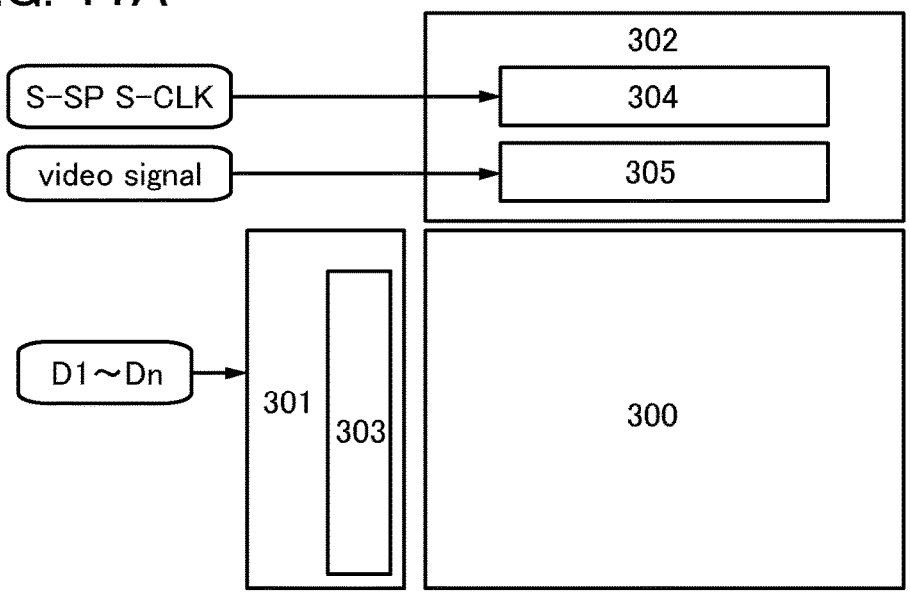
FIGS. 11A and 11B are block diagrams of semiconductor devices.
Figure 11B:
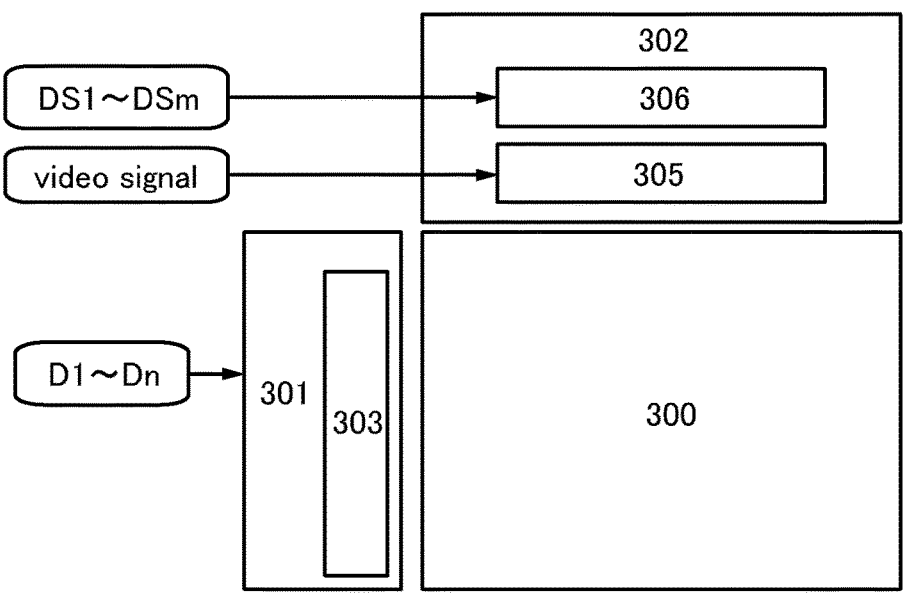

In this embodiment, examples of a general structure of a semiconductor display device of the present invention will be described. FIGS. 11A and 11B illustrate block diagrams of a semiconductor display device of the present invention.

The semiconductor display device illustrated in FIG. 11A has a pixel portion 300 including a plurality of pixels each of which includes a display element and a thin film transistor, a scan line driver circuit 301 which selects pixels for each row, and a signal line driver circuit 302 which controls input of a video signal to the pixels at the selected row.

In FIG. 11A, the scan line driver circuit 301 includes a decoder 303. The operation of the scan line driver circuit 301 is controlled by n bits of control signals D1 to Dn input to the scan line driver circuit 301. Specifically, by combination of each bit value of the control signals D1 to Dn, selection signals having pulses can be sequentially input from the decoder 303 to the pixel portion 300 through scan lines. Further, by combination of each bit value of the control signals D1 to Dn, the scan line driver circuit 301 can operate such that pulses are sequentially input only to pixels of rows performing display and a pulse is not input to pixels of rows at which display is not performed.

Further, the signal line driver circuit 302 includes at least a shift register 304 and a sampling circuit 305. When a driving signal which controls operation of the shift register 304, specifically, a clock signal S-CLK and a start pulse signal S-SP, is input to the shift register 304, in accordance with these driving signals, a timing signal pulses of which are sequentially shifted, is generated and input to the sampling circuit 305. In the sampling circuit 305, a video signal for one line period input to the signal line driver circuit 302 is sampled in accordance with the input timing signal and then the sampled video signals are sequentially input to the pixel portion 300 through signal lines.

While, the scan line driver circuit 301 generates a selection signal having a pulse in the decoder 303 in accordance with the input control signals D1 to Dn, and inputs the selection signal to each of scan lines. A video signal is input through a signal line to a pixel having a scan line selected by a pulse.

Note that the time until video signal writing into all of the signal lines is completed is called a line period. In practice, the line period may include a period in which a horizontal retrace interval is added to the line period.

Note that video signals may be sampled sequentially in corresponding pixels, or pixels in one line may be divided into several groups and video signals may be sampled in pixels corresponding to each group at the same time.

Note that in FIG. 11A, the pixel portion 300 is directly connected to a next stage of the sampling circuit 305; however, the present invention is not limited to this structure. A circuit that performs signal processing on the video signal output from the sampling circuit 305 can be provided at the stage prior to the pixel portion 300. Examples of a circuit which processes signal include a buffer which can shape a waveform and the like.

Further, a timing signal for sampling a video signal is generated by using the shift register 304 in FIG. 11A, however the present invention is not limited to this structure. For example, as illustrated in FIG. 11B, the timing signal may be generated by using a decoder 306 instead of the shift register 304. In this case, control signals DS1 to DSm for controlling operation of the decoder 306 are input to the signal line driver circuit 302 as driving signal.

By using the decoder 306, a video signal can be input to signal lines included in pixels in part of the area from the signal line driver circuit 302 after sampling is performed. When a frame frequency is constant, in the case where a video signal is input to the pixels in part of a selected row, the driving frequency of the signal line driver circuit 302 can be suppressed lower and power consumption can be reduced by comparison with the case where a video signal is input to all of the pixels in a selected row.

Note that a semiconductor display device illustrated in FIG. 11A or 11B may be manufactured in system-on-panel design, in which the pixel portion 300 and the scan line driver circuit 301 and/or the signal line driver circuit 302 are formed over one substrate. With system-on-panel design, the number of pins for connection between the pixel portion 300 and a driver circuit such as the scan line driver circuit 301 or the signal line driver circuit 302 can be reduced, so that decrease of the yield caused by a defect in connection between the driver circuit and the pixel portion, low mechanical strength in a connection portion using a pin, or the like can be prevented. Furthermore, by realization of a system-on-panel, the size of a display device is reduced, and cost is reduced because of decrease in the number of assembly steps and inspection steps. In the case of using system-on-panel design, power source voltage and each kind of signal such as a control signal, a video signal, and a driving signal are supplied from a controller to the pixel portion 300, the scan line driver circuit 301, or the signal line driver circuit 302 through a connection portion such as FPC (Flexible Printed Circuit).

Further, a semiconductor display device in FIGS. 11A and 11B is not limited to a system-on-panel. A circuit with low driving frequency such as an analog switching circuit used for the sampling circuit of the signal line driver circuit 302 and the scan line driver circuit 301 may be formed over one substrate with the pixel portion 300. In addition, the shift register 304 or the decoder 306 with relatively high driving frequency, which is a circuit except the circuit with low driving frequency, may be formed over another substrate. In this case, a circuit with high driving frequency can be formed using a semiconductor element including a single crystal semiconductor, and the pixel portion 300 and a circuit with low driving frequency can be formed using a semiconductor element including an oxide semiconductor. In this manner, by partly employing system-on-panel design, the decrease of yield caused by the above-described connection defect, low mechanical strength on connection portion using a pin, or the like can be prevented, or reduction in cost by reduction in the number of assembly steps and inspection steps can be realized, which is advantages which can be obtained by a system-on-panel design to some extent. Further, performance of a circuit with high driving frequency can be enhanced by comparison with the case where all of the pixel portion 300, the scan line driver circuit 301, and the signal line driver circuit 302 are formed over one substrate as a system-on-panel, and a pixel portion with a wide area, which is difficult to be realized in the case of using a single crystal semiconductor, can be formed.

This embodiment can be implemented in combination with any of the above embodiments.

Embodiment 7

In this embodiment, one example of a specific structure of a pixel portion included in a semiconductor display device according to one embodiment of the present invention will be described.

Figure 12:
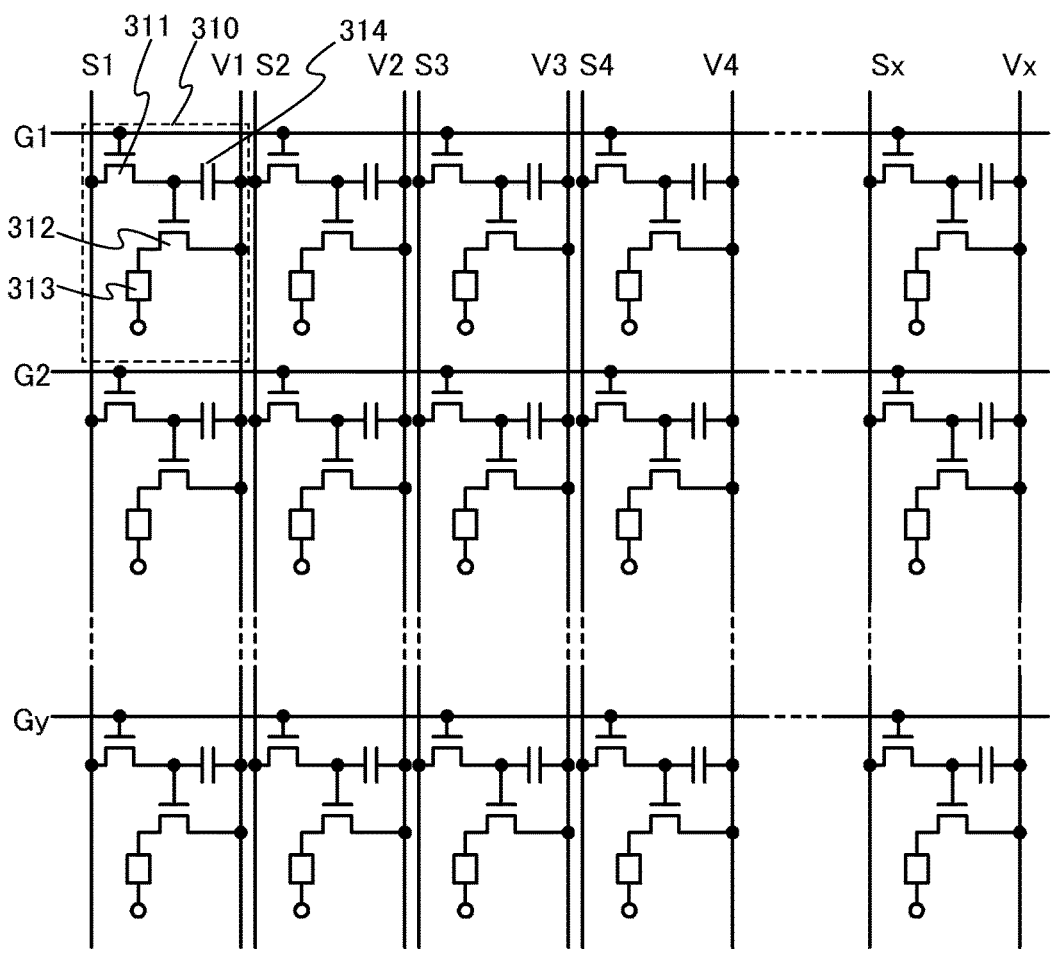
FIG. 12 is a circuit diagram of a pixel portion.

FIG. 12 is a circuit diagram of a pixel portion in a light-emitting device provided with a light-emitting element typified by an organic light-emitting element (OLED) in each pixel. The pixel portion in FIG. 12 includes the plurality of signal lines S1 to Sx, a plurality of power supply lines V1 to Vx, and the plurality of scan lines G1 to Gy. Each of a plurality of pixels 310 has at least one of the plurality of signal lines S1 to Sx, one of the plurality of power supply lines V1 to Vx, and one of the plurality of scan lines G1 to Gy.

Each pixel 310 includes a light-emitting element 313, a switching transistor 311 for controlling input of video signals to the pixel 310, and a driving transistor 312 for controlling the amount of current supplied to the light-emitting element 313. A gate electrode of the switching transistor 311 is connected to one of the scan lines G1 to Gy. One of a source electrode and a drain electrode of the switching transistor 311 is connected to one of the signal lines S1 to Sx. The other of the source electrode and the drain electrode of the switching transistor 311 is connected to a gate electrode of the driving transistor 312. One of a source electrode and a drain electrode of the driving transistor 312 is connected to one of the power supply lines V1 to Vx. The other of the source electrode and the drain electrode of the driving transistor 312 is connected to a pixel electrode of the light-emitting element 313. Further, the pixel 310 includes a storage capacitor 314. One of electrodes of the storage capacitor 314 is connected to one of the power supply lines V1 to Vx. The other of the electrodes of the storage capacitor 314 is connected to the gate electrode of the driving transistor 312.

The light-emitting element 313 includes an anode, a cathode, and an electroluminescent layer provided between the anode and the cathode. Any one of the anode and the cathode is used as a pixel electrode and the other of the anode and the cathode is used as a counter electrode. When the anode is connected to the source electrode or the drain electrode of the driving transistor 312, the anode is a pixel electrode while the cathode is a counter electrode. On the other hand, when the cathode is connected to the source electrode or the drain electrode of the driving transistor 312, the cathode is the pixel electrode while the anode is the counter electrode.

A voltage is applied to each of the counter electrodes of the light-emitting elements 313 and each of the power supply lines from the power source. The value of the voltage difference between the common electrode and the power supply line is kept such that a forward bias voltage is applied to the light-emitting element when the driving transistor 312 is turned on.

By a pulse of a selection signal input to the scan line, when the switching transistor 311 is turned on, the voltage of the video signal input to a signal line is applied to the gate electrode of the driving transistor 312. The gate voltage of the driving transistor 312 (voltage difference between a gate electrode and a source electrode) is determined in accordance with the voltage of this input video signal. Then, drain current of the driving transistor 312 which flows in accordance with the gate voltage is supplied to a light-emitting element 313, so that the light-emitting element 313 emits light.

In the case where an image is displayed in a specific area, selection signals each having a pulse are sequentially input only to scan lines included in pixels of the area. Then, a video signal having an image data is input only to signal lines included in pixels of the area, so that an image can be displayed in the specific area.

Note that a light-emitting device may be driven by time ratio grayscale driving in which the grayscale level is displayed by controlling time in which a pixel displays white for one frame period, or by analog grayscale driving using a video signal having an analog image data.

Note that the structure of the pixel 310 shown in FIG. 12 is just one example of the pixel included in the semiconductor display device of the present invention, and the present invention is not limited to the structure of the pixel shown in FIG. 12.

Figure 13:
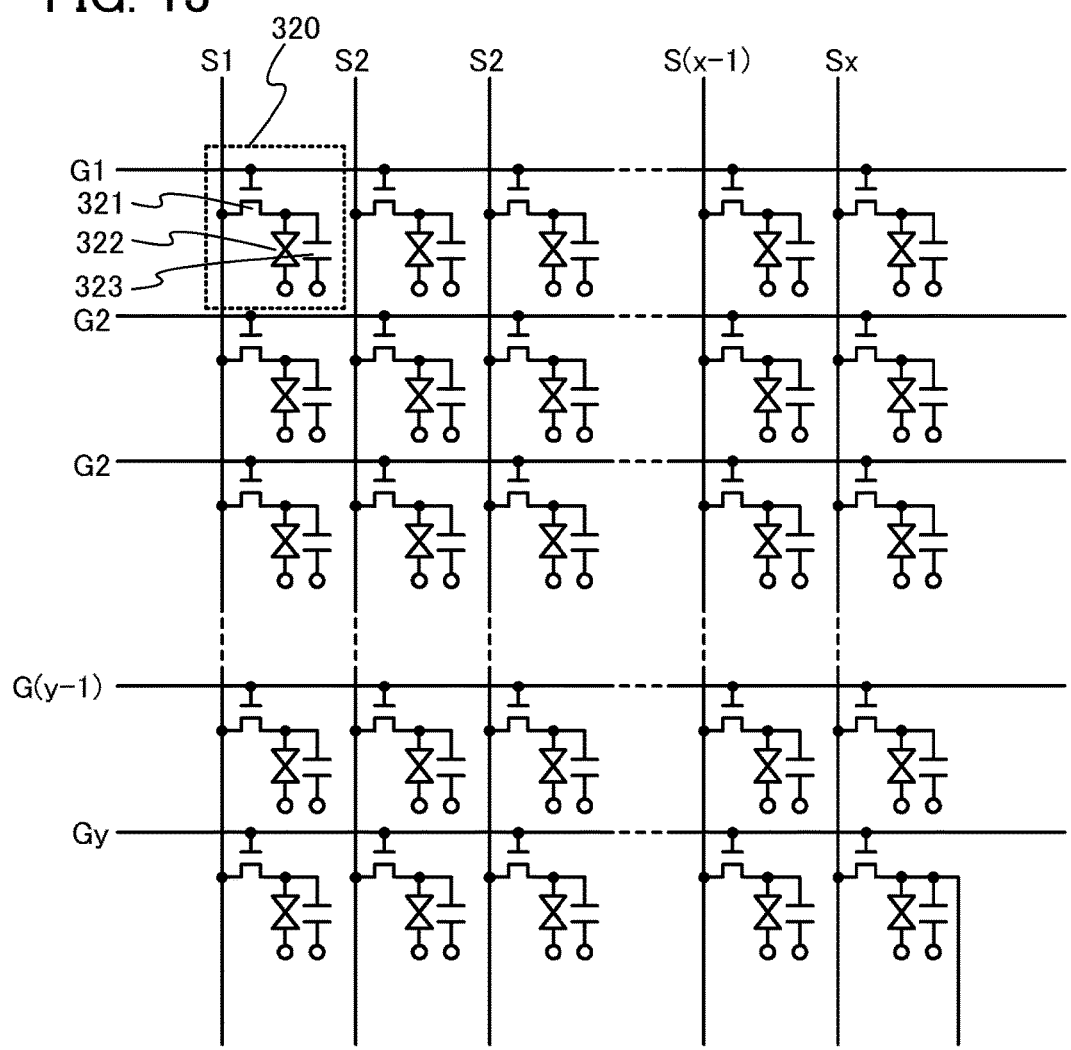
FIG. 13 is a circuit diagram of a pixel portion.

FIG. 13 is a circuit diagram of a pixel portion of a liquid crystal display device provided with a liquid crystal element in each pixel. The pixel portion illustrated in FIG. 13 includes the plurality of signal lines S1 to Sx and the plurality of scan lines G1 to Gy. Each of a plurality of pixels 320 has at least one of the plurality of signal lines S1 to Sx and one of the plurality of scan lines G1 to Gy.

The pixel 320 includes the transistor 321 which functions as a switching element, a liquid crystal element 322, and a storage capacitor 323. A gate electrode of the transistor 321 is connected to one of the scan lines G1 to Gy. One of a source electrode and a drain electrode of the transistor 321 is connected to one of the signal lines S1 to Sx. The other of the source electrode and the drain electrode of the transistor 321 is connected to the pixel electrode of the liquid crystal element 322. The liquid crystal element 322 includes a pixel electrode, a counter electrode, and a liquid crystal which is sandwiched between the pixel electrode and the counter electrode. The storage capacitor 323 is provided in order to hold voltage applied between the pixel electrode and the counter electrode of the liquid crystal element 322. Specifically, one of a pair of electrodes included in the storage capacitor 323 is connected to the pixel electrode of the liquid crystal element 322, and constant voltage is applied to the other of the pair of electrodes included in the storage capacitor 323.

The scan lines G1 to Gy are sequentially selected, whereby the transistors 321 in the pixels 320 having the selected scan lines are turned on. Then, voltage of a video signal input to the signal lines S1 to Sx is applied to the pixel electrode of the liquid crystal element 322 through the transistor 321 at an on state. In the liquid crystal element 322, alignment of a liquid crystal molecule is changed when voltage is applied and the refractive index of a liquid crystal is accordingly changed. Therefore, since transmittance rate is changed in accordance with the voltage of the video signal, grayscale can be expressed by the liquid crystal element 322.

In the case where an image is displayed in a specific area, a selection signal having a pulse is sequentially input only to scan lines included in pixels of the area. Then, a video signal having an image data is input only to signal lines included in pixels of the area, so that an image can be displayed in the specific area.

Note that the structure of the pixel 320 illustrated in FIG. 13 is just one example of the pixel included in the semiconductor display device of the present invention, and the present invention is not limited to the structure of the pixel illustrated in FIG. 13.

Embodiment 8

In this embodiment, a semiconductor display device referred to as electronic paper or digital paper, which is a semiconductor display device of the present invention will be described.

A display element which can control grayscale by voltage application and has a memory property is used for electronic paper. Specifically, in the display element used for electronic paper, a display element such as a non-aqueous electrophoretic display element; a display element using a PDLC (polymer dispersed liquid crystal) method, in which liquid crystal droplets are dispersed in a high polymer material that is provided between two electrodes; a display element which includes chiral nematic liquid crystal or cholesteric liquid crystal between two electrodes; a display element which includes charged fine particles between two electrodes and employs a particle-moving method by which the charged fine particles are moved through fine particles by using an electric field; or the like can be used. Further, a non-aqueous electrophoretic display element may be a display element having a dispersion liquid, in which charged fine particles are dispersed, is sandwiched between two electrodes; a display element having a dispersion liquid, in which charged fine particles are dispersed, is included over two electrodes with an insulating film interposed therebetween; a display element in which twisting balls having hemispheres of two different colors which are charged differently are dispersed in a solvent between two electrodes; a display element which includes microcapsules, in which a plurality of charged fine particles are dispersed in a solution, between two electrodes; or the like.

Figure 14A:
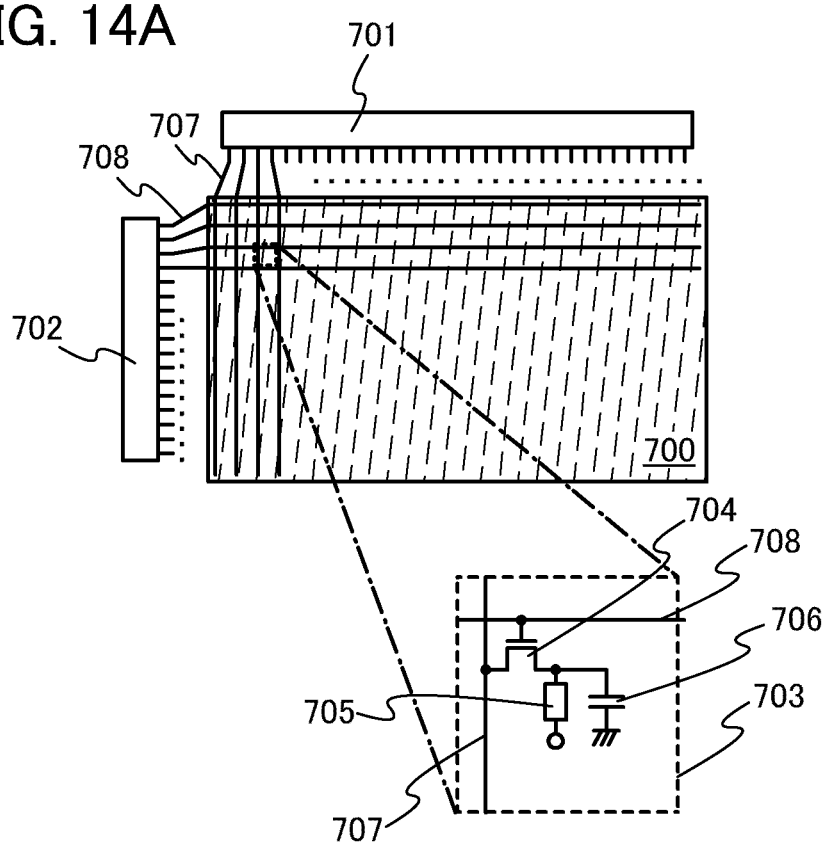
FIG. 14A is a top view of electronic paper and FIG. 14B is a cross-sectional view of the electronic paper.

FIG. 14A illustrates a top view of a pixel portion 700, a signal line driver circuit 701, and a scan line driver circuit 702 of electronic paper.

The pixel portion 700 includes a plurality of pixels 703. Further, a plurality of signal lines 707 is led into the pixel portion 700 from the signal line driver circuit 701. A plurality of scan lines 708 is led into the pixel portion 700 from the scan line driver circuit 702.

The pixel 703 includes a transistor 704, a display element 705, and a storage capacitor 706. A gate electrode of the transistor 704 is connected to one of the scan lines 708. Further, one of a source electrode and a drain electrode of the transistor 704 is connected to one of the signal lines 707 and the other of the source electrode and the drain electrode of the transistor 704 is connected to a pixel electrode of the display element 705.

Note that in FIG. 14A, the storage capacitor 706 is connected in parallel to the display element 705 such that a voltage applied between the pixel electrode and the counter electrode of the display element 705 is held; however, in the case where the memory property of the display element 705 is sufficiently high enough to maintain display, the storage capacitor 706 is not necessarily provided.

Note that in FIG. 14A, although an active-matrix pixel portion structure in which one transistor which serves as a switching element is provided in each pixel is described in this embodiment, electronic paper according to one embodiment of the present invention is not limited to this structure. A plurality of transistors may be provided in each pixel. Further, other than transistors and a capacitor, elements such as resistors, coils, or the like may also be provided.

Figure 14B:
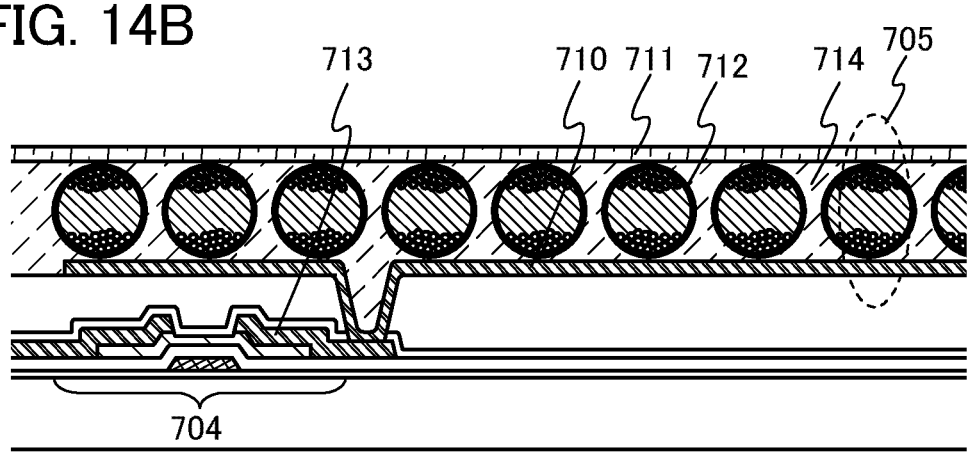

Electronic paper of an electrophoretic system including microcapsules is given as one example in FIG. 14B. FIG. 14B illustrates a cross-sectional view of the display element 705 provided for each pixel 703.

The display element 705 includes a pixel electrode 710, a counter electrode 711, and microcapsules 712 to which voltage is applied by the pixel electrode 710 and the counter electrode 711. One of the source electrode and the drain electrode of a transistor 704 is connected to the pixel electrode 710.

In the microcapsules 712, positively charged white pigment such as titanium oxide and negatively charged black pigment such as carbon black are sealed together with a dispersion medium such as oil. A voltage is applied between the pixel electrode and the counter electrode in accordance with the voltage of a video signal applied to the pixel electrode 710, and black pigment and white pigment are drawn to a positive electrode side and a negative electrode side, respectively. Therefore, the grayscale can be displayed.

Further, in FIG. 14B, the microcapsules 712 are fixed by light-transmitting resin 714 between the pixel electrode 710 and the counter electrode 711. However, the present invention is not limited to this structure. A space formed by the microcapsules 712, the pixel electrode 710, and the counter electrode 711 may be filled with gas such as inert gas or air. Note that in this case, the microcapsules 712 is preferably fixed to both or one of the pixel electrode 710 and the counter electrode 711 by an adhesive or the like.

In addition, the number of the microcapsules 712 included in the display element 705 is not necessarily plural as in FIG. 14B. One display element 705 may include a plurality of microcapsules 712 or a plurality of display elements 705 may include one microcapsule 712. For example, two display elements 705 share one microcapsule 712, and positive voltage and negative voltage are applied to the pixel electrode 710 included in one of the display elements 705 and the pixel electrode 710 included in the other of the display elements 705, respectively. In this case, in the microcapsule 712 in a region overlapping with the pixel electrode 710 to which positive voltage is applied, black pigment is drawn to the pixel electrode 710 side and white pigment is drawn to the counter electrode 711 side. On the other hand, in the microcapsule 712 in a region overlapping with the pixel electrode 710 to which negative voltage is applied, white pigment is drawn to the pixel electrode 710 side and black pigment is drawn to the counter electrode 711 side.

Next, the above electronic paper of the electrophoretic system is given as one example to describe a specific driving method of electronic paper.

Operation of the electronic paper can be separately described in accordance with the following periods: an initialization period, a writing period, and a holding period.

First, the grayscale levels of each of the pixels of a pixel portion are temporarily set to be equal in the initialization period before a display image is switched in order to initialize display elements. Initialization of the gray scale level prevents a residual image from remaining. Specifically, in an electrophoretic system, displayed grayscale level is adjusted by the microcapsule 712 included in the display element 705 such that the display of each pixel is white or black.

In this embodiment, an operation of initialization in the case where after an initialization video signal for displaying black is input to a pixel, an initialization video signal for displaying white is input to a pixel will be described. For example, when the electronic paper of an electrophoretic system in which display of an image is performed with respect to the counter electrode 711 side, voltage is applied to the display element 705 such that black pigment in the microcapsule 712 moves to the counter electrode 711 side and white pigment in the microcapsule 712 moves to the pixel electrode 710 side. Next, voltage is applied to the display element 705 such that white pigment in the microcapsule 712 moves to the counter electrode 711 side and black pigment in the microcapsule 712 moves to the pixel electrode 710 side.

Further, when an initialization video signal is input to the pixel only once, white pigment and black pigment in the microcapsule 712 do not finish moving completely depending on the grayscale level displayed before the initialization period, thus it is afraid that difference between displayed grayscale levels of pixels occurs even after the initialization period ends. Therefore, it is preferable that negative voltage −Vp with respect to common voltage Vcom be applied to the pixel electrode 710 a plurality of times so that black is displayed and positive voltage Vp with respect to the common voltage Vcom be applied to the pixel electrode 710 a plurality of times so that white is displayed.

Note that when grayscale levels displayed before the initialization period differ depending on display elements of each of the pixels, the minimum necessary number of times for inputting an initialization video signal also varies. Accordingly, the number of times for inputting an initialization video signal may be changed between pixels in accordance with a grayscale level displayed before the initialization period. In this case, the common voltage Vcom is preferably input to a pixel to which the initialization video signal is not necessarily input.

Note that in order for the voltage Vp or the voltage −Vp which is an initialization video signal to be applied to the pixel electrode 710 a plurality of times, the following operation sequence is performed a plurality of times: the initialization video signal is input to a pixel including a scan line in a period during which a pulse of a selection signal is supplied to the scan line. The voltage Vp or the voltage −Vp of an initialization video signal is applied to the pixel electrode 710 a plurality of times, whereby movement of white pigment and black pigment in the microcapsule 712 converges in order to prevent difference of grayscale levels between pixels from occurring. Thus, initialization of a pixel of the pixel portion can be performed.

Note that in each pixel in the initialization period, the case where black is displayed after white as well as the case where white is displayed after black is acceptable. Alternatively, in each pixel in the initialization period, the case where black is displayed after white is displayed; and further, after that white is displayed is also acceptable.

Further, as for all of the pixels in the pixel portion, timing of starting the initialization period is not necessarily the same. For example, timing of starting the initialization period may be different for every pixel, or every pixels belonging to the same line, or the like.

Next in the writing period, a video signal having image data is input to the pixel.

In the case where an image is displayed on the entire pixel portion, in one frame period, a selection signal in which a pulse of voltage is shifted sequentially input to all of the scan lines. Then, in one line period in which a pulse appears in a selection signal, a video signal having image data is input to all of the signal line.

White pigment and black pigment in the microcapsule 712 are moved to the pixel electrode 710 side and the counter electrode 711 in accordance with the voltage of the video signal applied to the pixel electrode 710, so that the display element 705 displays a grayscale.

Note that also in the writing period, the voltage of a video signal is preferably applied to the pixel electrode 710 a plurality of times as in the initialization period. Accordingly, the following operation sequence is performed a plurality of times: the video signal is input to a pixel including a scan line in a period during which a pulse of a selection signal is supplied to the scan line.

Next, in the holding period, a selection signal is not input to a scan line or a video signal is not input to a signal line after the common voltage Vcom is input to all of the pixels through signal lines. Accordingly, the positions of white pigment and black pigment in the microcapsule 712 included in the display element 705 is maintained unless positive or negative voltage is applied between the pixel electrode 710 and the counter electrode 711, so that the grayscale level displayed on the display element 705 is held. Therefore, an image written in the writing period is maintained in the holding period.

Figure 16A:
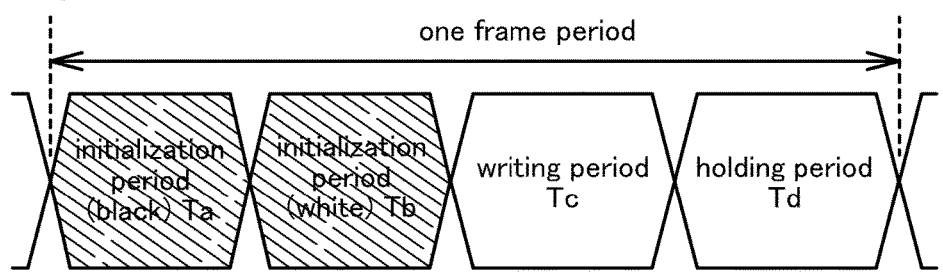
FIGS. 16A and 16B are schematic views each illustrating the order of an initialization period, a writing period, and a holding period.
Figure 16B:
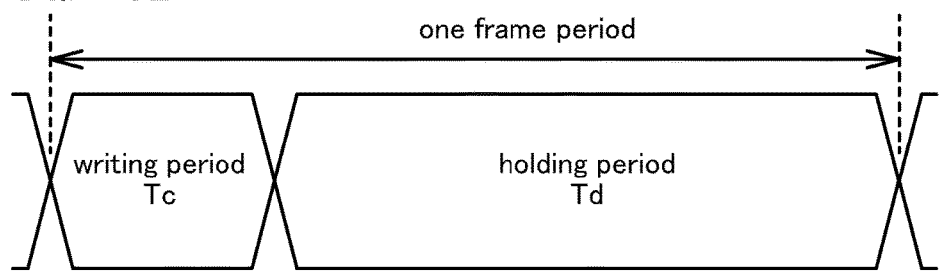

Note that in the case where an image is displayed on part of the area, the initialization period may be omitted among the initialization period, the writing period, and the holding period. The order of appearance in one frame period of an initialization period Ta in which black is displayed, an initialization period Tb in which white is displayed, a writing period Tc, and a holding period Td is schematically illustrated in FIG. 16A. The order of the initialization period Ta and the initialization period Tb can be reversed. Further, the order of appearance of the writing period Tc and the holding period Td is schematically illustrated in FIG. 16B in the case where the initialization periods are omitted when an image is displayed on part of the area. The initialization period is omitted or the number of times of initialization is reduced, so that the number of times of scanning is reduced. Therefore, power consumption of a scan line driver circuit can be suppressed.

In the case where an image is displayed on part of the area, in the writing period, a selection signal, voltage pulse of which is sequentially shifted is input only to scan lines included in pixels of the area, and a selection signal having voltage with no pulse, that is flat voltage, is input to the other scan lines. Then, in one line period in which a pulse appears in a selection signal, a video signal having image data is input only to signal lines included in pixels of the area and a video signal which does not contribute to display of an image is input to the other signal lines.

Note that also in the case where an image is displayed on part of the area, in the writing period, a voltage of a video signal is preferably applied to the pixel electrode 710 a plurality of times. Accordingly, the following operation sequence is performed a plurality of times: the video signal is input to a pixel including a scan line in a period during which a pulse of a selection signal is supplied to the scan line.

Figure 15A:
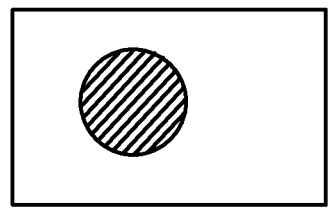
FIGS. 15A and 15B are diagrams illustrating examples of an image displayed at part of area.
Figure 15B:
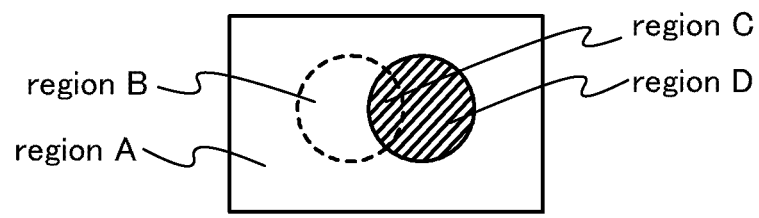

Further, since the display element 705 used for electronic paper has good memory properties, it is possible that in the case where initialization is not performed, voltage is not applied to the display element of a pixel in which the grayscale level is not changed for continuous frame periods. For example, in the case where after an image of a black circle in a white background is displayed as illustrated in FIG. 15A, an image which is different from the image in FIG. 15A in the position of a black circle is displayed as illustrated in FIG. 15B, the grayscale which the display element 705 displays is the following: the grayscale level is not changed from white in a region A, the grayscale level is changed from black to white in a region B, the grayscale level is not changed from black in a region C, and the grayscale level is changed from white to black in a region D. FIG. 17 illustrates timing charts of voltages applied to the pixel electrodes 710 in the regions A to D and voltage of a selection signal input to a scan line.

In the region A, since the grayscale level is not changed even when an image is switched, the common voltage Vcom is applied to the pixel electrode 710. The common voltage Vcom is also applied to the counter electrode 711, so that the grayscale level of a display element of the region A is not changed and white is continuously displayed. In the region B, since the grayscale level is changed from black to white when an image is switched, the voltage −Vp is applied to the pixel electrode 710. Therefore, black is displayed by a display element of the region B. In the region C, since the grayscale level is not changed even when an image is switched, the common voltage Vcom is applied to the pixel electrode 710. The common voltage Vcom is also applied to the counter electrode 711, so that the grayscale level of a display element of the region C is not changed and black is continuously displayed. In the region D, since the grayscale level is changed from white to black when an image is switched, the voltage Vp is applied to the pixel electrode 710. Therefore, white is displayed by a display element of the region D.

In this manner, in the case where voltage is not applied to a display element of a pixel in which the grayscale level is not changed for a continuous frame period, power consumption of a signal line driver circuit can be suppressed.

This embodiment can be implemented in combination with any of the above mentioned embodiments.

Embodiment 9

In this embodiment, a structure of a signal line driver circuit including an n-channel transistor will be described.

Figure 18A:
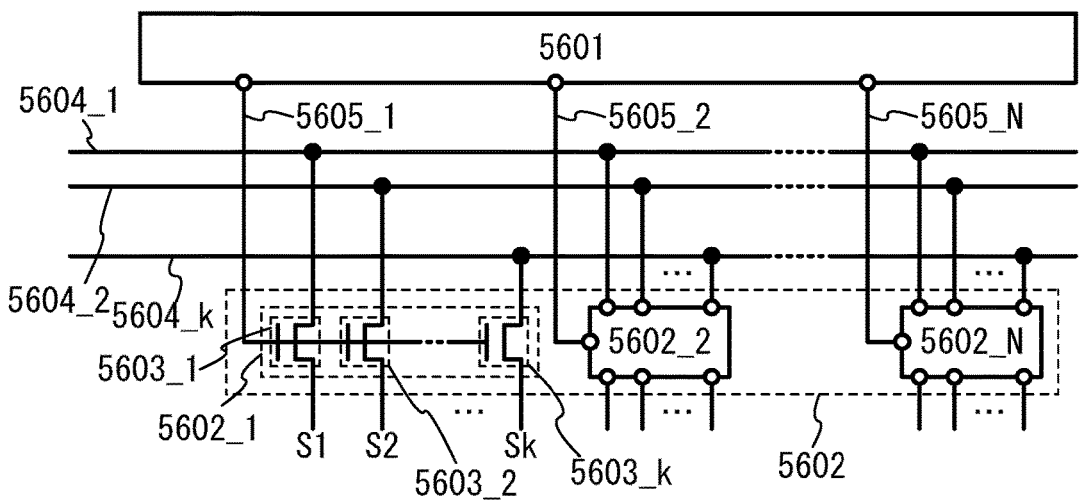
FIG. 18A illustrates a structure of a signal line driver circuit and FIG. 18B is a timing chart of signals.

The signal line driver circuit illustrated in FIG. 18A includes a shift register 5601 and a sampling circuit 5602. The sampling circuit 5602 includes a plurality of switching circuits 5602_1 to 5602_N (N is a natural number). The switching circuits 5602_1 to 5602_N each include a plurality of n-channel transistors 5603_1 to 5603_$k$ ($k$ is a natural number).

A connection relation in the signal line driver circuit is described taking the switching circuit 5602_1 as an example. Note that hereinafter, for a source electrode and a drain electrode included in a transistor, one of the source electrode and the drain electrode will be described as a first terminal and the other of the source electrode and the drain electrode will be described as a second terminal.

First terminals of the transistors 5603_1 to 5603_$k$ are connected to wirings 5604_1 to 5604_$k$, respectively. A video signal is input to each of the wirings 5604_1 to 5604_$k$. Second terminals of the thin film transistors 5603_1 to 5603_$k$ are connected to signal lines S1 to Sk, respectively. Gate electrodes of the thin film transistors 5603_1 to 5603_$k$ are connected to a wiring 5605_1.

The shift register 5601 has a function of sequentially selecting the switching circuits 5602_1 to 5602_N by sequentially outputting a timing signal having a high level voltage (H level) to wirings 5605_1 to 5605_N.

By switching of the transistors 5603_1 to 5603_N, the switching circuit 5602_1 has a function of controlling conduction between the wirings 5604_1 to 5604_$k$ and the signal lines S1 to Sk (conduction between the first terminal and the second terminal), namely a function of controlling whether or not to supply the potentials of the wirings 5604_1 to 5604_$k$ to the signal lines S1 to Sk.

Figure 18B:
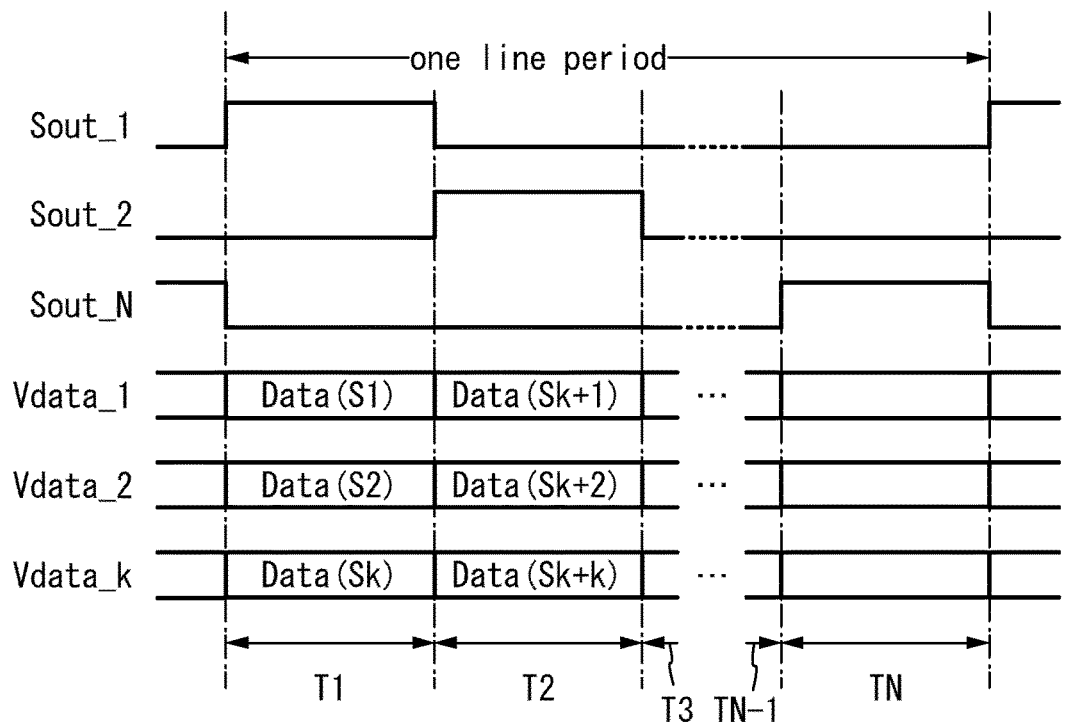

Next, operation of the signal line driver circuit illustrated in FIG. 18A is described with reference to a timing chart of FIG. 18B. FIG. 18B illustrates a timing chart of timing signals Sout_1, Sout_2 and Sout_N respectively input to the wirings 5605_1, 5605_2 and 5605_N and video signals Vdata_1, Vdata_2 and Vdata_k respectively input to the wirings 5604_1, 5604_2 and 5604_$k$ from the shift register 5601, as one example.

Note that one operation period of the signal line driver circuit corresponds to one line period in the display device. FIG. 18B illustrates one example of the case where one line period is divided into periods T1 to TN. Each of the periods T1 to TN is a period for writing a video signal to a pixel in a selected row.

In the periods T1 to TN, the shift register 5601 sequentially outputs an H level timing signal to the wirings 5605_1 to 5605_N. For example, in the period T1, the shift register 5601 outputs an H level signal to the wiring 5605_1. Then, the thin film transistors 5603_1 to 5603_$k$ included in the switching circuit 5602_1 are turned on, so that the wirings 5604_1 to 5604_$k$ and the signal lines S1 to Sk are brought into conduction. At this time, Data (S1) to Data (Sk) are input to the wirings 5604_1 to 5604_$k$, respectively. The Data (S1) to Data (Sk) are input to pixels in the first to k-th columns in the selected row through the transistors 5603_1 to 5603_$k$. Thus, in the periods T1 to TN, video signals are sequentially written to the pixels in the selected row by k columns.

As thus described, by writing video signals to pixels by a plurality of columns at a time, the number of video signals or the number of wirings can be reduced. As a result, the number of connections with an external circuit such as a controller can be reduced. Further, by writing video signals to pixels by a plurality of columns at a time, writing time can be extended and insufficient of writing of video signals can be prevented.

Next, one mode of the shift register used for the signal line driver circuit is described with reference to FIGS. 19A and 19B and FIGS. 20A and 20B.

Figure 19A:
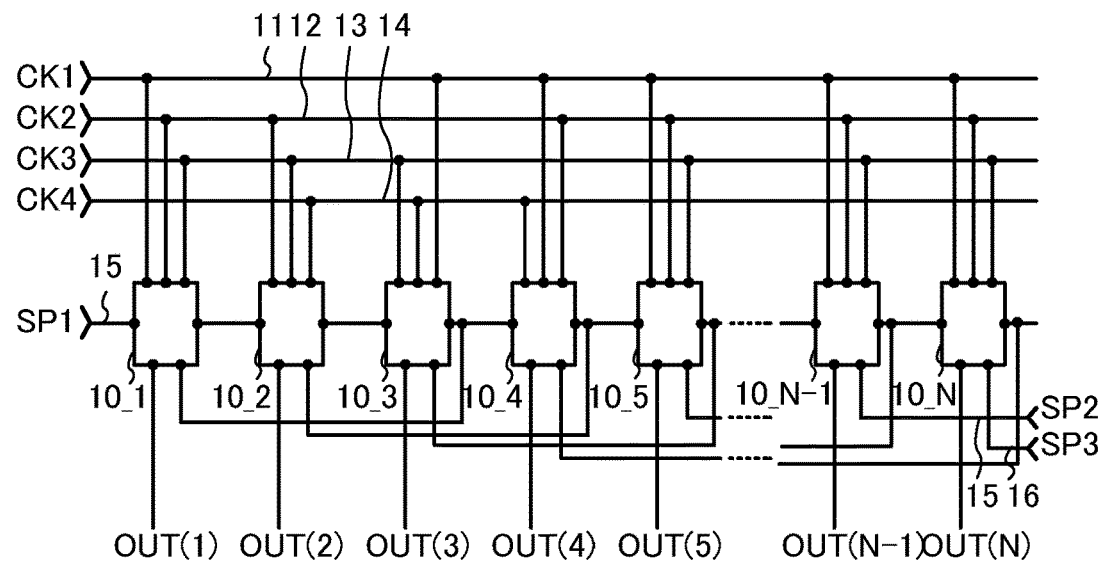
FIGS. 19A and 19B are circuit diagrams showing a structure of a shift register.

The shift register includes first to N-th pulse output circuits 10_1 to 10_N (N is a natural number which is 3 or more) (see FIG. 19A). A first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. Further, a start pulse SP1 (a first start pulse) from a fifth wiring 15 is input to the first pulse output circuit 10_1. Furthermore, a signal from the pulse output circuit of one prior stage (such a signal is referred to as a preceding-stage signal OUT(n−1)) (n is a natural number which is 2 or more) is input to the n-th pulse output circuit 10_$n$ of the second and subsequent stages (n is a natural number which is 2 or more and N or less). Additionally, a signal from the third pulse output circuit 10_3, which is two subsequent stages from the first pulse output circuit 10_1, is input to the first pulse output circuit 10_1. Similarly, a signal (referred to as a subsequent stage signal OUT (n+2)) from the (n+2)-th pulse output circuit 10_(n+2), which is two subsequent stages from an N-th pulse output circuit 10_$n$, is input to the N-th pulse output circuit 10_$n$ of the 2nd stage and the subsequent stages. Accordingly, a first output signal (OUT (1) to OUT(N)) to be input to a pulse output circuit of the subsequent stage and/or the two prior stages, and a second output signal (OUT(1) (SR) to OUT(N) electrically connected to a separate wiring or the like are output from the pulse output circuit in each stage (e.g. first pulse output circuit 10_1 to pulse output circuit 10_N). Note that since subsequent stage signals OUT(n+2) are not input in the last two stages of the shift register, a separate structure in which a second start pulse SP2 and a third start pulse SP3 are respectively input to the last two stages may be employed, for example, as illustrated in FIG. 19A.

Note that a clock signal (CK) alternates between an H level and an L level (low level voltage) at regular intervals. Here, first to fourth clock signals (CK1) to (CK4) are sequentially delayed by a ¼ period. In this embodiment, by using the first to fourth clock signals (CK1) to (CK4), control or the like of driving a pulse output circuit is performed.

A first input terminal 21, a second input terminal 22, and a third input terminal 23 are electrically connected to any of the first to fourth wirings 11 to 14. For example, in FIG. 19A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 19B:
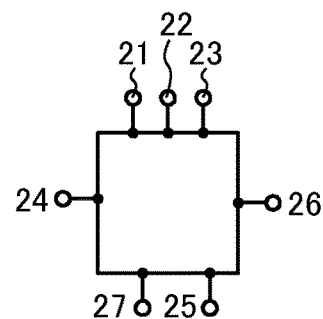

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 19B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; the latter-stage signal OUT (3) is input to the fifth input terminal 25; the first output signal OUT(1) (SR) is output from the first output terminal 26; and the second output signal OUT(1) is output from the second output terminal 27.

Figure 20A:
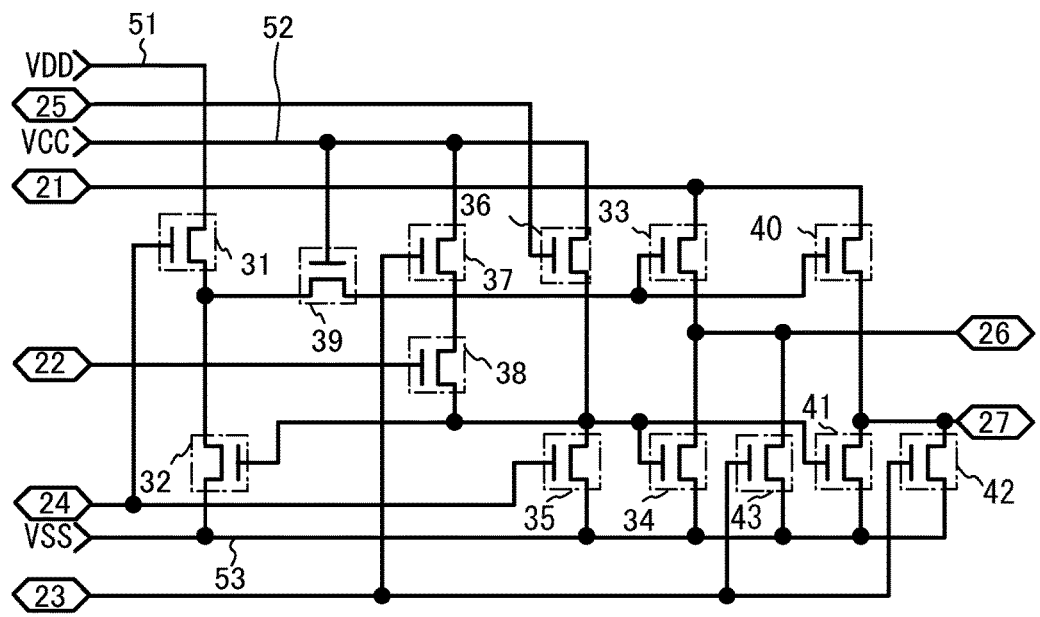
FIG. 20A illustrates a structure of a pulse output circuit and FIG. 20B is a timing chart illustrating operation of a shift register.

Next, FIG. 20A illustrates one example of a specific circuit structure of a pulse output circuit.

The pulse output circuits each include first to thirteenth transistors 31 to 43 (see FIG. 20A). Further, signals or power supply potentials are supplied to the first to thirteenth transistors 31 to 43 from a power supply line 51 which supplies a first high power supply potential VDD, a power supply line 52 which supplies a second high power supply potential VCC, and a power supply line 53 which supplies a low power supply potential VSS, in addition to the above-described first to fifth input terminals 21 to 25, the first output terminal 26, and the second output terminal 27. Here, the relation of the power supply potentials of the power supply lines in FIG. 20A is as follows: a first power supply potential VDD is higher than a second power supply potential VCC, and the second power supply potential VCC is higher than a third power supply potential VSS. Note that the first to fourth clock signals (CK1) to (CK4) are signals which become H level signals and L level signals repeatedly at regular intervals. The potential is VDD when the clock signal is at the H level, and the potential is VSS when the clock signal is at the L level. By making the potential VDD of the power supply line 51 higher than the power supply potential VCC of the power supply line 52, a potential applied to a gate electrode of a transistor can be kept low, shift in the threshold voltage of the transistor can be reduced, and deterioration of the transistor can be suppressed without an adverse effect on the operation of the transistor.

In FIG. 20A, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and the gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 20A, a point where the gate electrode of the third transistor 33, the gate electrode of the tenth transistor 40, and the second terminal of the ninth transistor 39 are connected is referred to as a node A. Further, the point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 20A).

Figure 20B:
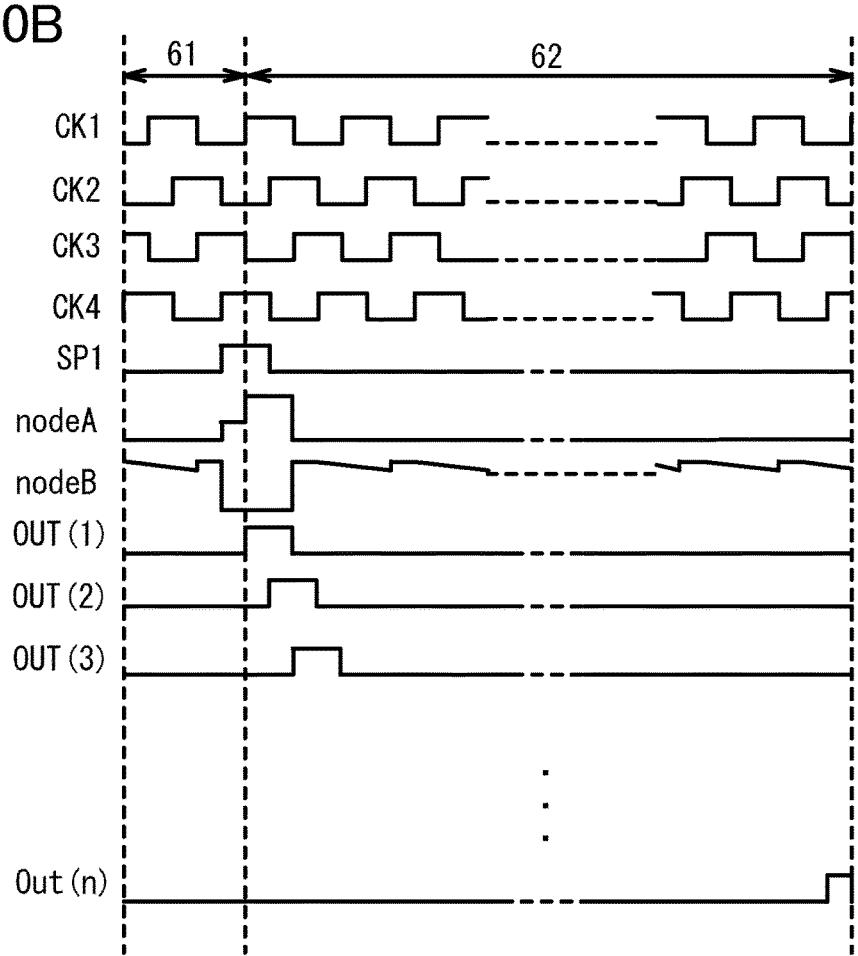

FIG. 20B illustrates a timing chart of the shift register including a plurality of pulse output circuits illustrated in FIG. 20A.

Note that the provision of the ninth transistor 39 in which the second power supply potential VCC is applied to the gate electrode as illustrated in FIG. 20A has the following advantages before and after bootstrap operation.

Without the provision of the ninth transistor 39 having the gate electrode to which the second potential VCC is applied, if the potential of the node A is raised by the bootstrap operation, the potential of the source electrode which is the second terminal of the first transistor 31 rises to a value higher than the first power supply potential VDD. Then, the first terminal of the first transistor 31, that is, the terminal on the power supply line 51 side, becomes to serve as a source electrode of the first transistor 31. Therefore, in the first transistor 31, high bias voltage is applied and thus significant stress is applied between the gate electrode and the source electrode and between the gate electrode and the drain electrode, which might cause deterioration of the transistor. By providing of the ninth transistor 39 having the gate electrode to which the second power supply potential VCC is applied, the potential of the node A is raised by the bootstrap operation, but at the same time, an increase in the potential of the second terminal of the first transistor 31 can be prevented. In other words, provision of the ninth transistor 39 can lower the level of negative bias voltage applied between the gate electrode and the source electrode of the first transistor 31. Thus, the circuit configuration in this embodiment can reduce a negative bias voltage applied between the gate electrode and the source electrode of the first transistor 31, so that deterioration of the first transistor 31 due to stress can be suppressed.

Note that the ninth transistor 39 can be provided anywhere as long as the first terminal and the second terminal of the ninth transistor 39 are connected to the second terminal of the first transistor 31 and the gate electrode of the third transistor 33, respectively. Note that when the shift register including a plurality of pulse output circuits in this embodiment is included in a signal line driver circuit having a larger number of stages than a scan line driver circuit, the ninth transistor 39 can be eliminated, which leads to reduction in the number of transistors.

Note that when an oxide semiconductor is used for semiconductor layers of the first to thirteenth transistors 31 to 43, the amount of the off-state current of the transistors can be reduced and the amount of the on-state current and field-effect mobility can be increased. Further, since the rate of degradation of the transistors can be reduced, malfunctions of a circuit can be reduced. Furthermore, the degree of deterioration of the transistor using oxide semiconductor caused by applying high potential to the gate electrode is small by comparison with the transistor using amorphous silicon. Therefore, even when the first power supply potential VDD is supplied to a power supply line to which the second power supply potential VCC is supplied, a similar operation can be performed, and since the number of power supply lines which are provided in a circuit can be reduced, the circuit can be miniaturized.

Note that a similar effect is obtained even when the connection relation is changed such that a clock signal that is supplied to the gate electrodes of the seventh transistor 37 from the third input terminal 23 and a clock signal that is supplied to the gate electrodes of the eighth transistor 38 from the second input terminal 22 are supplied from the second input terminal 22 and the third input terminal 23, respectively. At this time, in the shift register illustrated in FIG. 20A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the decrease in the potential of the node B, which is caused by a decrease in the potentials of the second input terminal 22 and the third input terminal 23, is caused twice by a decrease in the potential of the gate electrode of the seventh transistor 37 and a decrease in the potential of the gate electrode of the eighth transistor 38. Alternatively, if the shift register illustrated in FIG. 20A is driven so that the state where the seventh transistor 37 and the eighth transistor 38 are both on is changed through the state where the seventh transistor 37 is on and the eighth transistor 38 is off to the state where the seventh transistor 37 is off and the eighth transistor 38 is off like a period illustrated in FIG. 20B, potential reduction at the node B, which is caused by potential reduction of the second input terminal 22 and the third input terminal 23, is caused only once due to the potential reduction of the gate electrode of the eighth transistor 38. Therefore, the connection relation, in which the clock signal CK3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the change in the potential of the node B can be reduced, whereby the noise can be decreased.

In this way, in a period during which the potentials of the first output terminal 26 and the second output terminal 27 are held at the L level, the H level signal is regularly supplied to the node B; therefore, malfunction of a pulse output circuit can be suppressed.

This embodiment can be implemented in combination with any of the above mentioned embodiments.

Embodiment 10

In this embodiment, a manufacturing method of a semiconductor display device according to one embodiment of the present invention will be described with reference to FIGS. 21A to 21C, FIGS. 22A to 22C, FIGS. 23A and 23B, FIG. 24, FIG. 25, and FIG. 26.

In FIG. 21A, it is possible to use any of a variety of glass substrates that are used in the electronics industry such as aluminosilicate glass, barium borosilicate glass, and aluminoborosilicate glass for a light-transmitting substrate 400. Further, a substrate formed from a flexible synthetic resin, such as plastic or the like, generally tends to have a low upper temperature limit, but can be used as the substrate 400 as long as the substrate can withstand processing temperatures in the later manufacturing process. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

Next, a conductive layer is formed entirely over a surface of the substrate 400, and then a first photolithography step is performed. A resist mask is formed and unnecessary portions are removed by etching, so that wirings and an electrode (a gate wiring including a gate electrode 401, a capacitor wiring 408, and a first terminal 421) are formed. At this time, the etching is performed so that at least end portions of the gate electrode 401 are tapered.

As a material for the conductive film, a single layer or a stacked layer using one or more of a metal material such as molybdenum, titanium, chromium, tantalum, tungsten, neodymium, or scandium, or an alloy material which includes any of these metal materials as a main component, or nitride of these metals is used. Note that aluminum or copper can be used as the above metal material if aluminum or copper can withstand a temperature of heat treatment performed in a later process.

For example, as a conductive material with a two layer structure, it is preferable to stack a titanium nitride film and a molybdenum film. As a three-layer structure, it is preferable to stack a tungsten film or a tungsten nitride film, an alloy film of aluminum and silicon or an alloy film of aluminum and titanium, and a titanium nitride film or a titanium film.

Next, a gate insulating film 402 is formed over surfaces of the gate electrode 401, the capacitor wiring 408, the first terminal 421 as illustrated in FIG. 21B. The gate insulating film 402 is formed to have a thickness of 50 nm to 250 nm by a sputtering method, a PCVD method, or the like.

For example, as the gate insulating film 402, a silicon oxide film is formed to have a thickness of 100 nm by a sputtering method. Needless to say, the gate insulating film 402 is not limited to such a silicon oxide film and may be formed to have a single-layer structure or a stacked-layer structure using another insulating film such as a silicon oxynitride film, a silicon nitride film, an aluminum oxide film, or a tantalum oxide film.

Next, an oxide semiconductor film 403 (an In—Ga—Zn—O-based non-single-crystal film) is formed over the gate insulating film 402. An In—Ga—Zn—O-based non-single-crystal film is formed without exposure to air after plasma treatment, which is advantageous in that dust or moisture is not attached to an interface between the gate insulating film 402 and the oxide semiconductor film 403. Here, the oxide semiconductor film 403 is formed under an oxygen atmosphere, an argon atmosphere, or an atmosphere including argon and oxygen using an oxide semiconductor target having a diameter of 8 inches and including In, Ga, and Zn (an In—Ga—Zn—O-based oxide semiconductor target ($In_2O_3$: $Ga_2O_3$: ZnO=1:1:1)), with the distance between the substrate 400 and the target is set to 170 mm, under a pressure of 0.4 Pa, and with a direct current (DC) power source of 0.5 kW. Note that a pulse direct current (DC) power source is preferable because dust occurred by the deposition can be reduced and the film thickness can be uniform. The thickness of the In—Ga—Zn—O-based non-single-crystal film is set to 5 nm to 200 nm. In this embodiment, an In—Ga—Zn—O-based non-single-crystal film is formed to a thickness of 50 nm.

An oxide material having semiconductor characteristics as described above may be used for the oxide semiconductor film 403 for forming a channel formation region.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there is a sputtering apparatus provided with a magnet system inside the chamber and used for a magnetron sputtering method, and a sputtering apparatus using an ECR sputtering method in which plasma generated with the use of microwaves is used without using glow discharge.

Furthermore, as a film formation method with a sputtering method, there is also a reactive sputtering method in which a target substance and a sputtering gas component are chemically reacted with each other during film formation to form a thin compound film thereof, and a bias sputtering method in which voltage is also applied to a substrate during film formation.

Next, as illustrated in FIG. 21C, a second photolithography step is performed. A resist mask is formed and the oxide semiconductor film 403 is etched. For example, unnecessary portions are removed by wet etching using a mixed solution of phosphoric acid, acetic acid, and nitric acid, so that an island-shaped oxide semiconductor film 404 is formed so as to overlap with the gate electrode 401. Note that etching here is not limited to wet etching, and dry etching may also be performed.

As an etching gas for dry etching, a gas including chlorine (a chlorine-based gas such as chlorine ($Cl_2$), boron chloride ($BCl_3$), silicon chloride ($SiCl_4$), or carbon tetrachloride ($CCl_4$)) is preferably used.

Alternatively, a gas including fluorine (a fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As a dry etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, or the like such as ITO-07N (produced by KANTO CHEMICAL CO., INC.) may be used.

Furthermore, the etchant after the wet etching is removed together with the etched material by cleaning. The waste liquid of the etchant including the material etched off may be purified and the material may be reused. When a material such as indium included in the oxide semiconductor film is collected from the waste liquid after the etching and reused, the resources can be efficiently used and the cost can be reduced.

In order to obtain a desired shape by etching, the etching conditions (such as an etchant, etching time, and temperature) are adjusted as appropriate depending on the material.

Further, as illustrated in FIG. 22A, heat treatment is performed on the oxide semiconductor film 404 under a reduced-pressure atmosphere, an atmosphere of an inert gas such as nitrogen and a rare gas, an oxygen atmosphere, or an ultra-dry air atmosphere (a moisture amount is 20 ppm (−55° C. by conversion into a dew point) or less, preferably 1 ppm or less, more preferably 10 ppb or less when measurement is performed by a dew point meter in a CRDS (cavity ring down laser spectroscopy) method). In such a manner, the oxide semiconductor film 405 is formed. Specifically, heat treatment is performed on the island-shaped oxide semiconductor film 404 in a temperature range of 400° C. or higher and 700° C. or lower, preferably 450° C. or higher and 650° C. or lower under an inert gas atmosphere (e.g., nitrogen, helium, neon, and argon). After that slow cooling is performed on the island-shaped oxide semiconductor film 404 under an inert gas atmosphere to be in a temperature range of room temperature or higher and lower than 100° C. Moisture, hydrogen, or a hydroxy group included in the oxide semiconductor film 404 is eliminated by performing heat treatment on the oxide semiconductor film 404 under the above atmosphere. Accordingly, high on-state current can be obtained by a thin film transistor a channel formation region of which is formed using the oxide semiconductor film 405.

As the heat treatment, a heating method using an electric furnace, an instantaneous heating method such as a GRTA (gas rapid thermal annealing) method using a heated gas or an LRTA (lamp rapid thermal anneal) method using lamp light can be employed. For example, in the case of performing heat treatment using an electric furnace, the temperature rise characteristics is preferably set at higher than or equal to 0.1° C./min and lower than or equal to 20° C./min and the temperature drop characteristics is preferably set at 0.1° C./min or higher and 15° C./min or lower.

Note that it is preferable that in the heat treatment, moisture, hydrogen, or the like be not contained in nitrogen or a rare gas such as helium, neon, or argon. Alternatively, it is preferable that nitrogen or a rare gas such as helium, neon, or argon introduced into an apparatus for heat treatment have purity of 6N (99.9999%) or more, preferably, 7N (99.99999%) or more; that is, an impurity concentration is set to 1 ppm or lower, preferably, 0.1 ppm or lower.

After heat treatment, the island-shaped oxide semiconductor film 405 may be crystallized partly or entirely.

Note that after heat treatment is performed on the oxide semiconductor film 405 under an oxygen atmosphere, impurities such as moisture included in the oxide semiconductor film 405 can be removed. In addition, the heat treatment is performed under an oxygen atmosphere in order that the oxide semiconductor film 405 may include excessive oxygen, whereby resistance thereof can be increased. The heat treatment under an oxygen atmosphere is performed at a temperature at which a metal having a low melting point such as Zn included in the oxide semiconductor is not easily evaporated, for example, 100° C. or higher and 350° C. or lower, preferably 150° C. or higher and 250° C. or lower. It is preferable that an oxygen gas used for the heat treatment under an oxygen atmosphere does not include moisture, hydrogen, or the like. Alternatively, the purity of the oxygen gas which is introduced into the heat treatment apparatus is preferably 6N (99.9999%) or more preferably 7N (99.99999%) or more (that is, the impurity concentration in the oxygen is 1 ppm or less, or preferably 0.1 ppm or less).

Figure 24:
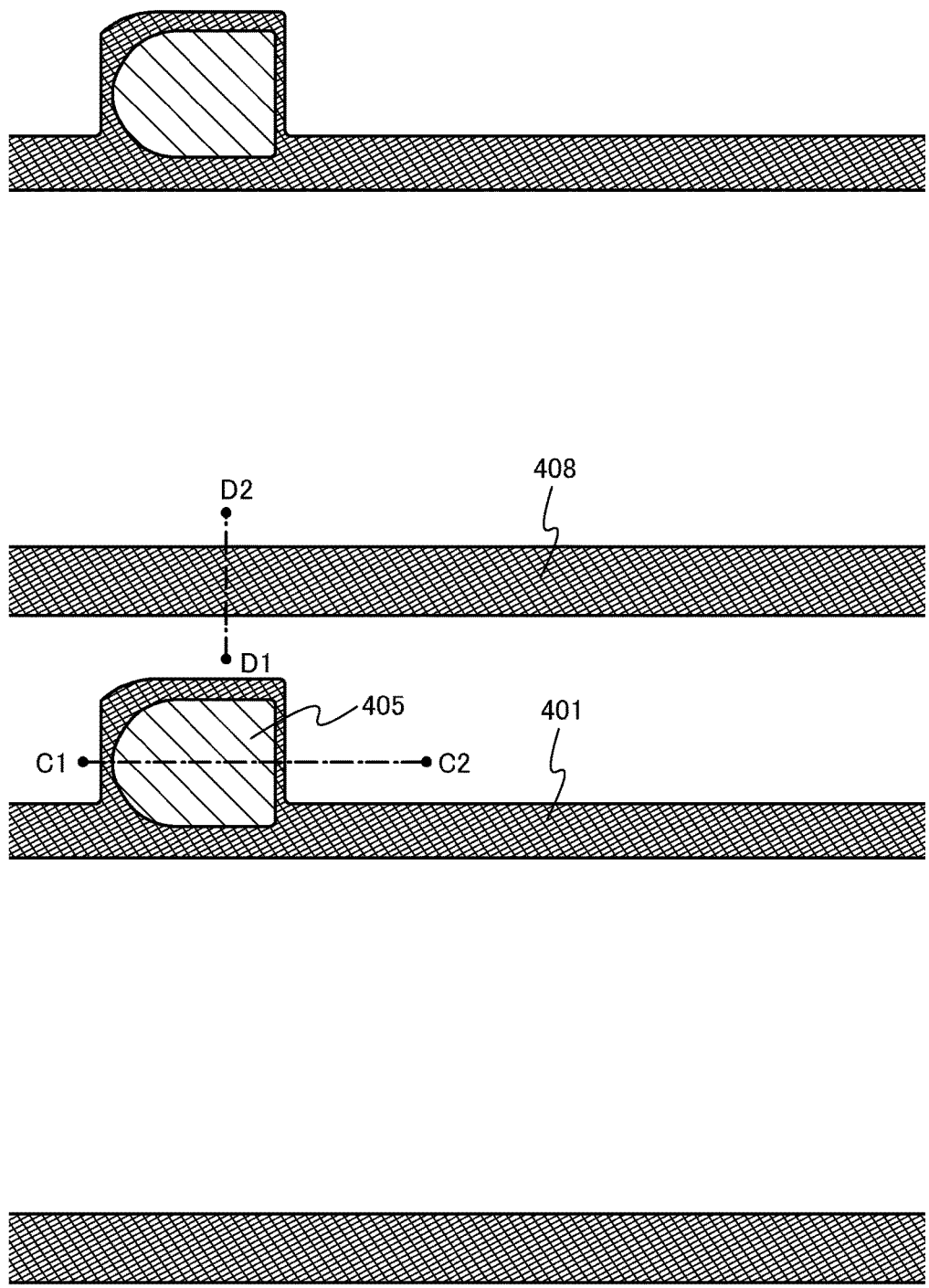
FIG. 24 is a view illustrating the manufacturing method of the semiconductor device.

Cross-sectional views taken along dashed lines C1-C2 and D1-D2 in FIG. 22A correspond to cross-sectional views taken along dashed lines C1-C2 and D1-D2 in a plan view illustrated in FIG. 24, respectively.

Next, as illustrated in FIG. 22B, a conductive film 406 which includes a metal material over the oxide semiconductor film 405 is formed by a sputtering method or a vacuum evaporation method. As a material of the conductive film 406, a material such as an element selected from aluminum, chromium, tantalum, titanium, manganese, magnesium, molybdenum, tungsten, zirconium, beryllium, and yttrium; an alloy including one or more of these elements as a component; or the like can be used. Note that in the case where heat treatment is performed after the formation of the conductive film 406, the conductive film 406 preferably has heat resistance enough to withstand the heat treatment. In the case of performing heat treatment after the formation of the conductive film 406, the conductive film 406 is formed using the low-resistant conductive material having heat resistance in combination with aluminum because aluminum alone has problems of low heat resistance, being easily corroded, and the like. As the low-resistant conductive material having heat resistance which is combined with aluminum, the following material is preferably used: an element selected from titanium, tantalum, tungsten, molybdenum, chromium, neodymium, or scandium; an alloy including one or more of these elements as a component; a nitride including any of these elements as a component; or the like.

Next, as illustrated in FIG. 22C, a third photolithography step is performed. A resist mask is formed and unnecessary portions are removed by etching, so that a source electrode 407a, a drain electrode 407b, and a second terminal 420 are formed. Wet etching or dry etching is used as an etching method at this time. For example, when an aluminum film or an aluminum-alloy film is used as the conductive film 406, wet etching using a mixed solution of phosphoric acid, acetic acid, and nitric acid can be performed. Alternatively, by wet etching using an ammonia peroxide mixture, the conductive film 406 may be etched to form the source electrode 407a and the drain electrode 407b.

In this etching step, an exposed region of the oxide semiconductor film 405 is partly etched in some cases. In this case, the oxide semiconductor film 409 has a region with small thickness which is provided between the source electrode 407a and the drain electrode 407b.

In the third photolithography step, the second terminal 420 which is formed using the same material as the source electrode 407a and the drain electrode 407b is left in the terminal portion. Note that the second terminal 420 is electrically connected to a source wiring (a source wiring including the source electrode 407a or the drain electrode 407b).

Further, when a resist mask which is formed using a multi-grayscale mask and has regions with a plurality of thicknesses (for example, two different thicknesses) is used, the number of resist masks can be reduced, resulting in simplified process and lower costs.

Next, a resist mask is removed, and heat treatment is performed again on the island-shaped oxide semiconductor film 409 under a reduced-pressure atmosphere, an inert atmosphere such as nitrogen and a rare gas, an oxygen atmosphere, or an ultra-dry air atmosphere (a moisture amount is 20 ppm (−55° C. by conversion into dew point) or less, preferably 1 ppm or less, more preferably 10 ppb or less when measurement is performed by a dew point meter in a CRDS (cavity ring down laser spectroscopy) method) so that moisture, hydrogen, or a hydroxy group included in the oxide semiconductor film 409 may be eliminated. In consideration of the heat resistance of the source electrode 407a and the drain electrode 407b, the heat treatment after the source electrode 407a and the drain electrode 407b are formed is preferably performed at a lower temperature than that performed before the source electrode 407a and the drain electrode 407b are formed. Specifically, the heat treatment is favorably performed at a temperature in the range of 350° C. or higher and 650° C. or lower, preferably 400° C. or higher and 600° C. or lower.

Figure 25:
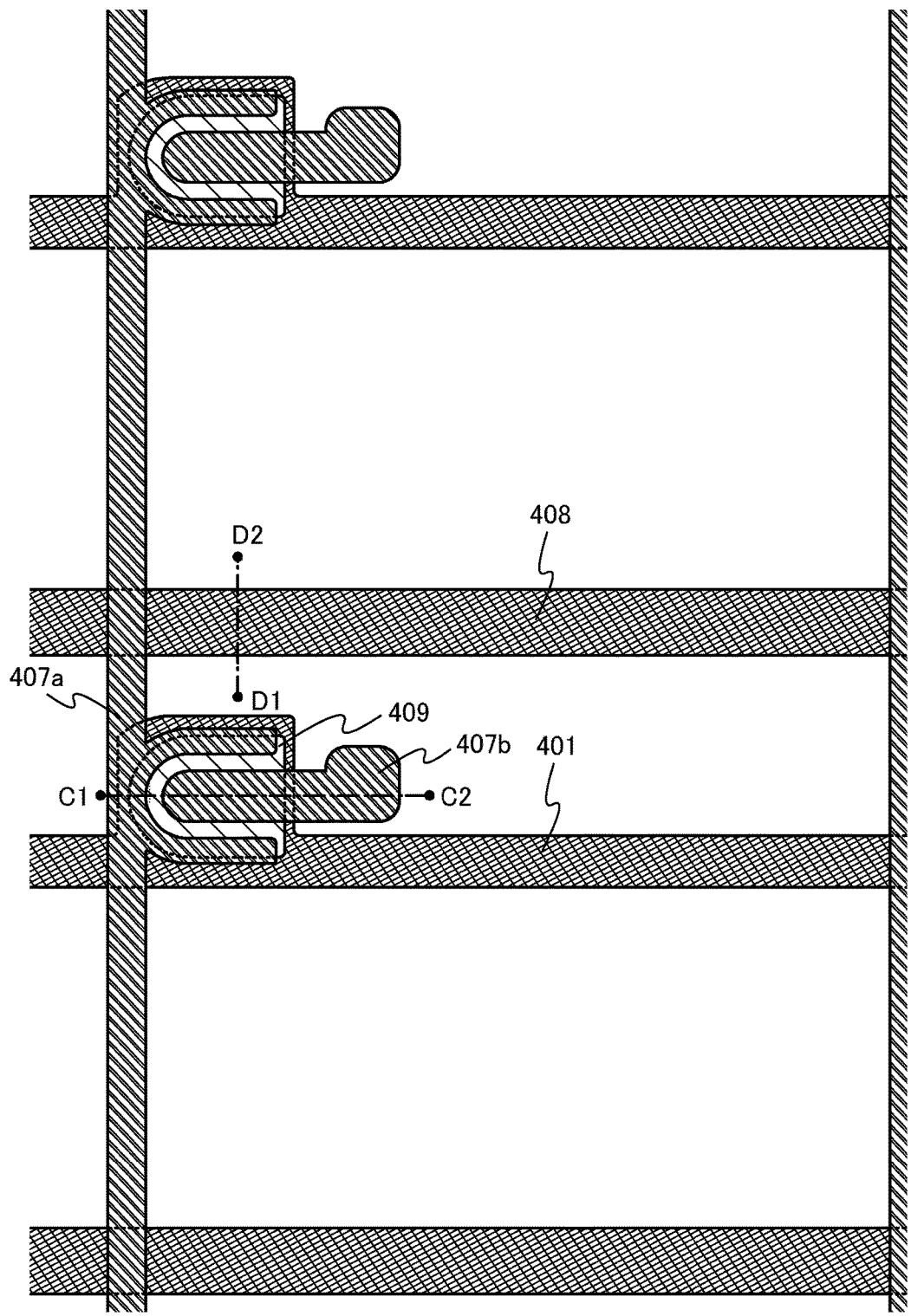
FIG. 25 is a view illustrating the manufacturing method of the semiconductor device.
Figure 26:
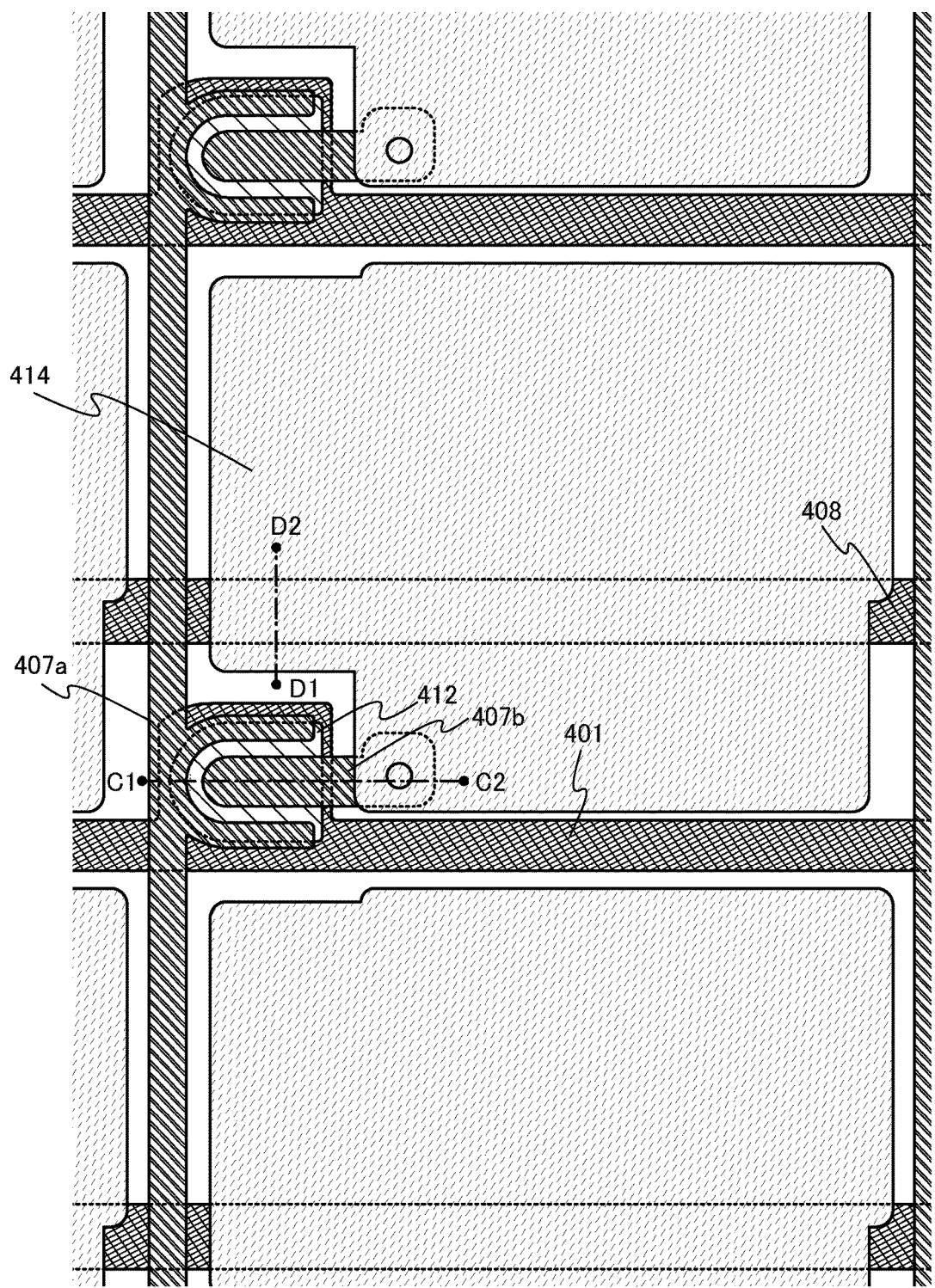
FIG. 26 is a view illustrating the manufacturing method of the semiconductor device.

Cross-sectional views taken along dashed lines C1-C2 and D1-D2 in FIG. 22C correspond to cross-sectional views taken along dashed lines C1-C2 and D1-D2 in a plan view illustrated in FIG. 25, respectively.

Next, as illustrated in FIG. 23A, an oxide insulating film 411 which covers the gate insulating film 402, the oxide semiconductor film 409, the source electrode 407a, and the drain electrode 407b is formed. The oxide insulating film 411 is formed using a silicon oxynitride film by a PCVD method. By providing a silicon oxynitride film which is the oxide insulating film 411 in contact with the exposed region of the oxide semiconductor film 409 provided between the source electrode 407a and the drain electrode 407b, oxygen is supplied. As a result, the region of the oxide semiconductor film 409 which is in contact with the oxide insulating film 411 becomes highly resistive (the carrier concentration is decreased, preferably to a value lower than $1 \times 10^{18}/cm^3$), thus an oxide semiconductor film 412 having a high-resistance channel formation region can be formed.

Next, after the oxide insulating film 411 is formed, heat treatment may be performed. The heat treatment is favorably performed at a temperature in the range of 350° C. or higher and 650° C. or lower, preferably 400° C. or higher and 600° C. or lower, under an air atmosphere or an nitrogen atmosphere. By the heat treatment, the oxide semiconductor film 412 is heated while being in contact with the oxide insulating film 411. Therefore, the resistance of the oxide semiconductor film 412 is further increased. Accordingly, electric characteristics of the transistors can be improved and variation in the electric characteristics thereof can be reduced. There is no particular limitation on when to perform this heat treatment as long as it is performed after the oxide insulating film 411 is formed. When this heat treatment also serves as heat treatment in another step, for example, heat treatment in formation of a resin film or heat treatment for reducing resistance of a transparent conductive film, the number of steps can be prevented from increasing.

Through the above steps, a thin film transistor 413 can be manufactured.

Next, a fourth photolithography step is performed. A resist mask is formed and the oxide insulating film 411 and the gate insulating film 402 are etched, so that contact holes are formed to expose parts of the drain electrode 407b, the first terminal 421, and the second terminal 420. Next, the resist mask is removed, and then a transparent conductive film is formed. The transparent conductive film is formed using indium oxide ($In_2O_3$), indium tin oxide ($In_2O_3$—$SnO_2$, abbreviated as ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—$ZnO$) may be used to improve etching processability. Moreover, in the case where heat treatment for reducing resistance of the transparent conductive film is performed, the heat treatment can also serve as heat treatment for increasing resistance of the oxide semiconductor film 412, which results in improvement of electric characteristics of the transistors and reduction in variation in the electric characteristics thereof.

Next, a fifth photolithography step is performed. A resist mask is formed and unnecessary portions are removed by etching, so that a pixel electrode 414 which is connected to the drain electrode 407b, a transparent conductive film 415 which is connected to the first terminal 421, and a transparent conductive film 416 which is connected to the second terminal 420 are formed.

The transparent conductive films 415 and 416 serve as electrodes or wirings connected to an FPC. The transparent conductive film 415 formed over the first terminal 421 is a connection terminal electrode which functions as an input terminal of the gate wiring. The transparent conductive film 416 formed over the second terminal 420 is a connection terminal electrode which functions as an input terminal of the source wiring.

In the fifth photolithography step, a storage capacitor is formed with the gate insulating film 402 and the oxide insulating film 411 as dielectrics, and the capacitor wiring 408 and the pixel electrode 414.

A cross-sectional view after the resist mask is removed is illustrated in FIG. 23B. Cross-sectional views taken along dashed lines C1-C2 and D1-D2 in FIG. 23B correspond to cross-sectional views taken along dashed lines C1-C2 and D1-D2 in a plan view illustrated in FIG. 26, respectively.

Through these five photolithography steps, the storage capacitor and the thin film transistor 413 which is a bottom-gate transistor having a staggered structure can be completed using the five photomasks. By disposing the transistor and the storage capacitor in each pixel of a pixel portion in which pixels are arranged in matrix, one substrate for manufacturing an active-matrix display device can be obtained. In this specification, such a substrate is referred to as an active-matrix substrate for convenience.

In the case of manufacturing an active-matrix liquid crystal display device, an active-matrix substrate and a counter substrate provided with a counter electrode are fixed to each other with a liquid crystal layer therebetween.

Alternatively, a storage capacitor may be formed with a pixel electrode which overlaps with a gate wiring of an adjacent pixel, with an oxide insulating film and a gate insulating film interposed therebetween, without provision of the capacitor wiring.

In an active-matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In the case of manufacturing a light-emitting display device, a partition wall including an organic resin film is provided between organic light-emitting elements in some cases. In that case, heat treatment performed on the organic resin film for making the oxide semiconductor film 412 high-resistive can also serve as the heat treatment for improvement of electric characteristics of the transistors and reduction in variation in the electric characteristics thereof.

The use of an oxide semiconductor for a thin film transistor leads to reduction in manufacturing cost. In particular, by the heat treatment, impurities such as moisture, hydrogen, or OH are reduced and the purity of the oxide semiconductor film is increased. Therefore, a semiconductor display device including a highly reliable thin film transistor having favorable electric characteristics can be manufactured.

Since the semiconductor film in the channel formation region is a region whose resistance is increased, electric characteristics of the thin film transistor are stabilized, and increase in off-state current or the like can be prevented. Accordingly, a semiconductor display device including the highly reliable thin film transistor having favorable electric characteristics can be provided.

This embodiment can be implemented in combination with any of the above mentioned embodiments.

Embodiment 11

In this embodiment, a structure of the liquid crystal display device according to one embodiment of the present invention will be described.

Figure 27:
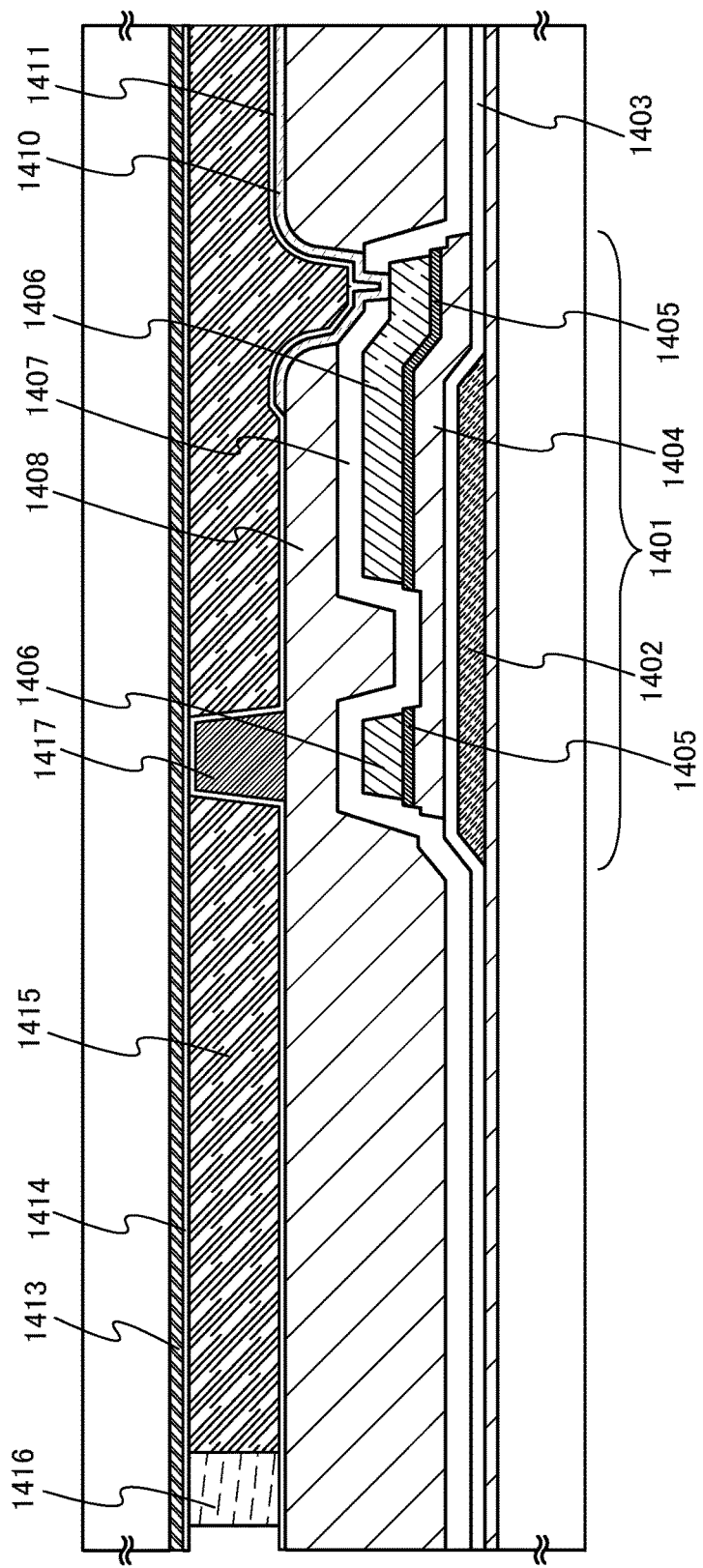
FIG. 27 is a cross-sectional view of a liquid crystal display device.

FIG. 27 illustrates as an example a cross-sectional view of a liquid crystal display device according to one embodiment of the present invention. A thin film transistor 1401 illustrated in FIG. 27 includes a gate electrode 1402 formed over an insulating surface, a gate insulating film 1403 formed so as to cover the gate electrode 1402, an oxide semiconductor film 1404 formed so as to overlap with the gate electrode 1402 with the gate insulating film 1403 therebetween, a pair of semiconductor films 1405 functioning as a source region and a drain region, which is formed over the oxide semiconductor film 1404, a pair of conductive films 1406 functioning as a source electrode and a drain electrode, which is formed over the pair of semiconductor films 1405, and an oxide insulating film 1407. The oxide insulating film 1407 is at least in contact with the oxide semiconductor film 1404 and formed so as to cover the gate electrode 1402, the gate insulating film 1403, the oxide semiconductor film 1404, the pair of semiconductor films 1405, and the pair of conductive films 1406.

An insulating film 1408 is formed over the oxide insulating film 1407. An opening is provided in part of the oxide insulating film 1407 and part of the insulating film 1408, and a pixel electrode 1410 is formed so as to be in contact with one of the conductive films 1406 in the opening.

Further, a spacer 1417 for controlling a cell gap of a liquid crystal element is formed over the insulating film 1408. An insulating film is etched to have a desired shape, so that the spacer 1417 can be formed. A cell gap may also be controlled by dispersing a filler over the insulating film 1408.

Then, an alignment film 1411 is formed over the pixel electrode 1410. The alignment film 1411 can be formed by subjecting an insulating film to a rubbing treatment, for example. Further, a counter electrode 1413 is provided in a position opposed to the pixel electrode 1410, and an alignment film 1414 is formed on the side of the counter electrode 1413 which is close to the pixel electrode 1410. Furthermore, a liquid crystal 1415 is provided in a region which is surrounded by a sealant 1416 between the pixel electrode 1410 and the counter electrode 1413. Note that a filler may be mixed in the sealant 1416.

The pixel electrode 1410 and the counter electrode 1413 can be formed using a transparent conductive material such as indium tin oxide including silicon oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1410 and the counter electrode 1413. However, the present invention is not limited to this structure. The liquid crystal display device according to one embodiment of the present invention may be a semi-transmissive type liquid crystal display device or a reflective type liquid crystal display device.

The liquid crystal display device illustrated in FIG. 27 may be provided with a color filter, a shielding film for preventing disclination (a black matrix), or the like.

Although a liquid crystal display device of a twisted nematic (TN) mode is described in this embodiment, the thin film transistor of the present invention can be used for other liquid crystal display devices such as vertical alignment (VA) mode, an optically compensated birefringence (OCB) mode, an in-plane-switching (IPS) mode.

The liquid crystal display device according to one embodiment of the present invention is highly reliable.

This embodiment can be freely combined with any of other embodiments.

Embodiment 12

In this embodiment, a structure of a light-emitting device including the thin film transistor according to one embodiment of the present invention for a pixel will be described. In this embodiment, cross-sectional structures of pixels in the case where a transistor for driving a light-emitting element are n-channel type is described with reference to FIGS. 28A to 28C. Note that FIGS. 28A to 28C illustrate the case where a first electrode is a cathode and a second electrode is an anode; however, the first electrode may be an anode and the second electrode may be a cathode.

Figure 28A:
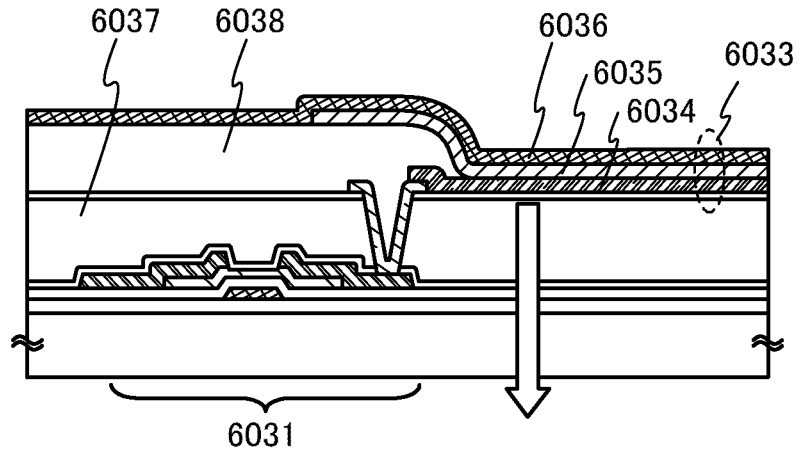
FIGS. 28A to 28C are cross-sectional views of light-emitting devices.
Figure 28B:
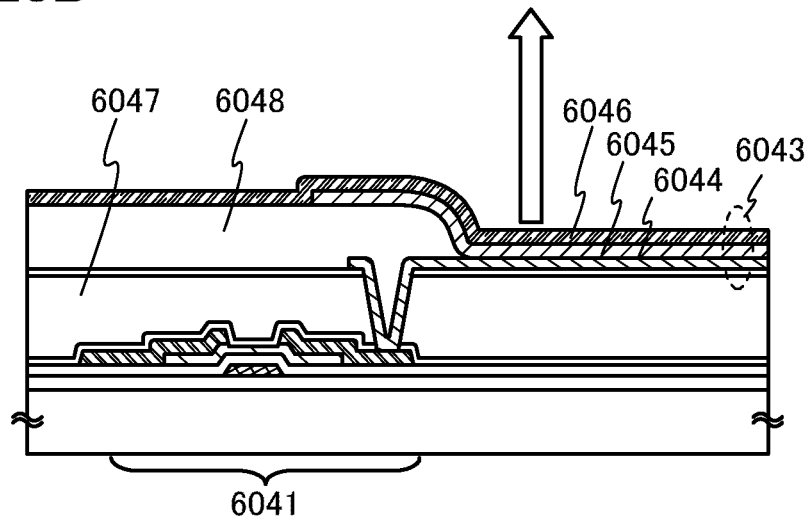
Figure 28C:
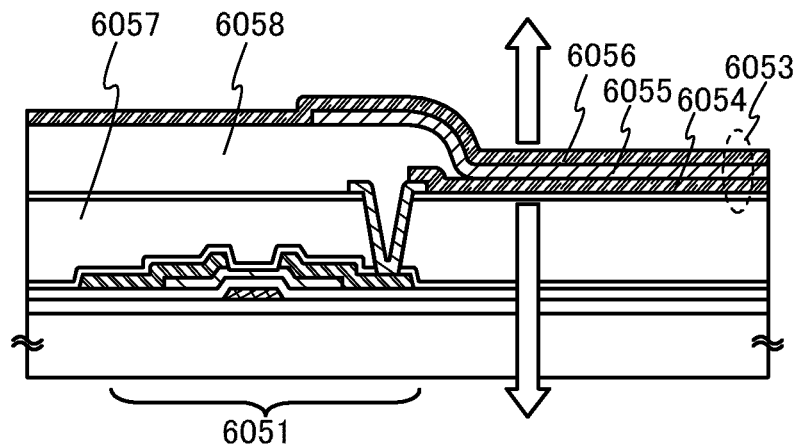

A cross-sectional view of a pixel in the case where a transistor 6031 is n-channel type, and light emitted from a light-emitting element 6033 is extracted from a first electrode 6034 side is illustrated in FIG. 28A. The transistor 6031 is covered with an insulating film 6037, and a partition wall 6038 having an opening is formed over the insulating film 6037. In the opening of the partition wall 6038, the first electrode 6034 is partly exposed. The first electrode 6034, an electroluminescent layer 6035, and a second electrode 6036 are sequentially stacked in the opening.

The first electrode 6034 is formed of a material or a film thickness which transmits light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy including such metals (for example, Mg:Ag, Al:Li, or Mg:In), a compound of such materials (for example, calcium fluoride or calcium nitride), or a rare-earth metal such as Yb or Er can be used. Further, in the case where an electron injection layer is provided, another conductive layer such as an aluminum layer may be used as well. Then, the first electrode 6034 is formed to have a thickness which transmits light (preferably, approximately 5 nm to 30 nm). Further, the sheet resistance of the first electrode 6034 may be suppressed by forming a light-transmitting conductive layer, which uses a light-transmitting oxide conductive material, so as to be in contact with and over or under the conductive layer having a thickness which transmits light. Alternatively, the first electrode 6034 may be formed using only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in indium tin oxide including ITO and silicon oxide (hereinafter referred to as ITSO) or in indium oxide including silicon oxide, may be used as well. In the case of using the light-transmitting oxide conductive material, it is preferable to provide an electron injection layer in the electroluminescent layer 6035.

The second electrode 6036 is formed of a material and a film thickness which reflects or shields light, and formed of a material suitable for being used as an anode. For example, a single-layer film including one or more of titanium nitride, zirconium nitride, titanium, tungsten, nickel, platinum, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6036.

The electroluminescent layer 6035 is formed using a single layer or a plurality of layers. In the case where the electroluminescent layer 6035 is formed using a plurality of layers, the layers can be classified into layers such as a hole injection layer, a hole transport layer, a light-emitting layer, an electron transport layer, and an electron injection layer in terms of the carrier transporting properties. In the case where the electroluminescent layer 6035 includes at least one of the hole injection layer, the hole transport layer, the electron transport layer, and the electron injection layer in addition to the light-emitting layer; the electron injection layer, the electron transport layer, the light-emitting layer, the hole transport layer, and the hole injection layer are sequentially stacked over the first electrode 6034 in this order. Note that an interface between the layers is not necessarily clear, and there might be the case where materials forming the layers are partly mixed and the interface between the layers is unclear. Each layer can be formed using an organic-based material or an inorganic-based material. As the organic-based material, any of a high molecular weight organic material, a medium molecular weight organic material, and a low molecular weight organic material can be used. Note that the medium molecular weight material corresponds to a low polymer in which the number of repetitions of a structural unit (the degree of polymerization) is approximately 2 to 20. There is no clear distinction between the hole injection layer and the hole transport layer, and the hole injection layer and the hole transport layer are the same in the sense that the hole transport property (hole mobility) is a particularly important characteristic for both. A layer in contact with the anode is referred to as a hole injection layer and a layer in contact with the hole injection layer is referred to as a hole transport layer for convenience. The same is also true for the electron transport layer and the electron injection layer. A layer in contact with the cathode is referred to as an electron injection layer and a layer in contact with the electron injection layer is referred to as an electron transport layer. In some cases, the light-emitting layer also serves as the electron transport layer, and it is therefore referred to as a light-emitting electron transport layer, too.

In the case of the pixel illustrated in FIG. 28A, light emitted from the light-emitting element 6033 can be extracted from the first electrode 6034 side as shown by the hollow arrow.

Next, a cross-sectional view of a pixel in the case where a transistor 6041 is n-channel type, and light emitted from a light-emitting element 6043 is extracted from a second electrode 6046 side, is illustrated in FIG. 28B. The transistor 6041 is covered with an insulating film 6047, and a partition wall 6048 having an opening is formed over the insulating film 6047. In the opening of the partition wall 6048, a first electrode 6044 is partly exposed, and the first electrode 6044, an electroluminescent layer 6045, and the second electrode 6046 are sequentially stacked in the opening.

The first electrode 6044 is formed of a material and a film thickness which reflects or shields light, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy including such metals (for example, Mg:Ag, Al:Li, or Mg:In), a compound of such materials (for example, calcium fluoride or calcium nitride), or a rare-earth metal such as Yb or Er can be used. Further, in the case where an electron injection layer is provided, another conductive layer such as an aluminum layer may be used as well.

The second electrode 6046 is formed of a material or a film thickness which transmits light, and can be formed of a material suitable for being used as an anode. For example, the second electrode 6046 may be formed using a light-transmitting oxide conductive material such as indium tin oxide (ITO), zinc oxide (ZnO), indium zinc oxide (IZO), or gallium-doped zinc oxide (GZO). Further, a mixture in which zinc oxide (ZnO) is mixed at 2% to 20% in indium tin oxide including ITO and silicon oxide (hereinafter referred to as ITSO) or in indium oxide including silicon oxide may be used as well for the second electrode 6046. Furthermore, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6046. However, in the case of using a material other than the light-transmitting oxide conductive material, the second electrode 6046 is formed to have a thickness which transmits light (preferably, approximately 5 nm to 30 nm).

The electroluminescent layer 6045 can be formed in a manner similar to that of the electroluminescent layer 6035 of FIG. 28A.

In the case of the pixel illustrated in FIG. 28B, light emitted from the light-emitting element 6043 can be extracted from the second electrode 6046 side as shown by the hollow arrow.

Next, a cross-sectional view of a pixel in the case where a transistor 6051 is n-channel type, and light emitted from a light-emitting element 6053 is extracted from a first electrode 6054 side and a second electrode 6056 side is illustrated in FIG. 28C. The transistor 6051 is covered with an insulating film 6057, and a partition wall 6058 having an opening is formed over the insulating film 6057. In the opening of the partition wall 6058, the first electrode 6054 is partly exposed, and the first electrode 6054, an electroluminescent layer 6055, and the second electrode 6056 are sequentially stacked in the opening.

The first electrode 6054 can be formed in a manner similar to that of the first electrode 6034 of FIG. 28A. The second electrode 6056 can be formed in a manner similar to that of the second electrode 6046 of FIG. 28B. The electroluminescent layer 6055 can be formed in a manner similar to that of the electroluminescent layer 6035 of FIG. 28A.

In the case of the pixel illustrated in FIG. 28C, light emitted from the light-emitting element 6053 can be extracted from the first electrode 6054 side and the second electrode 6056 side as shown by the hollow arrows.

This embodiment can be implemented in combination with any of the other embodiments as appropriate.

Embodiment 13

In this embodiment, a structure of the liquid crystal display device according to one embodiment of the present invention is described.

Figure 29:
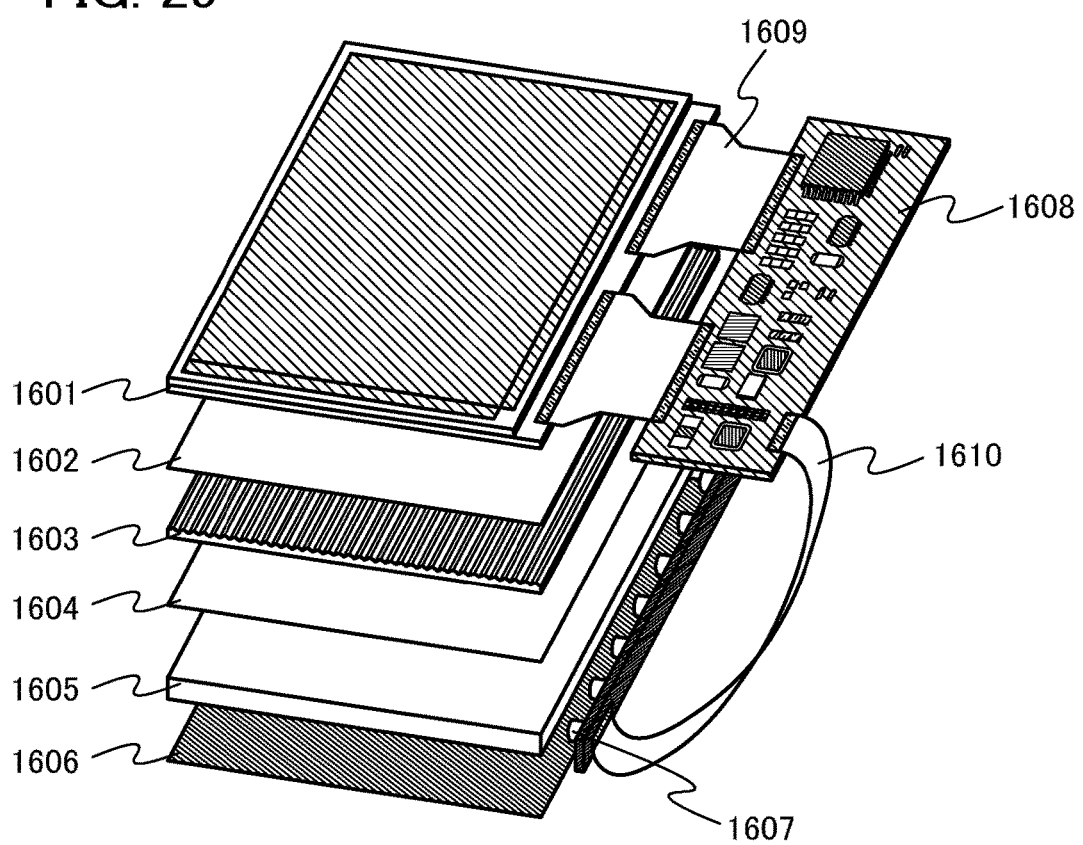
FIG. 29 is a view illustrating a structure of a liquid crystal display device module.

FIG. 29 illustrates an example of a perspective view showing a structure of the liquid crystal display device of the present invention. The liquid crystal display device illustrated in FIG. 29 is provided with a liquid crystal panel 1601 in which a liquid crystal element is formed between a pair of substrates; a first diffusing plate 1602; a prism sheet 1603; a second diffusing plate 1604; a light guide plate 1605; a reflection plate 1606; a light source 1607; and a circuit substrate 1608.

The liquid crystal panel 1601, the first diffusing plate 1602, the prism sheet 1603, the second diffusing plate 1604, the light guide plate 1605, and the reflection plate 1606 are sequentially stacked. The light source 1607 is provided at an end portion of the light guide plate 1605. By the first diffusing plate 1602, the prism sheet 1603, and the second diffusing plate 1604, the liquid crystal panel 1601 is uniformly irradiated with light from the light source 1607 which is diffused inside the light guide plate 1605.

Although the first diffusing plate 1602 and the second diffusing plate 1604 are used in this embodiment, the number of diffusing plates is not limited thereto. The number of diffusing plates may be one, or may be three or more. It is acceptable as long as the diffusing plate is provided between the light guide plate 1605 and the liquid crystal panel 1601. Therefore, a diffusing plate may be provided only on the side closer to the liquid crystal panel 1601 than the prism sheet 1603, or may be provided only on the side closer to the light guide plate 1605 than the prism sheet 1603.

Further, the cross section of the prism sheet 1603 illustrated in FIG. 29 is not limited to a sawtooth-shape. The prism sheet 1603 may have a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 29, the circuit substrate 1608 and the liquid crystal panel 1601 are connected to each other through a flexible printed circuit (FPC) 1609. Note that the circuit may be connected to the liquid crystal panel 1601 by using a chip on glass (COG) method, or part of the circuit may be connected to the FPC 1609 by using a chip on film (COF) method.

FIG. 29 illustrates an example in which the circuit substrate 1608 is provided with a controlling circuit which controls driving of the light source 1607 and the controlling circuit and the light source 1607 are connected to each other through the FPC 1610. However, the controlling circuit may be formed in the liquid crystal panel 1601; in this case, the liquid crystal panel 1601 and the light source 1607 are connected to each other through the FPC or the like.

Note that FIG. 29 illustrates as an example of an edge-light type light source in which the light source 1607 is disposed at an end portion of the liquid crystal panel 1601. However, a liquid crystal display device of the present invention may be a direct type in which the light source 1607 is disposed directly below the liquid crystal panel 1601.

This embodiment can be implemented in combination with any of the other embodiments as appropriate.

Example 1

By using a semiconductor display device according to one embodiment of the present invention, an electronic device with high reliability and low power consumption can be provided. In particular, the case of a portable electronic device to which electric power cannot be easily supplied constantly, continuous use time becomes longer by adding a semiconductor display device according to one embodiment of the present invention as a component, which is an advantage.

In addition, in a semiconductor display device of the present invention, the heat treatment temperature can be suppressed; therefore, a highly reliable thin film transistor with excellent characteristics can be formed even when the thin film transistor is formed over a substrate formed using a flexible synthetic resin of which heat resistance is lower than that of glass, such as plastic. Accordingly, with the use of the manufacturing method according to one embodiment of the present invention, a highly reliable, lightweight, and flexible semiconductor display device with low power consumption can be provided. As a plastic substrate, the following can be used: polyester typified by polyethylene terephthalate (PET); polyethersulfone (PES); polyethylene naphthalate (PEN); polycarbonate (PC); polyetheretherketone (PEEK); polysulfone (PSF); polyetherimide (PET); polyarylate (PAR); polybutylene terephthalate (PBT); polyimide; an acrylonitrile-butadiene-styrene resin; polyvinyl chloride; polypropylene; polyvinyl acetate; an acrylic resin; or the like.

The semiconductor display device according to one embodiment of the present invention can be used for display devices, laptops, or image reproducing devices provided with recording media (typically, devices which reproduce the content of recording media and have displays for displaying the reproduced images such as digital versatile discs (DVDs)). Further, the electronic devices in which the semiconductor display device according to one embodiment of the present invention can be used is the following: mobile phones, portable game machines, portable information terminals, e-book readers, video cameras, digital still cameras, goggle-type displays (head mounted displays), navigation systems, audio reproducing devices (for example, car audio systems or digital audio players), copying machines, facsimile machines, printers, versatile printers, automated teller machines (ATMs), vending machines, or the like. FIGS. 30A to 30D illustrate specific examples of these electronic devices.

Figure 30A:
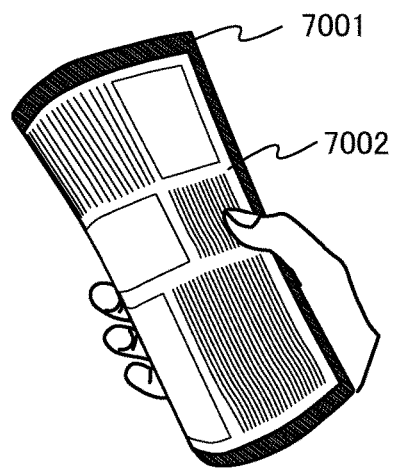
FIGS. 30A to 30E are views each illustrating an electronic device using a semiconductor display device.

FIG. 30A illustrates an e-book reader including a housing 7001, a display portion 7002, and the like. The semiconductor display device according to one embodiment of the present invention can be used for the display portion 7002. By including the semiconductor display device according to one embodiment of the present invention in the display portion 7002, a highly reliable e-book reader with low power consumption can be provided. Moreover, with the use of a flexible substrate, the semiconductor display device included in the display portion 7002 can have flexibility. Thus, a highly reliable, flexible, lightweight, and easy-to-use e-book reader with low power consumption can be provided.

Figure 30B:
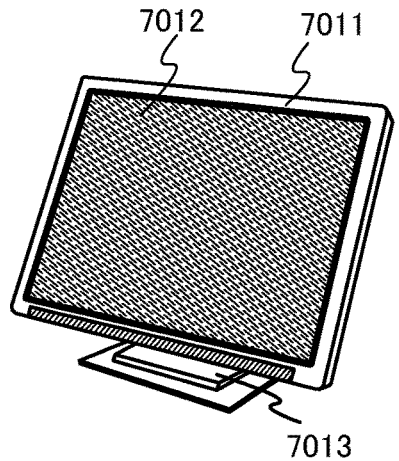

FIG. 30B illustrates a display device including a housing 7011, a display portion 7012, a support base 7013, and the like. The semiconductor display device according to one embodiment of the present invention can be used for the display portion 7012. By using a semiconductor display device according to one embodiment of the present invention for the display portion 7012, a highly reliable display device with low power consumption can be provided. Note that a display device includes all display devices for displaying information, such as display devices for personal computers, for receiving television broadcasts, and for displaying advertisements.

Figure 30C:
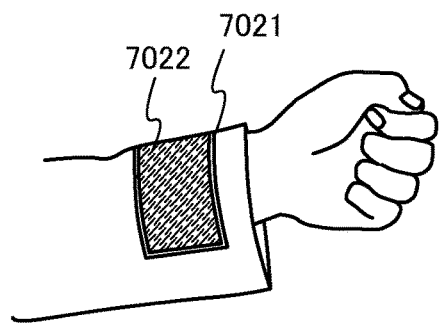

FIG. 30C illustrates a display device including a housing 7021, a display portion 7022, and the like. The semiconductor display device according to one embodiment of the present invention can be used for the display portion 7022. By including the semiconductor display device according to one embodiment of the present invention in the display portion 7022, a highly reliable display device with low power consumption can be provided. Moreover, with the use of a flexible substrate, the semiconductor display device, the signal processing circuit, or the like included in the display portion 7022 can have flexibility. Thus, a highly reliable, flexible, and lightweight display device with low power consumption can be realized. Accordingly, as illustrated in FIG. 30C, a display device can be used while being fixed to fabric or the like, and an application range of the semiconductor display device is dramatically widened.

Figure 30D:
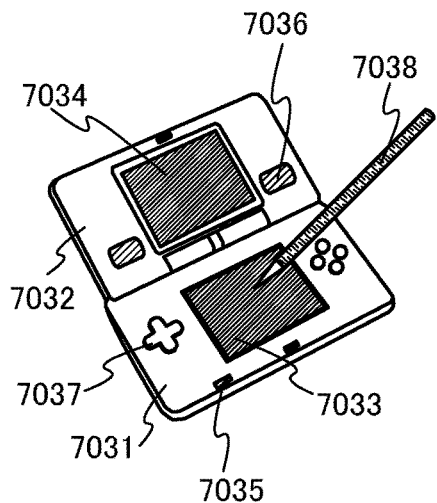

FIG. 30D illustrates portable game machines including a housing 7031, a housing 7032, a display portion 7033, a display portion 7034, a microphone 7035, a speaker 7036, an operation key 7037, a stylus 7038, and the like. The semiconductor display device according to one embodiment of the present invention can be used for the display portion 7033 or the display portion 7034. By including the semiconductor display device according to one embodiment of the present invention in the display portion 7033 and the display portion 7034, a highly reliable portable game machine with low power consumption can be provided. Note that the portable game machine illustrated in FIG. 30D has the two display portions 7033 and 7034. However, the number of display portions included in a portable game machine is not limited thereto.

Figure 30E:
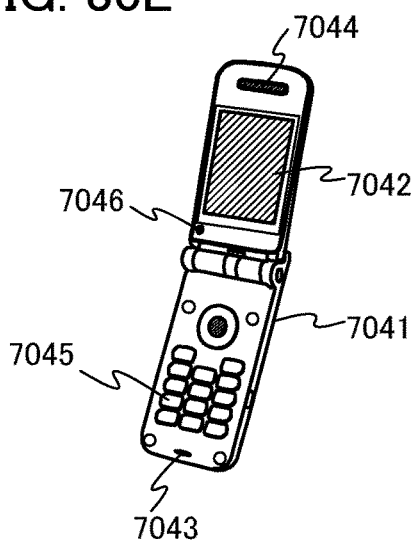

FIG. 30E illustrates a mobile phone including a housing 7041, a display portion 7042, an audio input portion 7043, an audio output portion 7044, operation keys 7045, a light receiving portion 7046, and the like. Light received in the light-receiving portion 7046 is converted into electrical signals, whereby external images can be loaded. The semiconductor display device according to one embodiment of the present invention can be used for the display portion 7042. By including the semiconductor display device according to one embodiment of the present invention in the display portion 7042, a highly reliable portable game machine with low power consumption can be provided.

This embodiment can be implemented by being combined as appropriate with any of the above-described embodiments.

This application is based on Japanese Patent Application serial no. 2009-214096 filed with Japan Patent Office on Sep. 16, 2009, the entire contents of which are hereby incorporated by reference.

What is claimed is:

1. A semiconductor device comprising:
a first transistor, a second transistor, a third transistor, a fourth transistor, a fifth transistor, a sixth transistor, a seventh transistor and an eighth transistor,
wherein one of a source and a drain of the first transistor is electrically connected to one of a source and a drain of the second transistor,
wherein the one of the source and the drain of the first transistor is electrically connected to one of a source and a drain of the third transistor,
wherein the one of the source and the drain of the first transistor is electrically connected to one of a source and a drain of the fourth transistor,
wherein one of a source and a drain of the fifth transistor is electrically connected to one of a source and a drain of the sixth transistor,
wherein the one of the source and the drain of the fifth transistor is electrically connected to one of a source and a drain of the seventh transistor,
wherein the one of the source and the drain of the fifth transistor is electrically connected to one of a source and a drain of the eighth transistor,
wherein the one of the source and the drain of the fifth transistor is directly connected to a gate of the first transistor,
wherein a gate of the second transistor is electrically connected to a gate of the sixth transistor,
wherein a gate of the third transistor is electrically connected to a gate of the seventh transistor,
wherein a gate of the fourth transistor is electrically connected to a gate of the eighth transistor,
wherein the other of the source and the drain of the second transistor is electrically connected to the other of the source and the drain of the third transistor and the other of the source and the drain of the fourth transistor, and
wherein the other of the source and the drain of the sixth transistor is electrically connected to the other of the source and the drain of the seventh transistor and the other of the source and the drain of the eighth transistor.

2. The semiconductor device according to claim 1,
wherein each of the first transistor, the second transistor, the third transistor, the fourth transistor, the fifth transistor, the sixth transistor, the seventh transistor and the eighth transistor comprises an oxide semiconductor.

3. The semiconductor device according to claim 2,
wherein each of the first transistor, the second transistor, the third transistor, the fourth transistor, the fifth transistor, the sixth transistor, the seventh transistor and the eighth transistor comprises the gate over the oxide semiconductor.

4. The semiconductor device according to claim 1, further comprising a pixel portion and a scan line driver circuit,
wherein each of the first transistor, the second transistor, the third transistor, the fourth transistor, the fifth transistor, the sixth transistor, the seventh transistor and the eighth transistor is included in the scan line driver circuit, and
wherein the pixel portion is electrically connected to the scan line driver circuit.

5. A semiconductor device comprising:
a first transistor, a second transistor, a third transistor, a fourth transistor, a fifth transistor, a sixth transistor, a seventh transistor and an eighth transistor,
wherein one of a source and a drain of the first transistor is directly connected to one of a source and a drain of the second transistor,
wherein the one of the source and the drain of the first transistor is directly connected to one of a source and a drain of the third transistor,
wherein the one of the source and the drain of the first transistor is directly connected to one of a source and a drain of the fourth transistor,
wherein one of a source and a drain of the fifth transistor is directly connected to one of a source and a drain of the sixth transistor,
wherein the one of the source and the drain of the fifth transistor is directly connected to one of a source and a drain of the seventh transistor,
wherein the one of the source and the drain of the fifth transistor is directly connected to one of a source and a drain of the eighth transistor,
wherein the one of the source and the drain of the fifth transistor is directly connected to a gate of the first transistor,
wherein a gate of the second transistor is directly connected to a gate of the sixth transistor, wherein a gate of the third transistor is directly connected to a gate of the seventh transistor, wherein a gate of the fourth transistor is directly connected to a gate of the eighth transistor, wherein the other of the source and the drain of the second transistor is directly connected to the other of the source and the drain of the third transistor and the other of the source and the drain of the fourth transistor, and wherein the other of the source and the drain of the sixth transistor is directly connected to the other of the source and the drain of the seventh transistor and the other of the source and the drain of the eighth transistor.

6. The semiconductor device according to claim 5, wherein each of the first transistor, the second transistor, the third transistor, the fourth transistor, the fifth transistor, the sixth transistor, the seventh transistor and the eighth transistor comprises an oxide semiconductor.

7. The semiconductor device according to claim 6, wherein each of the first transistor, the second transistor, the third transistor, the fourth transistor, the fifth transistor, the sixth transistor, the seventh transistor and the eighth transistor comprises the gate over the oxide semiconductor.

8. The semiconductor device according to claim 5, further comprising a pixel portion and a scan line driver circuit, wherein each of the first transistor, the second transistor, the third transistor, the fourth transistor, the fifth transistor, the sixth transistor, the seventh transistor and the eighth transistor is included in the scan line driver circuit, and wherein the pixel portion is electrically connected to the scan line driver circuit.

* * * * *